(12) United States Patent
Liu et al.

(10) Patent No.: US 12,433,016 B2
(45) Date of Patent: Sep. 30, 2025

(54) NANOSTRUCTURE WITH VARIOUS WIDTHS

(71) Applicant: TAIWAN SEMICONDUCTOR MANUFACTURING COMPANY, LTD., Hsinchu (TW)

(72) Inventors: Hsiao-Han Liu, Miaoli County (TW); Chih-Hao Wang, Baoshan Township, Hsinchu County (TW); Kuo-Cheng Chiang, Zhubei (TW); Shi-Ning Ju, Hsinchu (TW); Kuan-Lun Cheng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/521,951

(22) Filed: Nov. 28, 2023

(65) Prior Publication Data
US 2024/0096882 A1   Mar. 21, 2024

Related U.S. Application Data

(60) Continuation of application No. 17/837,927, filed on Jun. 10, 2022, now Pat. No. 11,862,634, which is a (Continued)

(51) Int. Cl.
*H10D 84/83* (2025.01)
*H10D 30/62* (2025.01)
(Continued)

(52) U.S. Cl.
CPC ....... *H10D 84/834* (2025.01); *H10D 30/6212* (2025.01); *H10D 30/6213* (2025.01);
(Continued)

(58) Field of Classification Search
None
See application file for complete search history.

(56) References Cited

U.S. PATENT DOCUMENTS

| 9,209,247 B2 | 12/2015 | Colinge et al. |
| 9,236,267 B2 | 1/2016 | De et al. |

(Continued)

OTHER PUBLICATIONS

U.S. Notice of Allowance for U.S. Appl. No. 17/072,755, dated Mar. 7, 2022.

(Continued)

*Primary Examiner* — Feifei Yeung Lopez
(74) *Attorney, Agent, or Firm* — Birch, Stewart, Kolasch & Birch, LLP

(57) ABSTRACT

A semiconductor structures and a method for forming the same are provided. The semiconductor structure includes first nanostructures and second nanostructures spaced apart from the first nanostructures in a first direction. A left-most point of the first nanostructures and a left-most point of the second nanostructures has a first distance in the first direction. The semiconductor structure further includes first source/drain features attached to opposite sides of the first nanostructures in a second direction being orthogonal to the first direction and third nanostructures and fourth nanostructures spaced apart from the third nanostructures in the first direction. A left-most point of the third nanostructures and a left-most point of the fourth nanostructures has a second distance in the first direction. In addition, the third nanostructures are wider than the first nanostructures in the first direction, and the first distance is smaller than the second distance.

20 Claims, 54 Drawing Sheets

Related U.S. Application Data division of application No. 16/911,665, filed on Jun. 25, 2020, now Pat. No. 11,362,001, which is a continuation-in-part of application No. 16/103,704, filed on Aug. 14, 2018, now Pat. No. 10,720,503.

(51) Int. Cl.
*H10D 84/01* (2025.01)
*H10D 84/03* (2025.01)

(52) U.S. Cl.
CPC ....... *H10D 84/013* (2025.01); *H10D 84/0158* (2025.01); *H10D 84/038* (2025.01)

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,660,033 B1 | 5/2017 | Chen et al. | |
| 9,947,804 B1 | 4/2018 | Frougier et al. | |
| 10,056,289 B1 | 8/2018 | Cheng et al. | |
| 10,074,732 B1 | 9/2018 | Dou et al. | |
| 10,103,238 B1 | 10/2018 | Zang et al. | |
| 2006/0049427 A1 | 3/2006 | Kim et al. | |
| 2011/0133167 A1* | 6/2011 | Bangsaruntip | B82Y 40/00 257/E21.415 |
| 2011/0278539 A1* | 11/2011 | Bangsaruntip | H01L 29/66439 257/14 |
| 2014/0051213 A1* | 2/2014 | Chang | H01L 29/42392 257/E21.415 |
| 2015/0008501 A1 | 1/2015 | Sakuma et al. | |
| 2015/0053912 A1* | 2/2015 | Ching | H01L 27/0924 257/9 |
| 2016/0071931 A1* | 3/2016 | Cheng | B82Y 10/00 257/329 |
| 2017/0092728 A1* | 3/2017 | Kim | H01L 29/785 |
| 2017/0117411 A1 | 4/2017 | Kim et al. | |
| 2017/0207313 A1 | 7/2017 | Song et al. | |
| 2017/0271474 A1 | 9/2017 | Obradovie et al. | |
| 2018/0156749 A1 | 6/2018 | Rozeau et al. | |
| 2019/0221483 A1 | 7/2019 | Mulfinger et al. | |
| 2020/0006478 A1 | 1/2020 | Hsu et al. | |

OTHER PUBLICATIONS

US Office Action dated Jan. 8, 2020 issued in copending U.S. Appl. No. 16/681,621.

* cited by examiner

NANOSTRUCTURE WITH VARIOUS WIDTHS

CROSS REFERENCE TO RELATED APPLICATIONS

This application is a Continuation application of U.S. patent application Ser. No. 17/837,927, filed on Jun. 10, 2022, which is a Divisional application of Ser. No. 16/911,665, filed on Jun. 25, 2020, which is a Continuation-in-part application of U.S. patent application Ser. No. 16/103,704, filed on Aug. 14, 2018, the entirety of which are incorporated by reference herein.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2A to 8A, 2B to 8B, 10A to 12A, and 10B to 12B are perspective views of a method for manufacturing a semiconductor device at various stages in accordance with some embodiments of the present disclosure.

FIGS. 14A-1, 14B-1, 14C-1, 14D-1, 14E-1, 14F-1, 14G-1, 14H-1, 14I-1, 14J-1, and 14K-1 are perspective views of a method for manufacturing a first device region in a semiconductor structure at various stages in accordance with some embodiments.

FIGS. 14A-2, 14B-2, 14C-2, 14D-2, 14E-2, 14F-2, 14G-2, 14H-2, 14I-2, 14J-2, and 14K-2 are perspective views of a method for manufacturing a second device region in the semiconductor structure at various stages in accordance with some embodiments.

FIG. 15-1 illustrates a cross-sectional view of the semiconductor structure taken along a cross-sectional line $A\text{-}A_1$ shown in FIG. 14K-1 in accordance with some embodiments.

FIG. 15-2 illustrates a cross-sectional view of the semiconductor structure taken along a cross-sectional line $A'\text{-}A_1'$ shown in FIG. 14K-2 in accordance with some embodiments.

FIG. 16-1 illustrates a cross-sectional view of the semiconductor structure taken along a cross-sectional line $B\text{-}B_1$ shown in FIG. 14K-1 in accordance with some embodiments.

FIG. 16-2 illustrates a cross-sectional view of the semiconductor structure taken along a cross-sectional line $B'\text{-}B_1'$ shown in FIG. 14K-2 in accordance with some embodiments.

FIG. 17-1 illustrates a cross-sectional view of the semiconductor structure taken along a cross-sectional line $C\text{-}C_1$ shown in FIG. 14K-1 in accordance with some embodiments.

FIG. 17-2 illustrates a cross-sectional of the semiconductor structure view taken along a cross-sectional line $C'\text{-}C_1'$ shown in FIG. 14K-2 in accordance with some embodiments.

FIG. 18-1 illustrates a layout of the first device region of the semiconductor structures in accordance with some embodiments.

FIG. 18-2 illustrates a layout of the second device region of the semiconductor structures in accordance with some embodiments.

DETAILED DESCRIPTION

Figure 1:
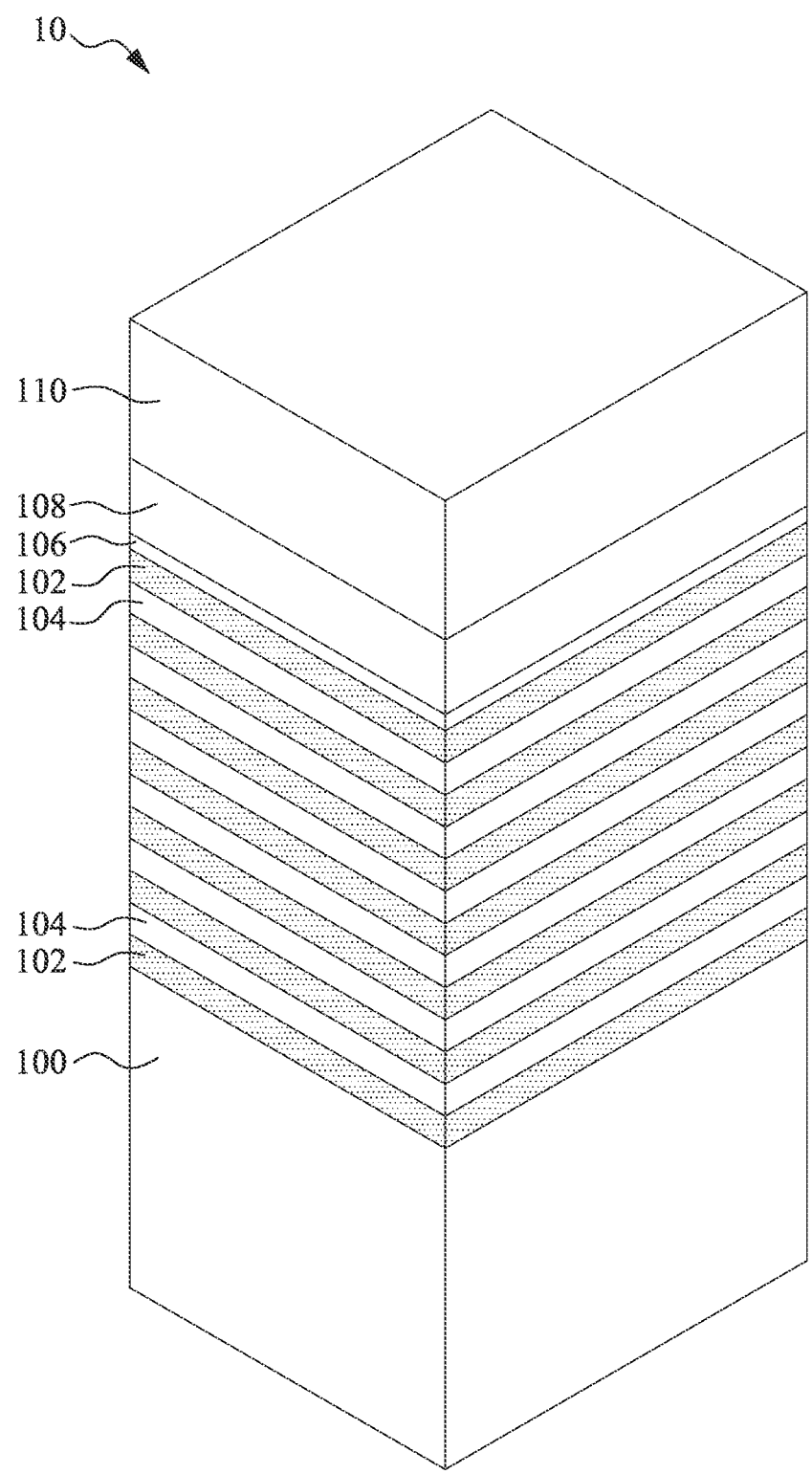

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 12A:
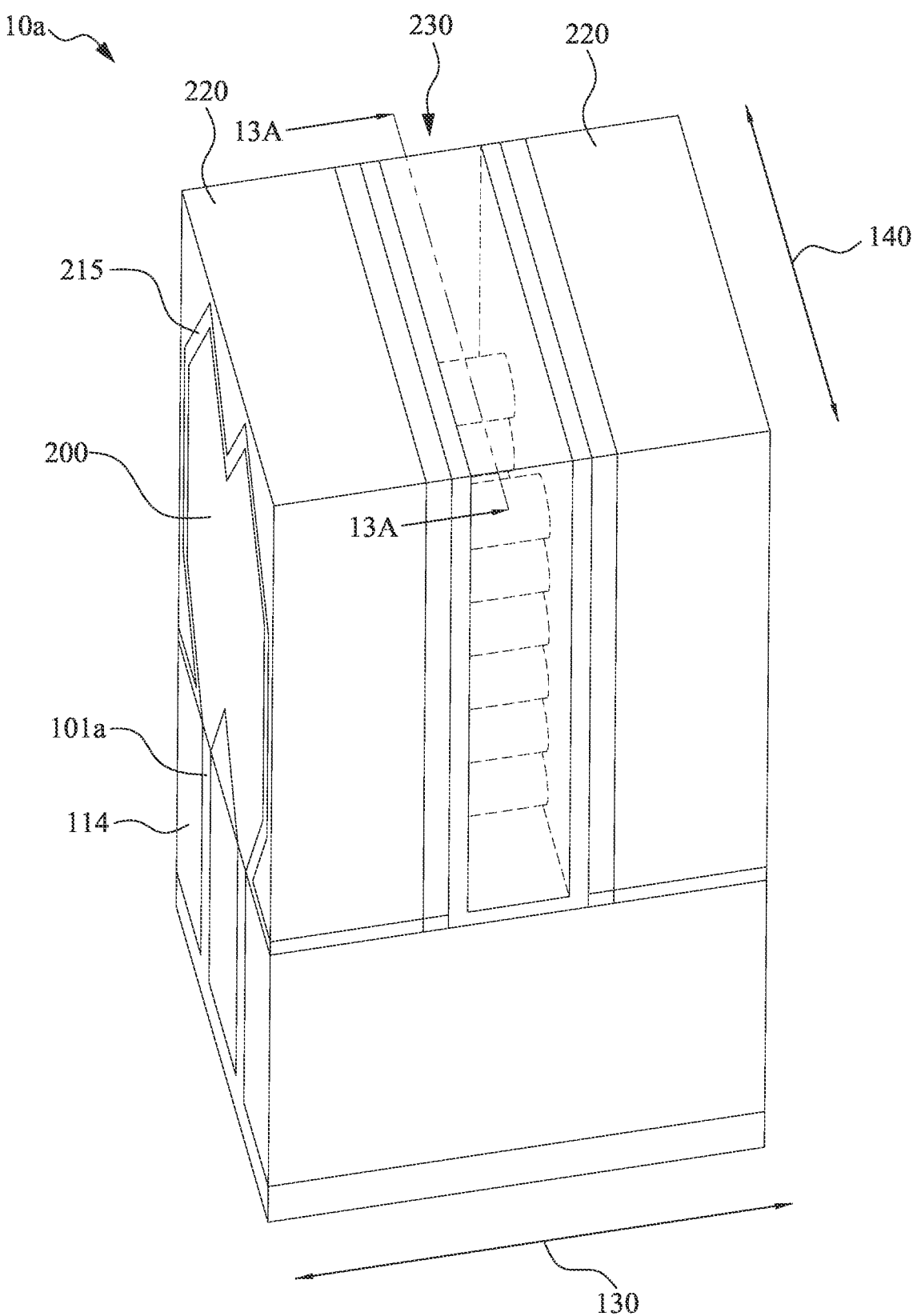
Figure 12B:
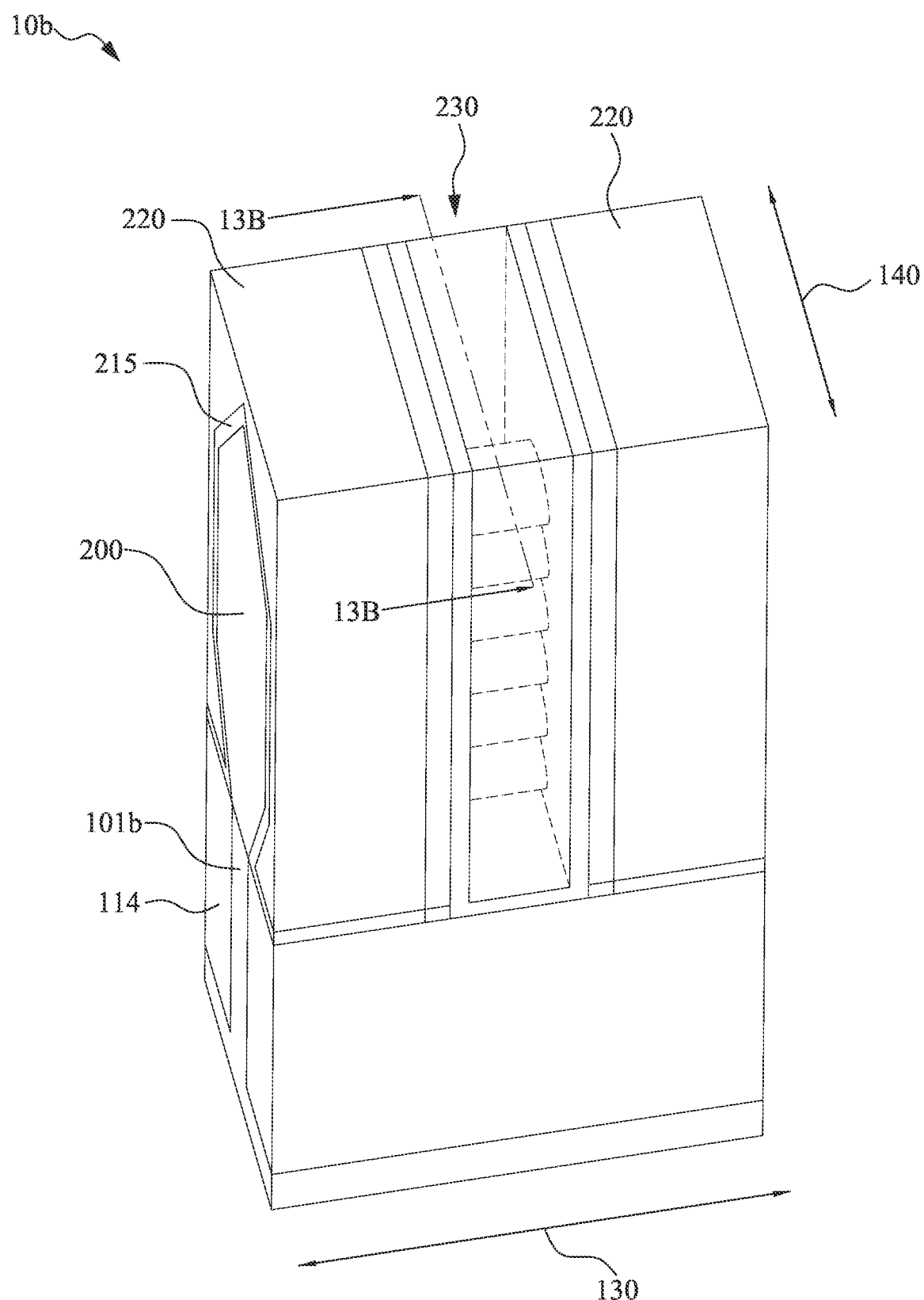
Figure 13A:
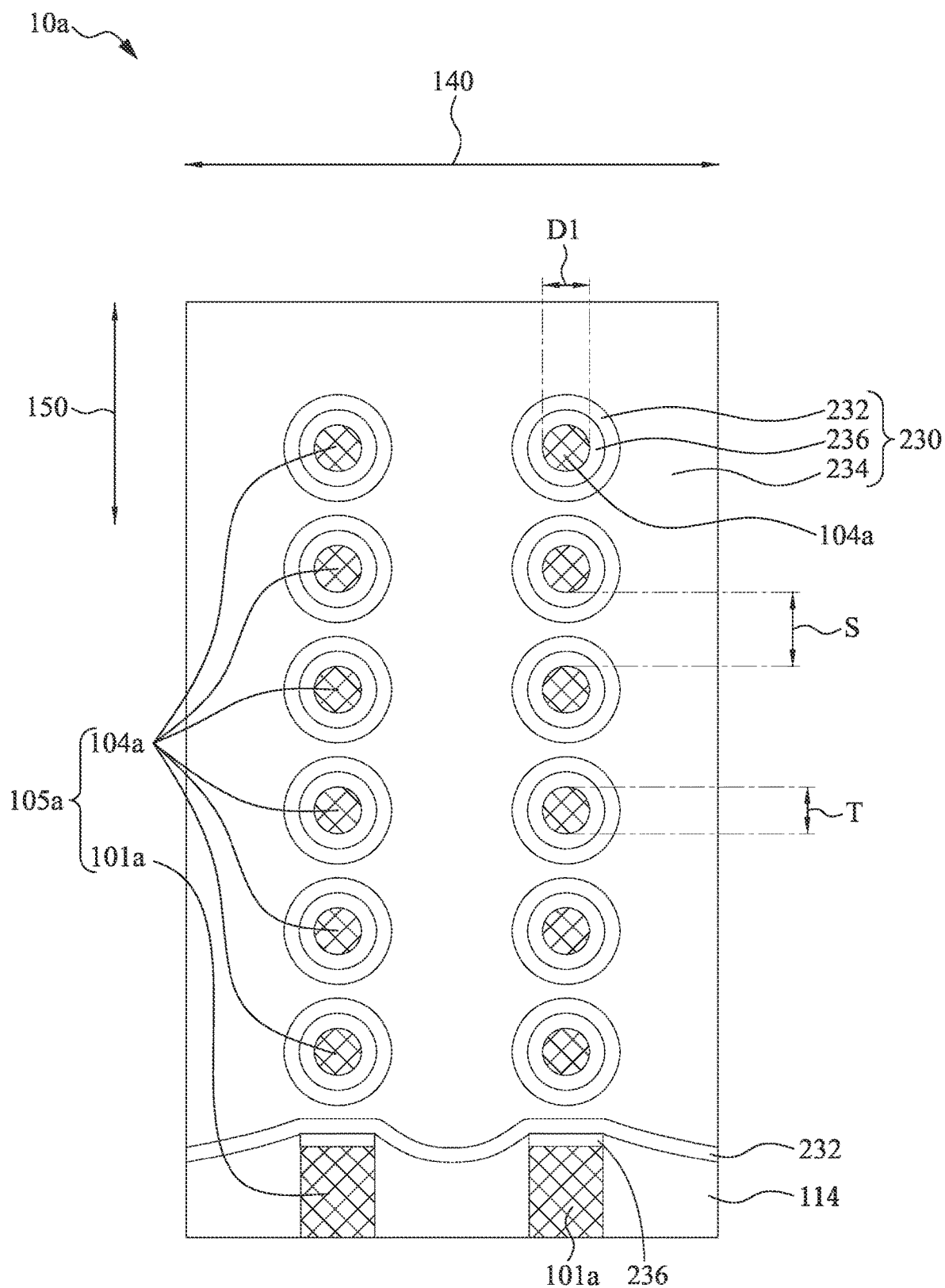
FIG. 13A is a cross-sectional view taken along a cross-sectional line of FIG. 12A.
Figure 13B:
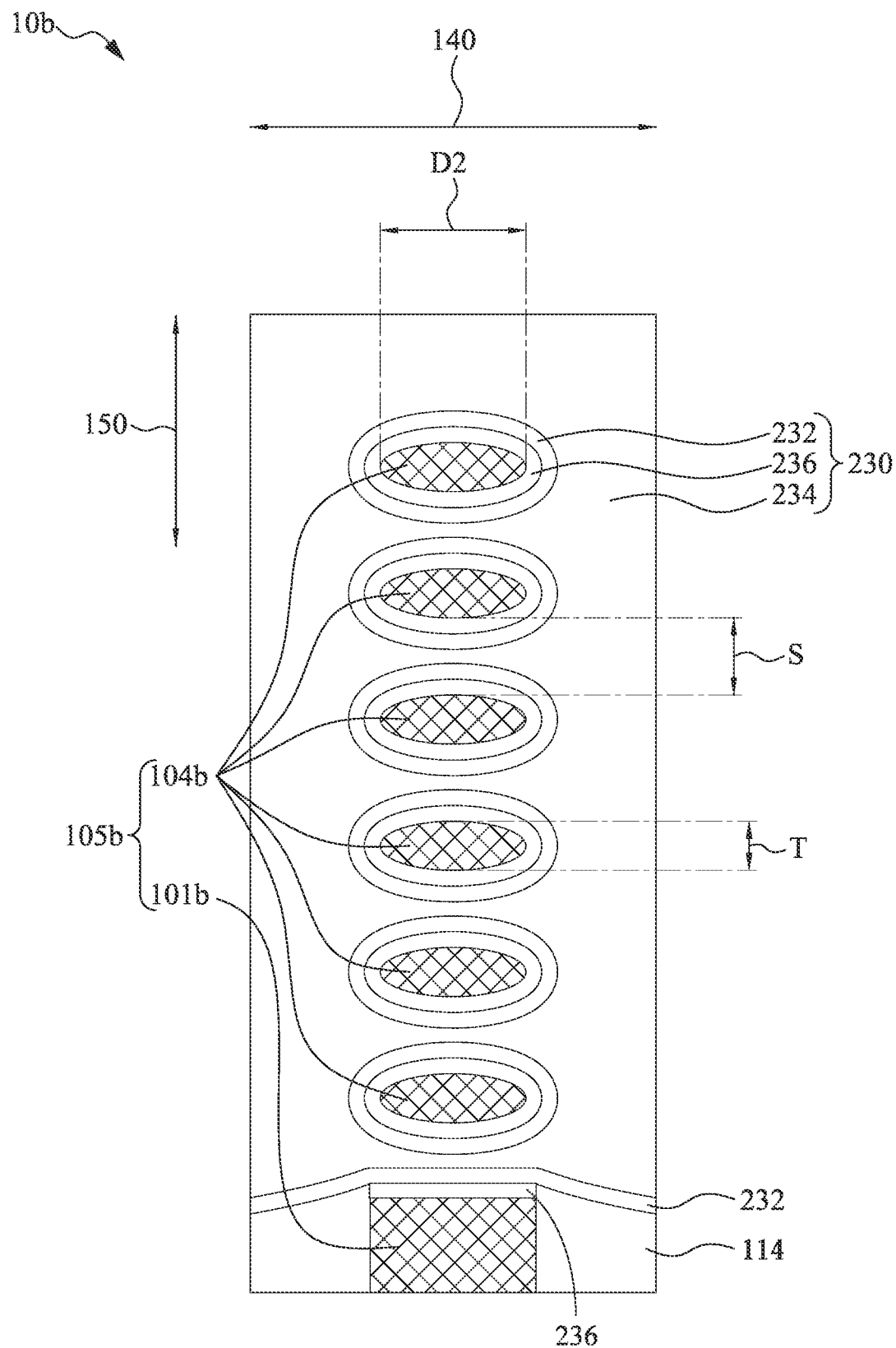
FIG. 13B is a cross-sectional view taken along a cross-sectional line of FIG. 12B.

FIGS. 1-8B and 10A-12B are perspective views of a method for manufacturing a semiconductor device at various stages in accordance with some embodiments of the present disclosure. FIG. 9 is a cross-sectional view taken along a cross-sectional line of FIG. 8A or FIG. 8B. FIG. 13A is a cross-sectional view taken along a cross-sectional line of FIG. 12A. FIG. 13B is a cross-sectional view taken along a cross-sectional line of FIG. 12B.

Figure 2A:
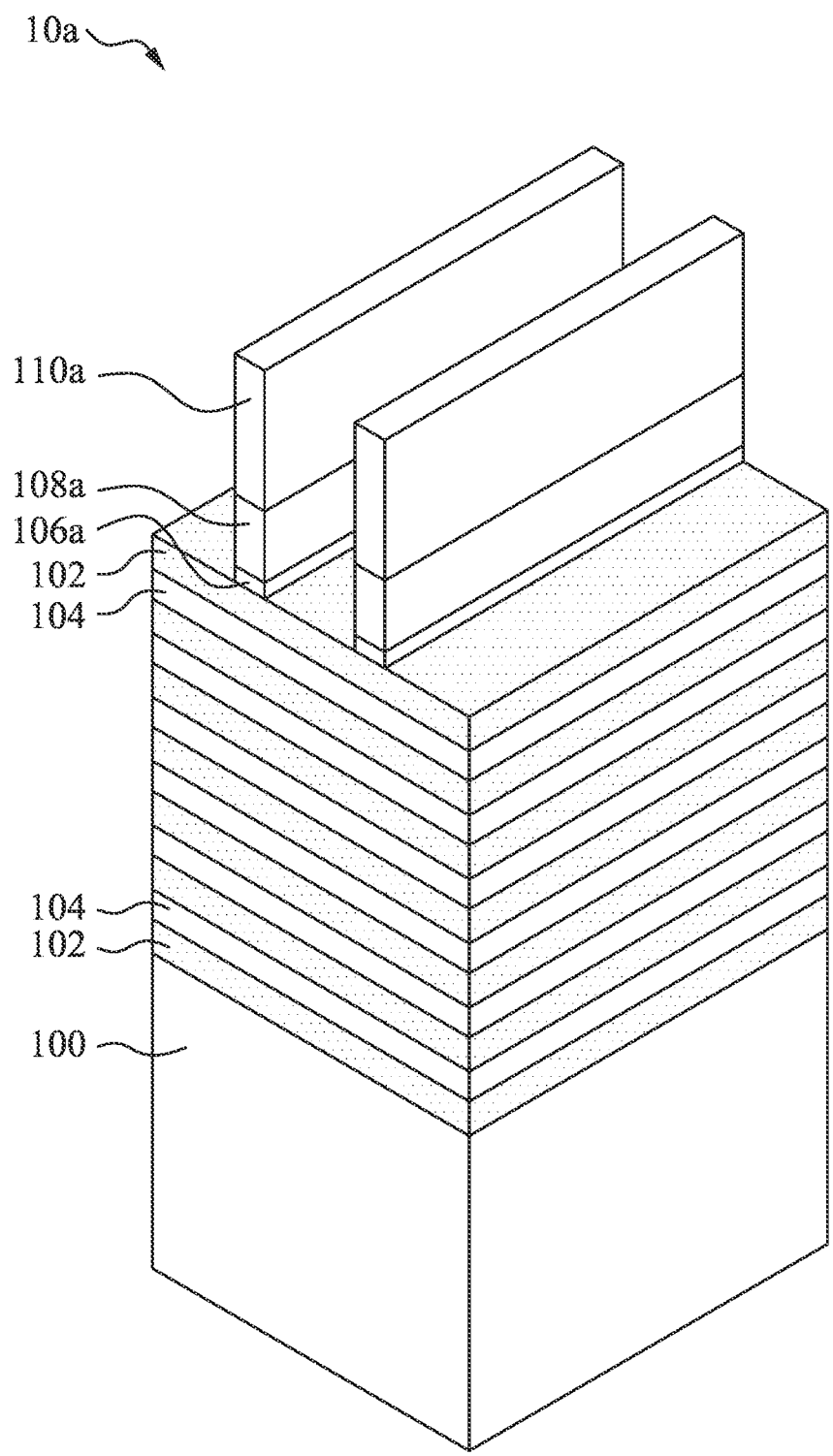
Figure 2B:
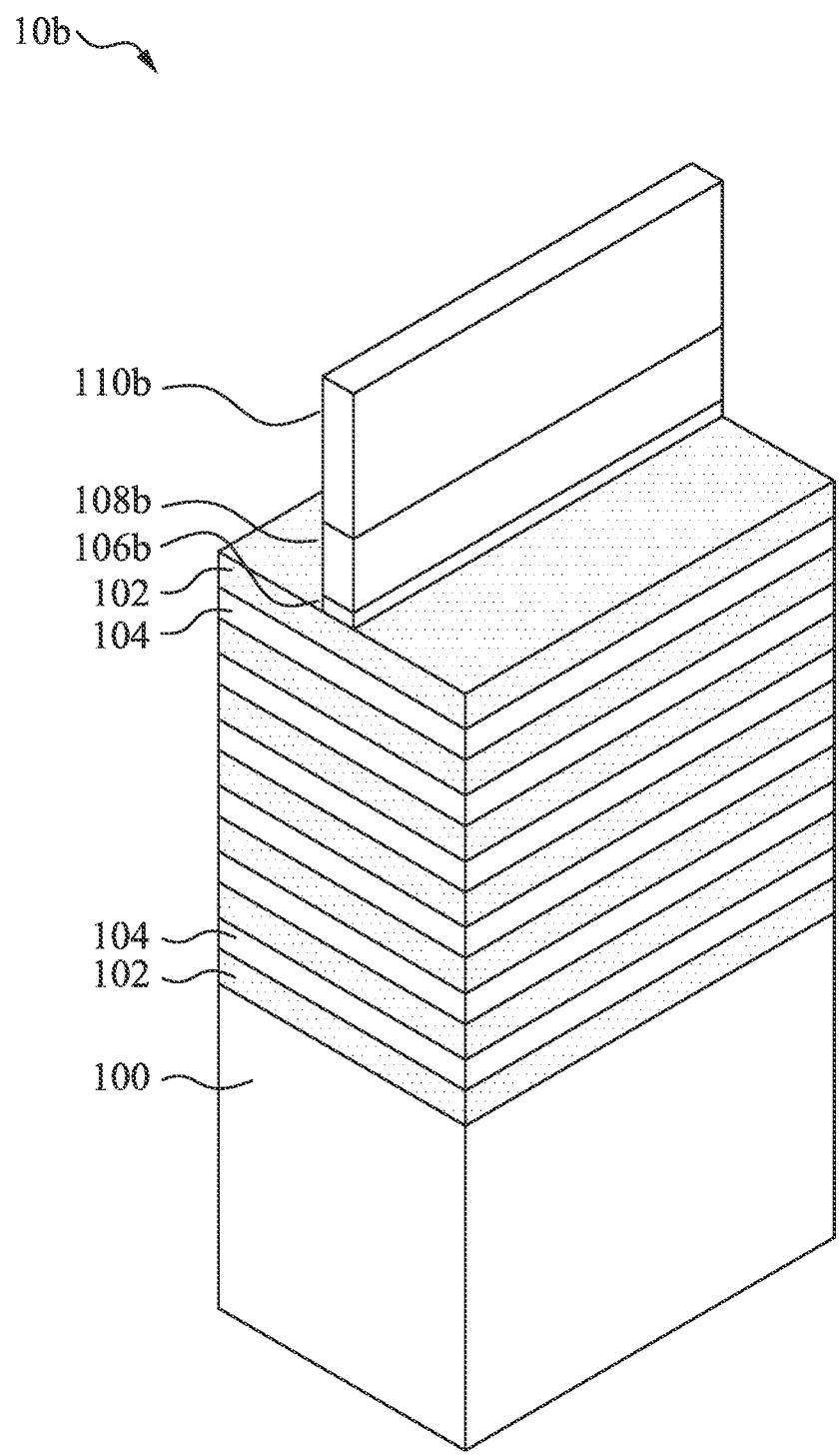

Reference is made to FIGS. 1, 2A and 2B. The semiconductor device 10 includes a substrate 100 and device features can be formed on, above or over the substrate 100. The fin activation area 10a is referred as a fin activation area with plural fins, e.g., in SRAM, random logic or input/output area, and the first fin activation area 10b is referred as a fin activation area with a single fin, e.g., stand cell.

The substrate 100 may be a bulk silicon substrate. Alternatively, the substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 100 also include a silicon-on-insulator (SOI) substrate. SOI substrates are fabricated using separation by implantation of oxygen (SIMOX), wafer bonding, and/or other suitable methods.

The doped regions may be doped with p-type dopants, such as boron or BF2; n-type dopants, such as phosphorus or arsenic; or combinations thereof. The doped regions may be formed directly on the substrate 100, in a P-well structure, in an N-well structure, in a dual-well structure, and/or using a raised structure. The substrate 100 may further include various active regions, such as regions configured for an N-type metal-oxide-semiconductor transistor device and regions configured for a P-type metal-oxide-semiconductor transistor device.

A series of nano epitaxy layers 104 and sacrificial nano epitaxy layers 102 are alternately epitaxially grown on the substrate 100 for fin structure to form a nano epitaxy layer stack. In some embodiments, the nano epitaxy layer 104 may be nano epitaxy Silicon (Si) layer, and the present disclosure is not limited in this respect. In some embodiments, the sacrificial nano epitaxy layer 102 may be a nano epitaxy Silicon(Si)-Germanium (Ge) layer, and the present disclosure is not limited in this respect.

In some embodiments, the nano epitaxy layer 104 may have a thickness ranging from about 3 nm to about 7 nm, and the present disclosure is not limited in this respect. In some embodiments, the sacrificial nano epitaxy layer 102 may have a thickness ranging from about 2 nm to about 10 nm, and the present disclosure is not limited in this respect.

In some embodiments, a pad oxide layer 106, a pad nitride layer 108 and a mask layer 110 are deposited over the alternately-formed nano epitaxy layers 104 and sacrificial nano epitaxy layers 102. In some embodiments, the pad oxide layer 106 may be a thin film including silicon oxide formed, for example, using a thermal oxidation process. The pad oxide layer 106 may act as an adhesion layer between the nano epitaxy layers (102, 104) and the pad nitride layer 108. In some embodiments, the pad nitride layer 108 may be formed of silicon nitride, for example, using low-pressure chemical vapor deposition (LPCVD) or plasma enhanced chemical vapor deposition (PECVD). In some embodiments, the mask layer 110 may be formed of thick silicon oxide for example, using low-pressure chemical vapor deposition (LPCVD) or plasma enhanced chemical vapor deposition (PECVD). The mask layer 110 is used as a hard mask during following processes, such as photolithography.

Reference is made to FIGS. 2A and 2B again. The pad oxide layer 106, the pad nitride layer 108 and the mask layer 110 are patterned to form mask structures with uniform widths both in the fin activation area 10a and in the fin activation area 10b, e.g., each combination of the pad oxide layer 106a, the pad nitride layer 108a and the mask layer 110a in the fin activation area 10a has a uniform width that is substantially equal to that of the combination of the pad oxide layer 106b, the pad nitride layer 108b and the mask layer 110b in the fin activation area 10b.

Figure 3A:
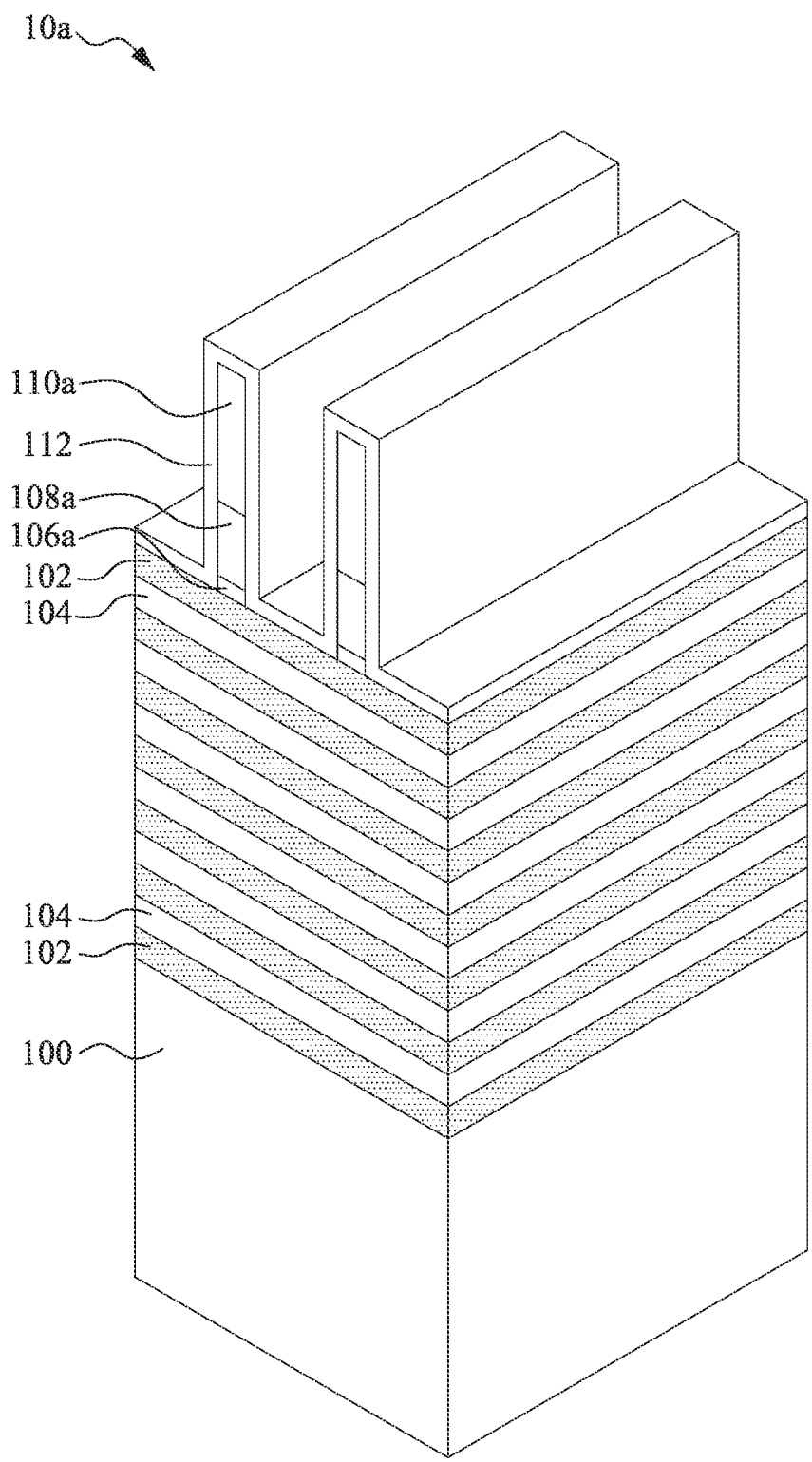
Figure 3B:
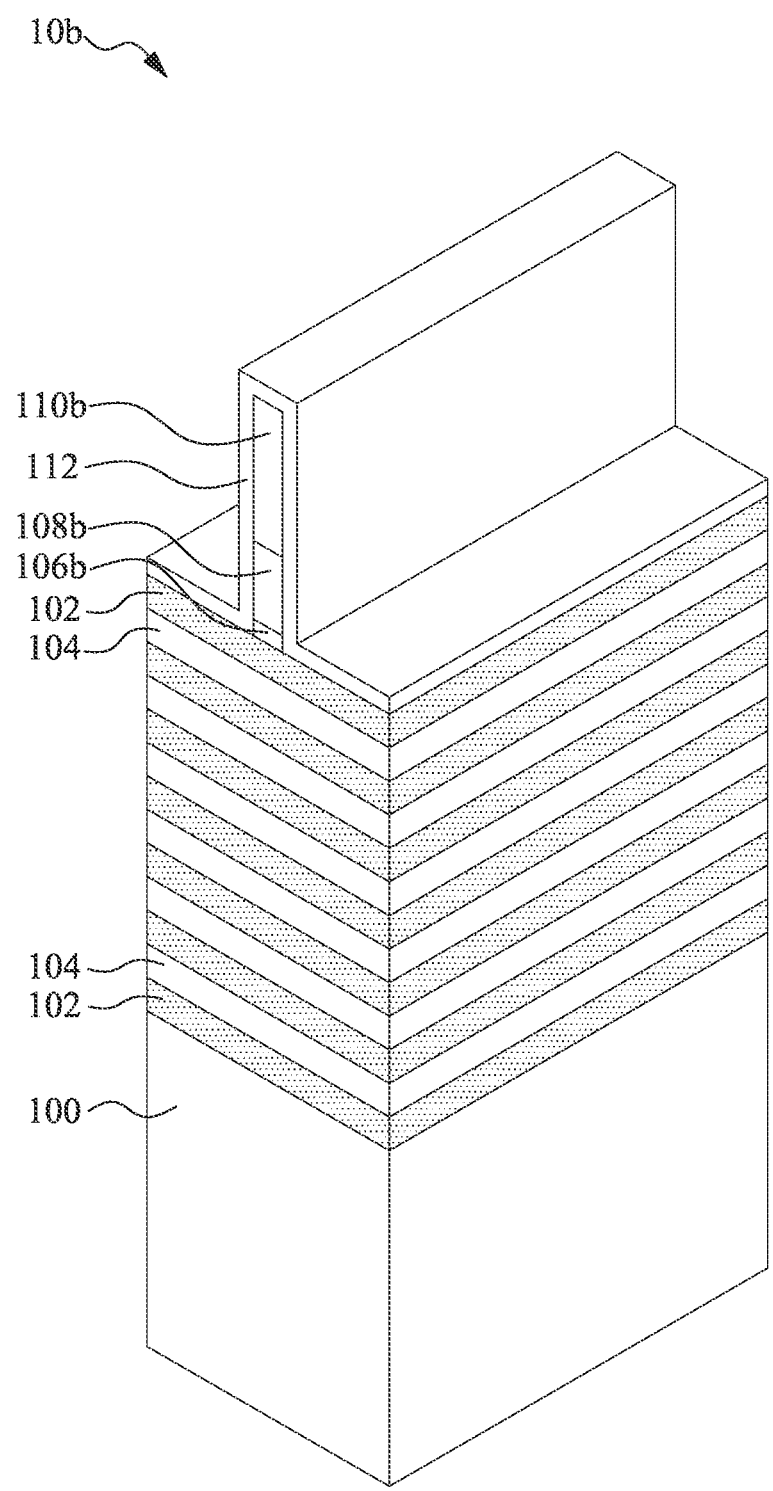

Reference is made to FIGS. 3A and 3B. A spacer cap layer 112 is conformally formed over the patterned pad oxide layer 106a, pad nitride layer 108a and mask layer 110a in the fin activation area 10a and over the patterned pad oxide layer 106b, pad nitride layer 108b and mask layer 110b in the fin activation area 10b.

In some embodiments, the spacer cap layer 112 may be formed of thin silicon oxide for example, using low-pressure chemical vapor deposition (LPCVD) or plasma enhanced chemical vapor deposition (PECVD).

Figure 4A:
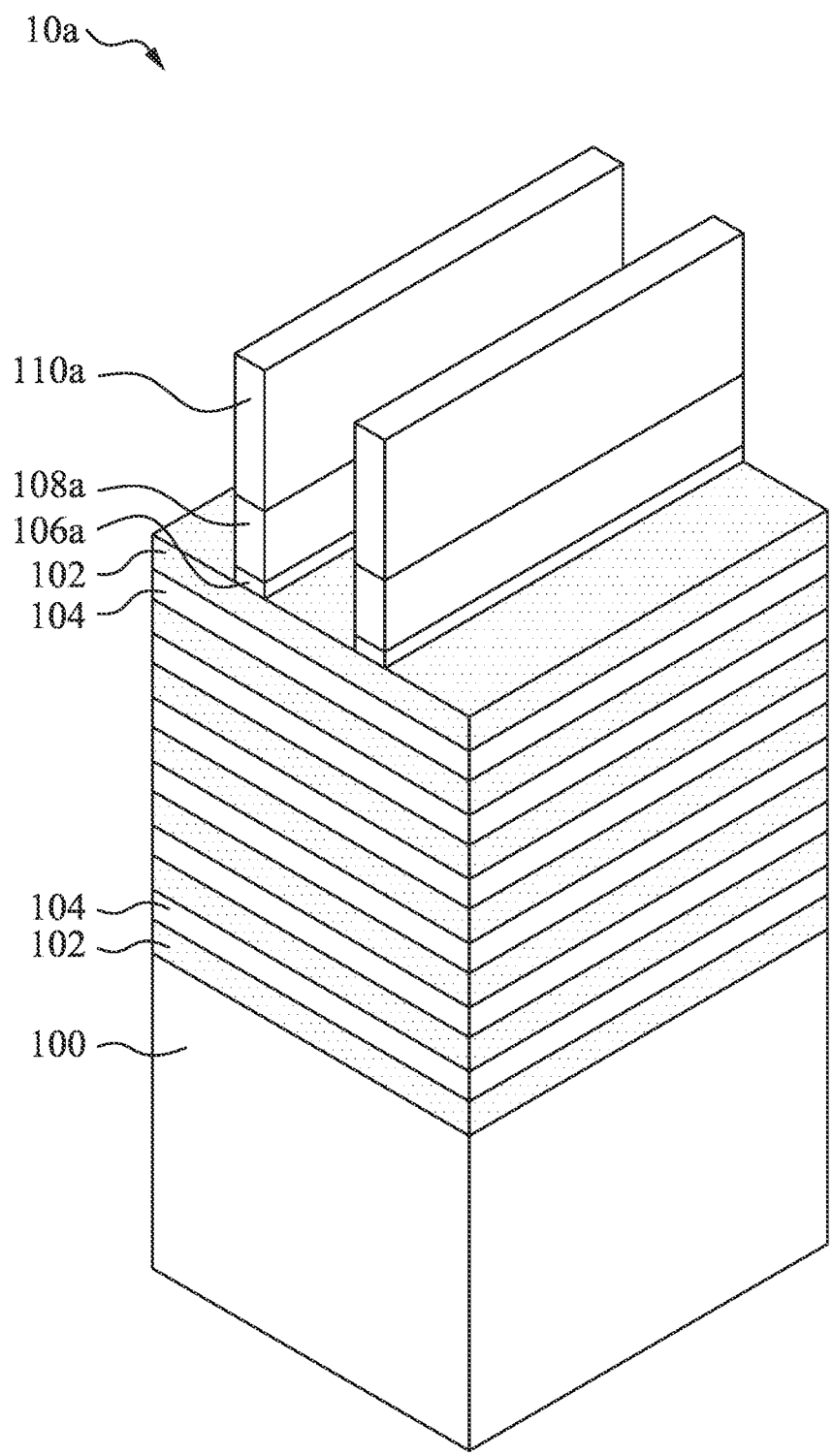
Figure 4B:
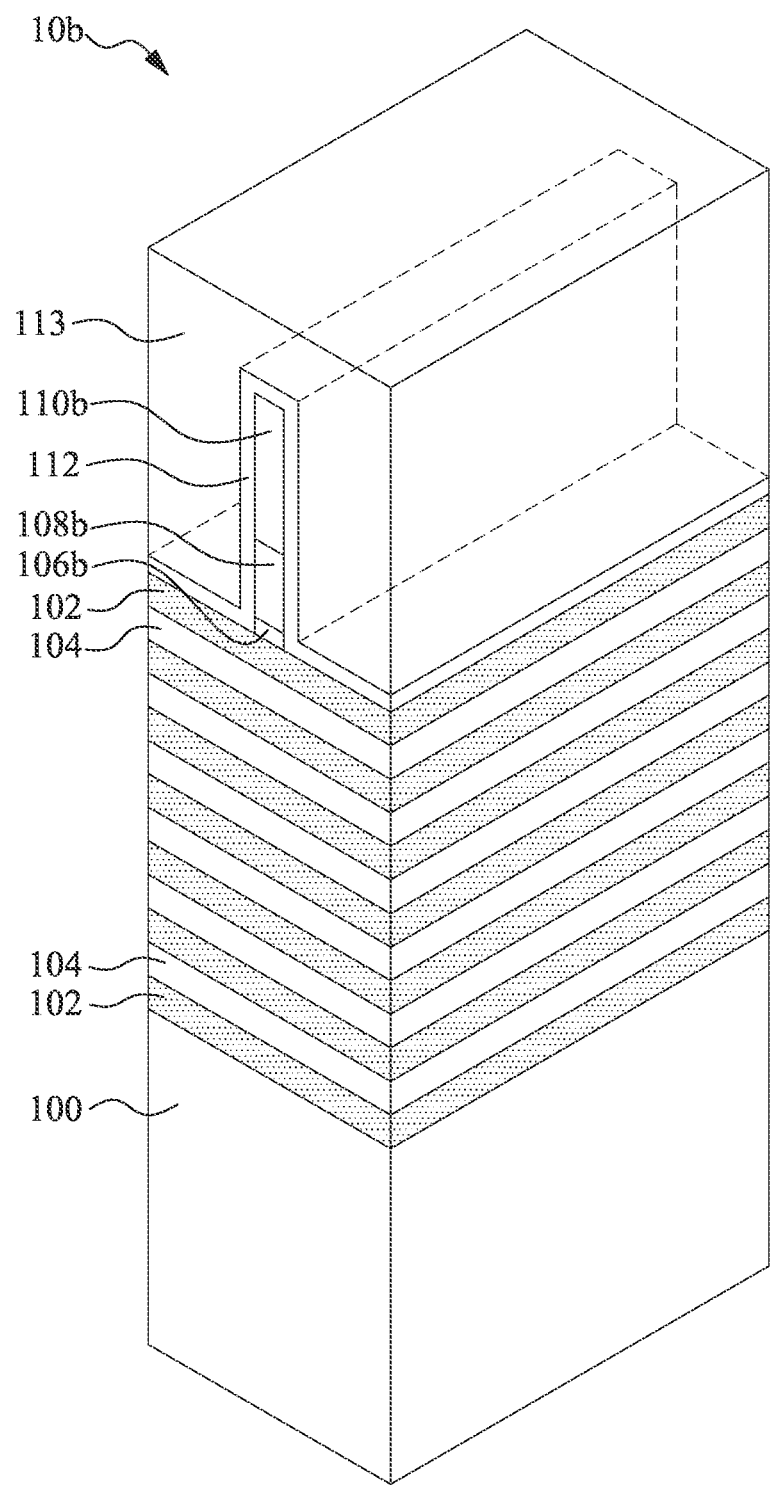

Reference is made to FIGS. 4A and 4B. A photo resist layer 113 is deposited over the fin activation area 10b as a mask structure and an etching process is performed both on the fin activation area 10a and in the fin activation area 10b. After the etching process, the spacer cap layer 112 in the fin activation area 10a is removed while the spacer cap layer 112 in the fin activation area 10b is protected by the photo resist layer 113 and not removed. In some embodiments, the photo resist layer 113 and the remained spacer cap layer 112 may have substantially the same width in the fin activation area 10b.

In some embodiments, the photo resist layer 113 may be removed before fin etching processes. In some embodiments, a portion of the remained spacer cap layer 112 in contact with the top sacrificial nano epitaxy layer 102 may be removed by a selective etching (i.e., etch the remained spacer cap layer 112 in the fin activation area 10b and not etch the top sacrificial nano epitaxy layer 102 in the fin activation area 10a) before fin etching processes such that the spacer cap layer 112 is remained merely upon sidewalls of the patterned pad oxide layer 106, pad nitride layer 108 and mask layer 110 as part of the mask structure when fin etching processes are performed.

Figure 5A:
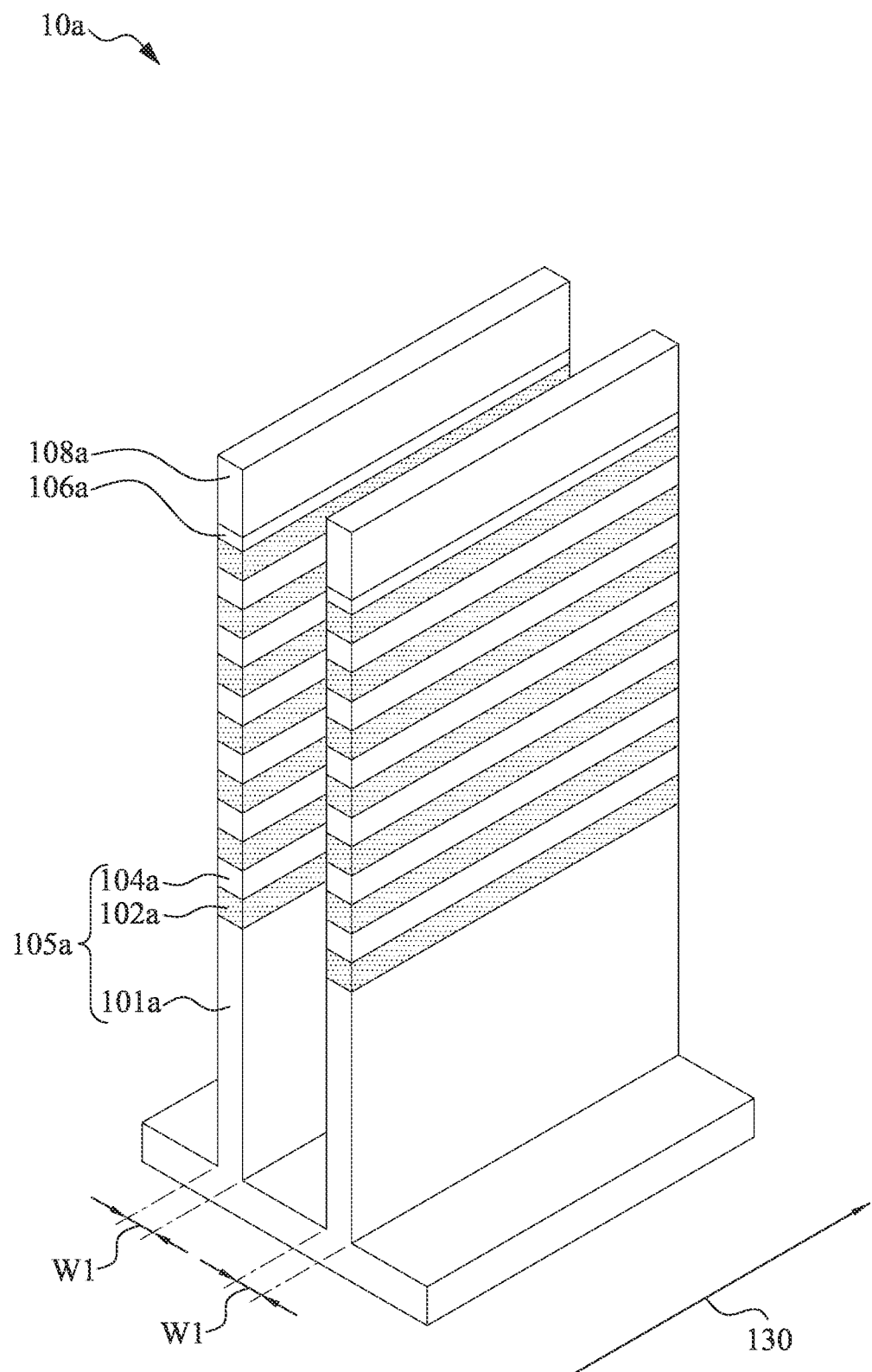
Figure 5B:
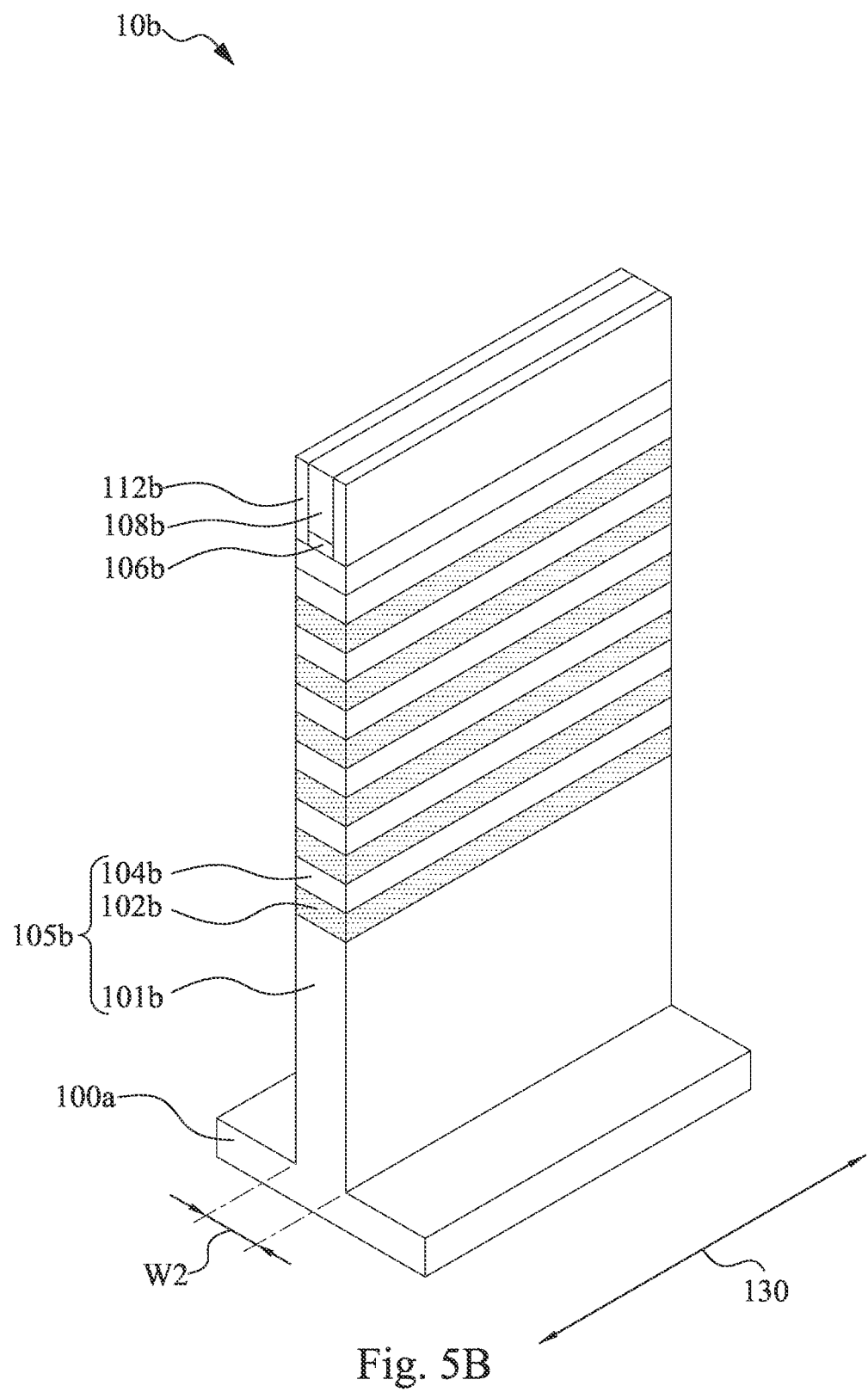

Reference is made to FIGS. 5A and 5B. One or more etching process(es) are performed to form multiple fin structures 105a in a lengthwise direction 130 in the fin activation area 10a and single fin structure 105b in a lengthwise direction 130 in the fin activation area 10b. Each fin structure 105a includes a base fin 101a protruding from the semiconductor substrate 100a and multiple patterned nano epitaxy layers 104a and sacrificial nano epitaxy layers 102a stacked above the base fin 101a. Each fin structure 105b includes a base fin 101b protruding from the semiconductor substrate 100a and multiple alternate nano epitaxy layers 104b and sacrificial nano epitaxy layers 102b stacked above the base fin 101b.

In some embodiments, the fin structures 105a may be etched by capping the patterned pad oxide layer 106, pad nitride layer 108 and mask layer 110 on top of the fin structures 105a in the fin activation area 10a. And, the fin structure 105b may be etched by capping the patterned pad oxide layer 106, pad nitride layer 108, and mask layer 110 as well as the remained spacer cap layer 112 on top of the fin structures 105b in the fin activation area 10b. The remained spacer cap layer 112 is located on used to broaden a width of the mask layer in order to obtain the relatively wide fin structure 105b during the fin patterning process.

After fin patterning process, the fin structures 105a are formed under the patterned pad oxide layer 106, pad nitride layer 108 and mask layer 110 in the fin activation area 10a while the fin structure 105b is formed under the patterned pad oxide layer 106, pad nitride layer 108, and mask layer 110 as well as the remained spacer cap layer 112 in the fin activation area 10b.

In some embodiments, the etching process may include dry etching process, wet etching process, and/or combination thereof. The recessing process may also include a selective wet etch or a selective dry etch. A wet etching solution includes a tetramethylammonium hydroxide (TMAH), a HF/HNO3/CH3COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include NH4OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include CF4, NF3, SF6, and He. Dry etching may also be performed anisotropically using such mechanisms as DRIE (deep reactive-ion etching).

Fin structures are formed over the substrate 100a within different functional regions, e.g., a LOGIC region and/or a memory region. In some embodiments, the fin structures may be of the same type or of different types. For example, some of the fin structures are n-type semiconductor fins, and the others of the fin structures are p-type semiconductor fins, and the present disclosure is not limited in this respect.

In some embodiments, each fin structure 105a in the fin activation area 10a is formed with a uniform width (W1) that is substantially equal to a uniform width (W1) of the other fin structure 105a in the fin activation area 10a. In some embodiments, the single fin structure 105b in the fin activation area 10b is formed with a uniform width (W2) that is greater than that (W1) of the fin structure 105a in the fin activation area 10a. The uniform width (W1) and width (W2) are measured in a direction that is perpendicular to the lengthwise direction 130.

Figure 6A:
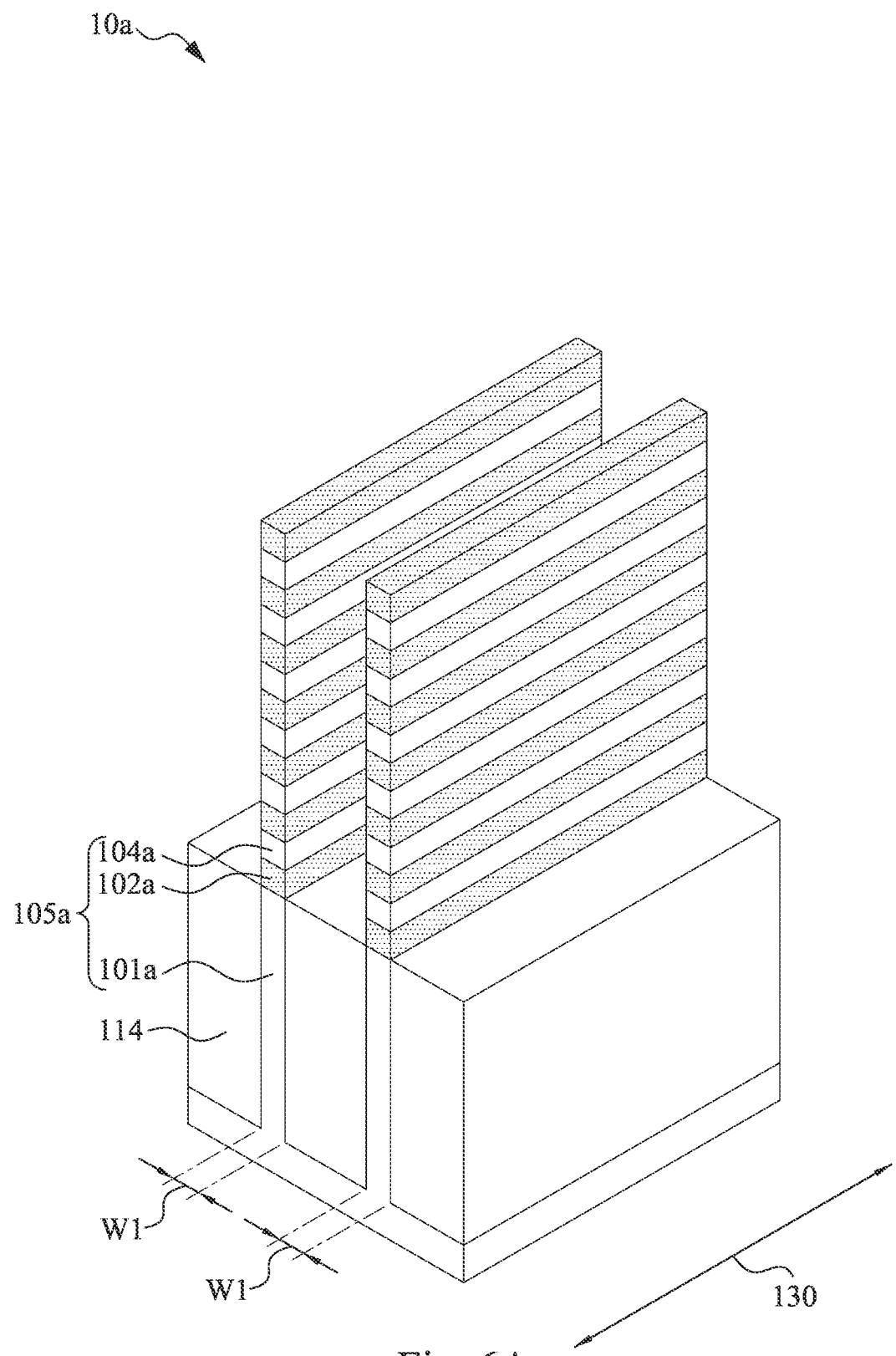
Figure 6B:
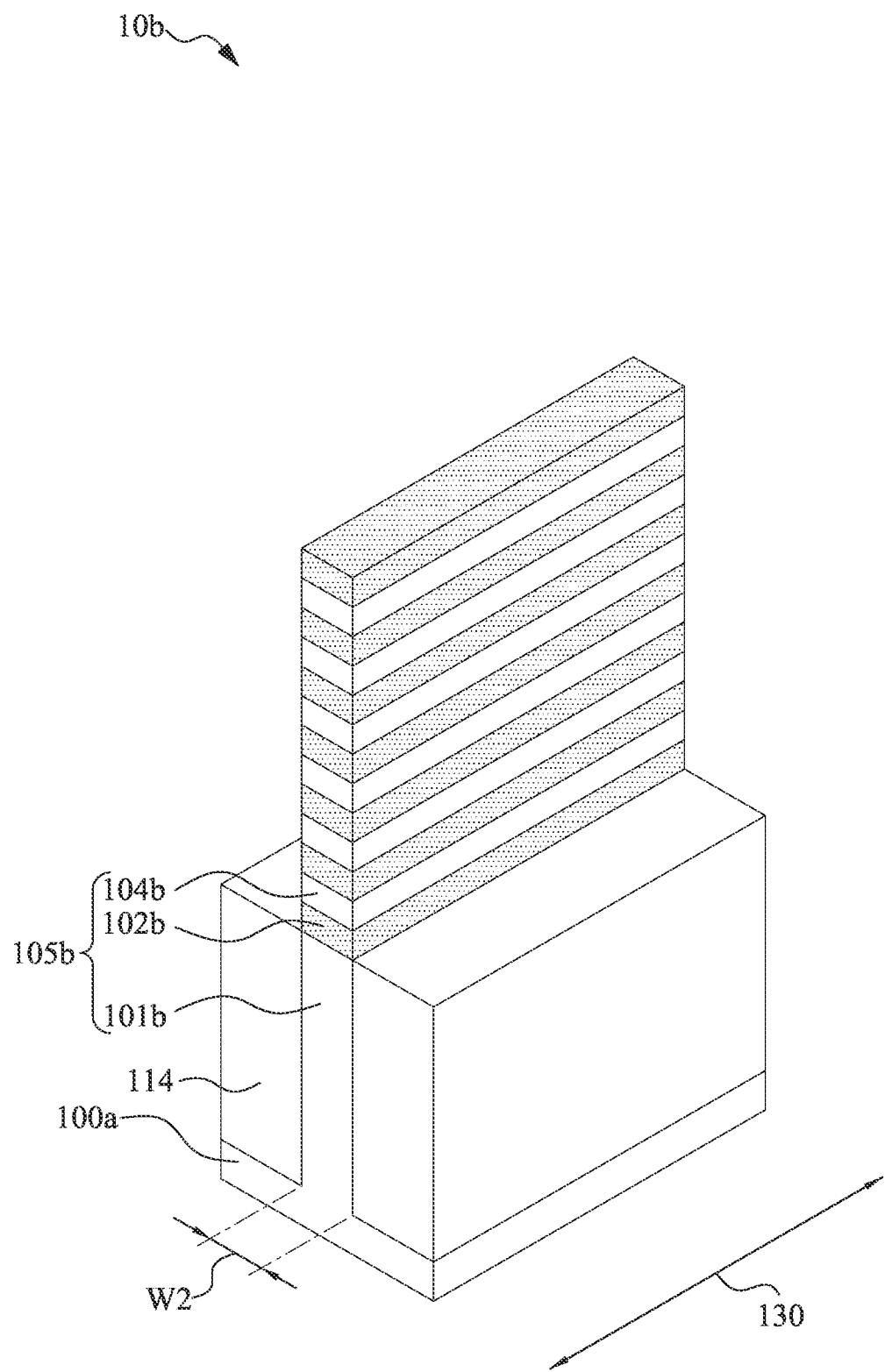

Reference is made to FIGS. 6A and 6B. One or more etching process(es) are performed to remove the pad oxide layer 106 and pad nitride layer 108 on the fin structure 105a in the fin activation area 10a and to remove the remained pad oxide layer 106b, pad nitride layer 108b and the spacer cap layer 112b on the fin structure 105b in the fin activation area 10b.

A field oxide layer 114 is formed to fill into trenches both in the fin activation area 10a and the fin activation area 10b to form a shallow trench isolation (STI). In some embodiments, at least the base fin 101a of each fin structure 105a is embedded within the field oxide layer 114 and at least the base fin 101b of each fin structure 105b is embedded within the field oxide layer 114.

In some embodiments, at least the multiple alternate nano epitaxy layers 104a and sacrificial nano epitaxy layers 102a of each fin structure 105a may be located above the STI (i.e., the field oxide layer 114) and at least the multiple alternate nano epitaxy layers 104b and sacrificial nano epitaxy layers 102b of each fin structure 105b may be located above the STI (i.e., the field oxide layer 114).

Figure 7A:
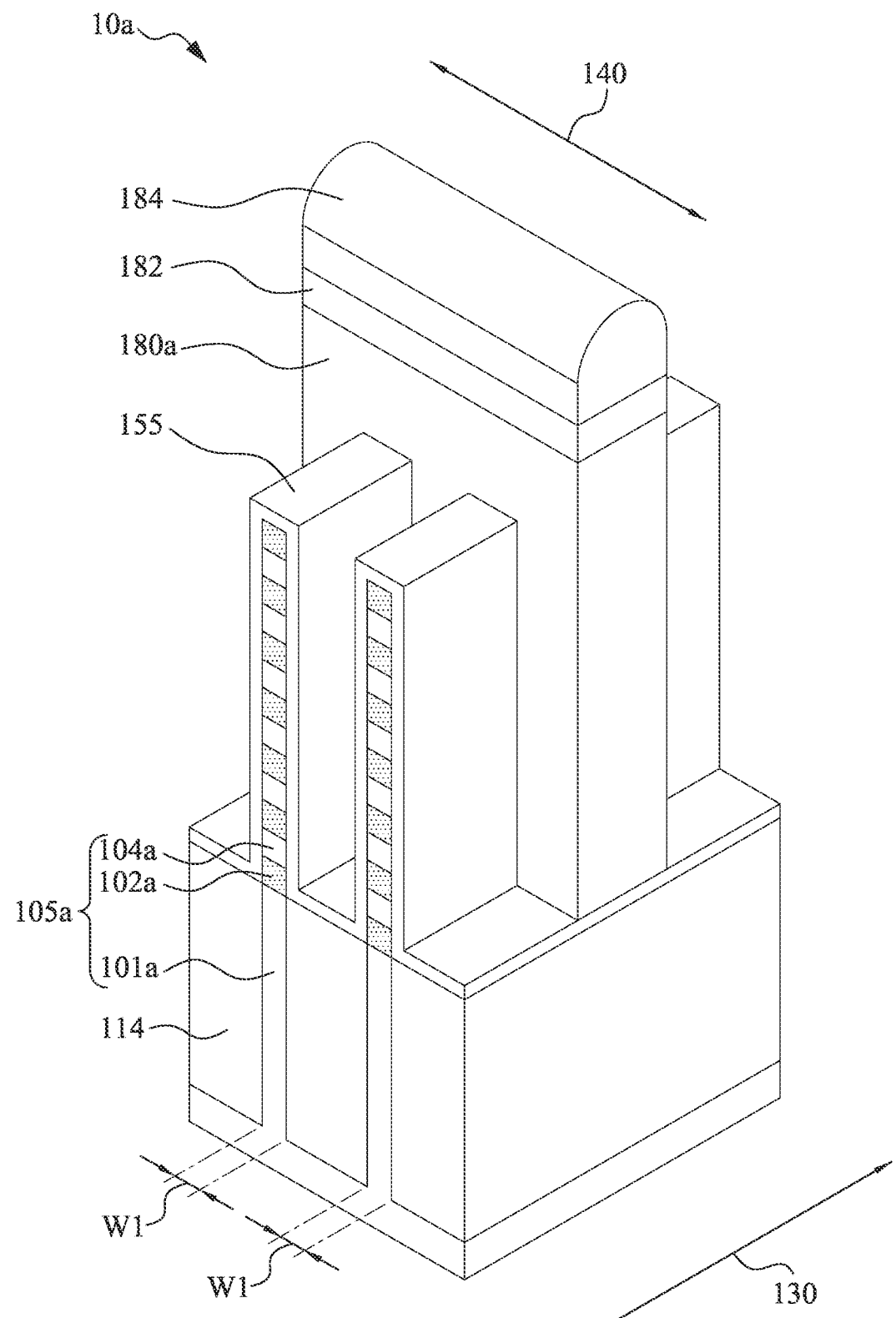
Figure 7B:
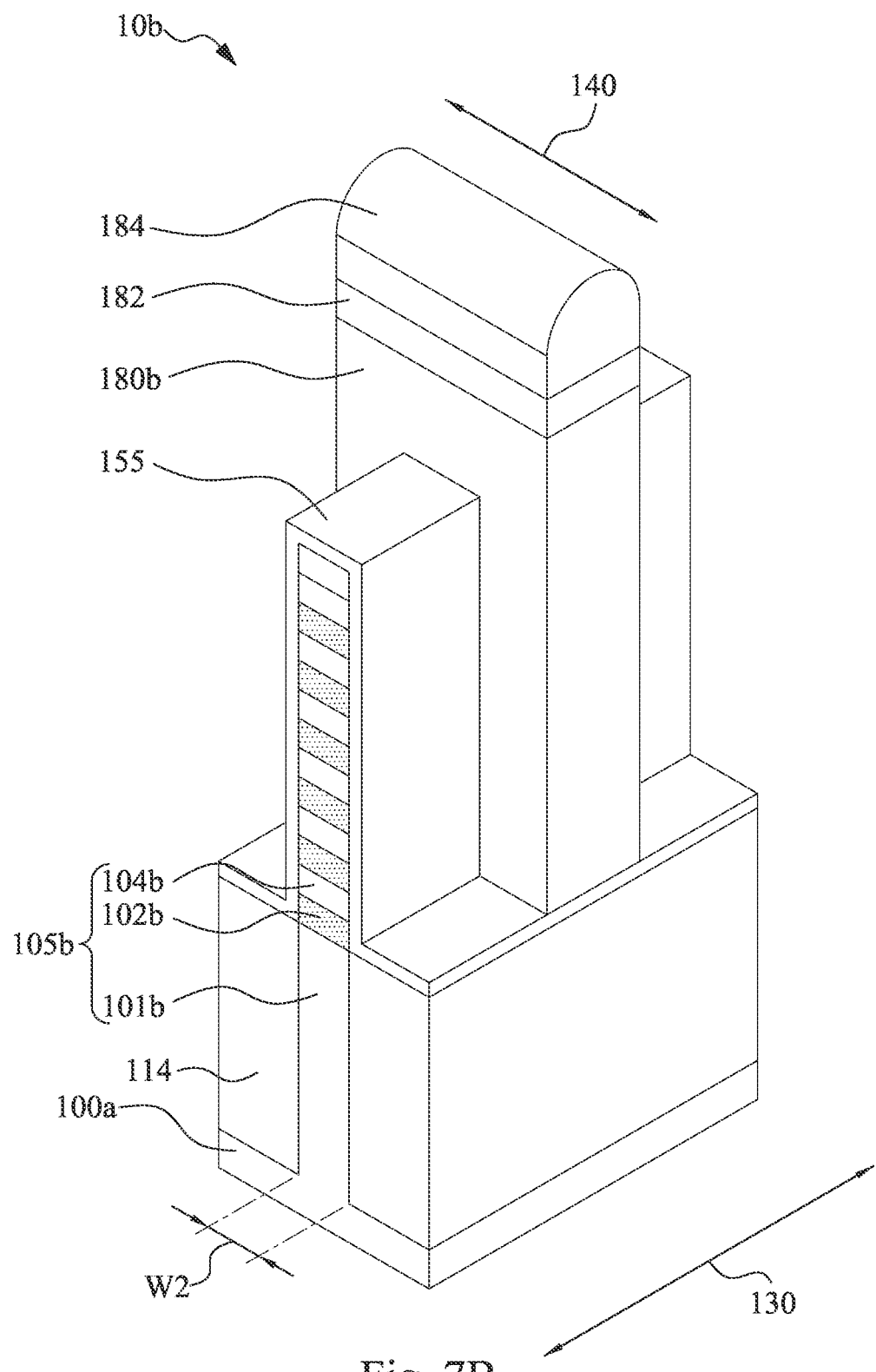

Reference is made to FIGS. 7A and 7B. A thin oxide layer 155 is formed over the STI (i.e., the field oxide layer 114) and the fin structures 105a and 105b. The oxide layer 155 may act as gate dielectric in later process. Plural dummy gates are formed over the oxide layer 155, in which the dummy gate 180a crosses the plural fin structures 105a in a direction 140, and the dummy gate 180b crosses the single fin structures 105b in a direction 140. In some embodiments, the direction 140 may be perpendicular to the lengthwise direction 130.

In some embodiments, mask layers 182 and 184 are formed over the dummy gates 180a and 180b. The mask layers 182 and 184 acts as a hard mask during the patterning process of the dummy gates 180a and 180b and may act as a hard mask during the following processes, such as etching. In some embodiments, the mask layers 182 and 184 may include silicon oxide, silicon nitride and/or silicon oxynitride.

In some embodiments, the dummy gates 180a and 180b may include polycrystalline-silicon (poly-Si) or poly-crystalline silicon-germanium (poly-SiGe). Further, the dummy gates may be doped poly-silicon with uniform or non-uniform doping. In some embodiments, the dummy gates 180a and 180b may be formed by, for example, forming a dummy gate material layer over the oxide layer 155. Patterned masks, such as mask layers 182 and 184, are formed over the dummy gate material layer. Then, the dummy gate material layer may be patterned using one or more etching processes, such as one or more dry plasma etching processes or one or more wet etching processes. During the etching process, the patterned mask may act as an etching mask. At least one parameter, such as etchant, etching temperature, etching solution concentration, etching pressure, source power, radio frequency (RF) bias voltage, etchant flow rate, of the patterning (or etching) recipe can be tuned. For example, dry etching process, such as plasma etching, may be used to etch the dummy gate material layer and the oxide layer 155 until the fin structures 105a and 105b are exposed.

Figure 8A:
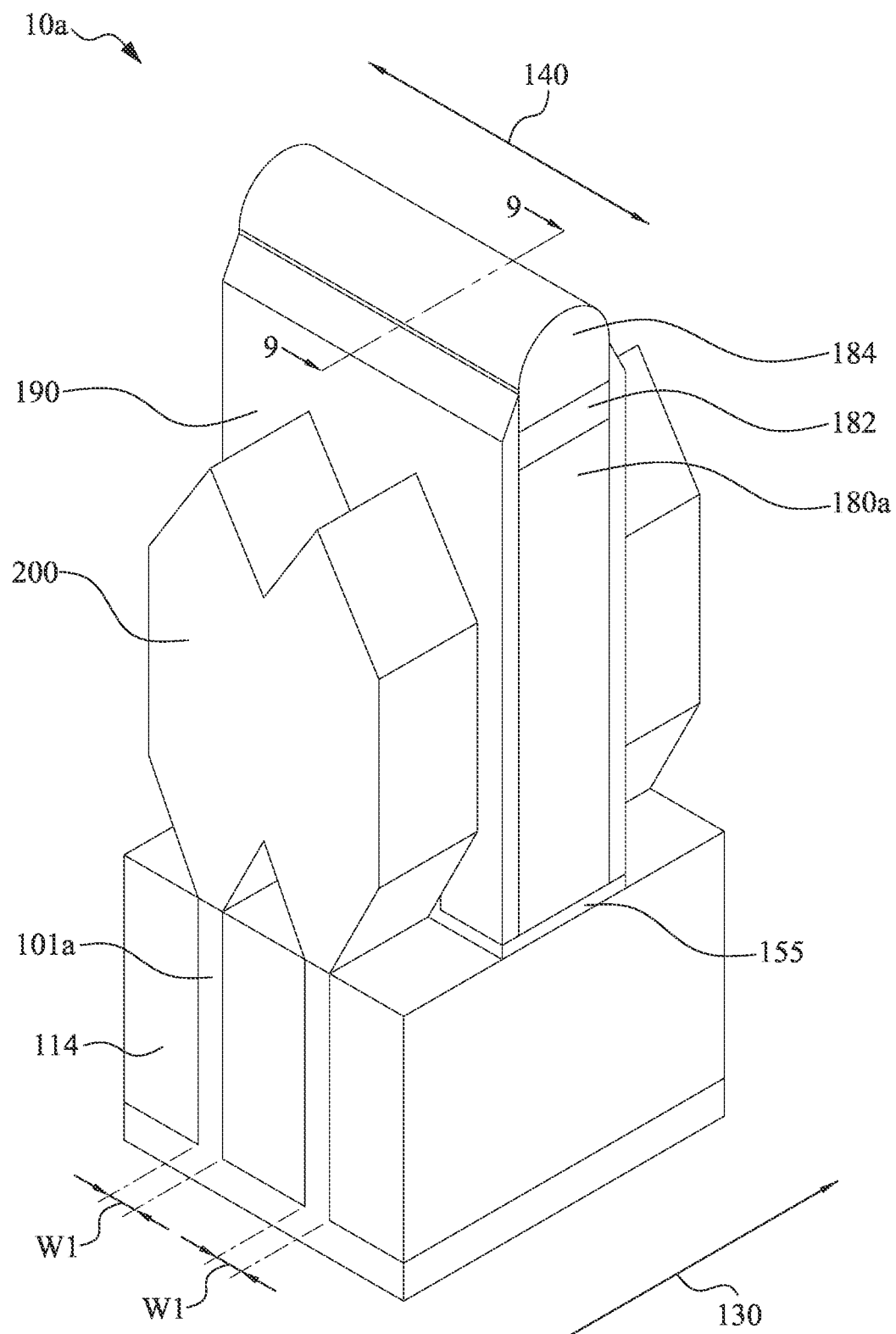
Figure 8B:
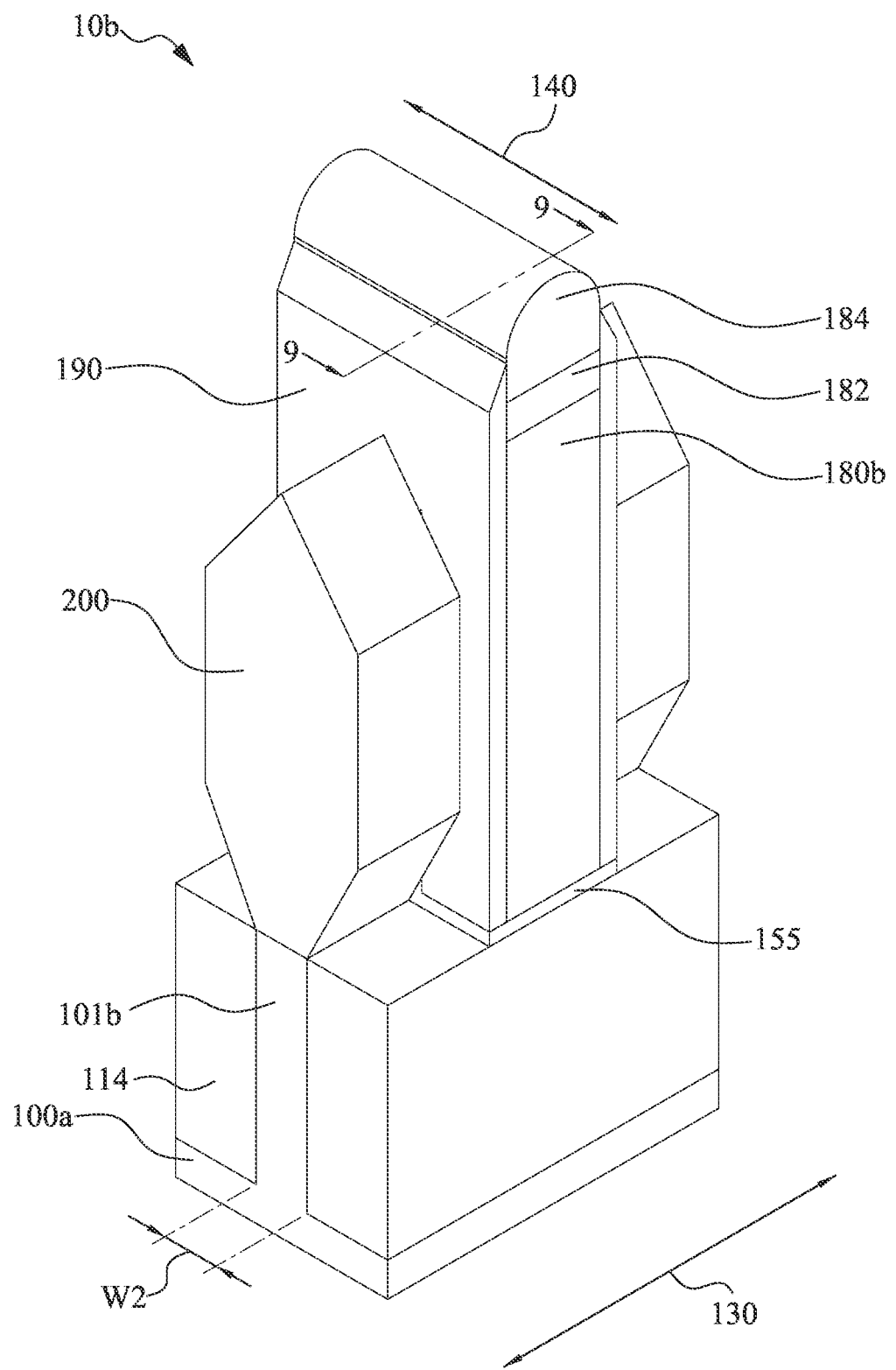
Figure 9:
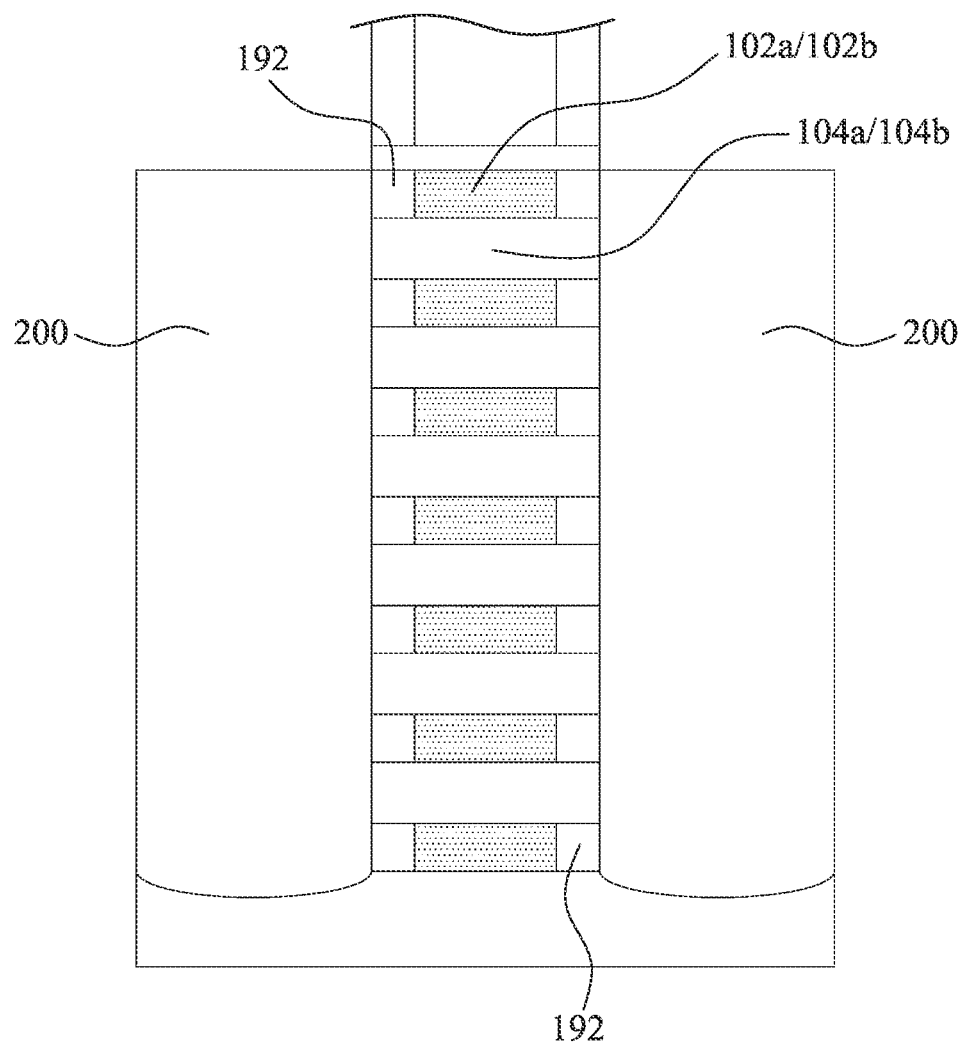
FIG. 9 is a cross-sectional view taken along a cross-sectional line of FIG. 8A or FIG. 8B.

Reference is made to FIGS. 8A and 8B. Gate spacer structures including plural gate spacers 190 on opposite sidewalls of the dummy gates 180a and 180b are formed. In some embodiments, at least one of the gate spacers 190 includes single or multiple layers. The gate spacers 190 can be formed by blanket depositing one or more dielectric layer(s) on the previously formed structure. The dielectric layer(s) may include silicon nitride (SiN), oxynitride, silicon carbon (SiC), silicon oxynitride (SiON), oxide, and the like. The gate spacers 190 may be formed by methods such as CVD, plasma enhanced CVD, sputter, or the like. The gate spacers 190 may then be patterned, such as by one or more etch processes to remove horizontal portions of the gate spacers 190 from the horizontal surfaces of the structure.

The oxide layer 155 exposed from the dummy gates 180a and 180b and the gate spacers 190 are removed by suitable process, such as etching. The remained portions of the oxide layer 155 are disposed under the dummy gates 180*a* and 180*b* and the gate spacers 190. Thus, the remained portions of the oxide layer 155 may be referred to as gate dielectric. Also, the dummy gate 180*a* and 180*b* and the remained oxide layer 155 may collectively be referred to as a dummy gate structure.

In some embodiments, the fin structures 105*a* exposed from the dummy gates 180*a* and the gate spacers 190 are removed by suitable process, such as etching, while the fin structures 105*b* exposed from the dummy gates 180*b* and the gate spacers 190 are removed by suitable process, such as etching.

Plural source/drain features 200 are respectively formed over the exposed base fins 101*a* and 101*b* of the substrate 100. In some embodiments, the wider source/drain features 200 are respectively formed over the exposed base fins 101*a*, in which each base fin 101*a* is equipped with a relatively narrow width, i.e., compared with the base fin 101*b*. In some embodiments, the thinner source/drain features 200 are respectively formed over the exposed base fin 101*b* that is equipped with a relatively large width, i.e., compared with the base fin 101*a*.

In some embodiments, the source/drain features 200 may be epitaxy structures, and may also be referred to as epitaxy features 200. The source/drain features 200 may be formed using one or more epitaxy or epitaxial (epi) processes, such that Si features, SiGe features, and/or other suitable features can be formed in a crystalline state on the semiconductor base fins 101*a* and 101*b*. In some embodiments, the source/drain features 200 may be cladding over the semiconductor base fins 101*a* and 101*b*.

In some embodiments, lattice constants of the source/drain features 200 are different from lattice constants of the semiconductor base fins 101*a* and 101*b*, such that channels in the semiconductor base fins 101*a* and 101*b* are strained or stressed to enable carrier mobility of the semiconductor device and enhance the device performance. In some embodiments, the source/drain features 200 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 110 (e.g., silicon). The source/drain features 200 may be in-situ doped. The doping species include P-type dopants, such as boron or BF2; N-type dopants, such as phosphorus or arsenic; and/or other suitable dopants including combinations thereof. If the source/drain features 200 are not in-situ doped, a second implantation process (i.e., a junction implant process) is performed to dope the source/drain features 200. One or more annealing processes may be performed to activate the source/drain features 200. The annealing processes include rapid thermal annealing (RTA) and/or laser annealing processes.

In some embodiments, the source/drain features 200 over the semiconductor base fins 101*a* and 101*b* may include the same doping-type, and the source/drain feature 200 over one of the semiconductor base fins 101*a* and 101*b* may include different doping-types. For example, some source/drain features 200 may be n-type, and the other source/drain features 200 may be p-type, and vise versa.

Reference is made to FIG. 9, which is a cross-sectional view taken along a cross-sectional line of FIG. 8A or FIG. 8B. In some embodiments, an inner spacer layer 192 is formed between the source/drain features 200 and the sacrificial nano epitaxy layers 102*a*/102*b*. The inner spacer layer 192 may be formed after removing the fin structures 105*a* exposed from the dummy gates 180*a* and the gate spacers 190. The inner spacer layer 192 may be formed of dielectric materials by methods such as CVD, plasma enhanced CVD, sputter, or the like. The nano epitaxy layers 104*a*/104*b* interconnects the source/drain features 200.

Figure 10A:
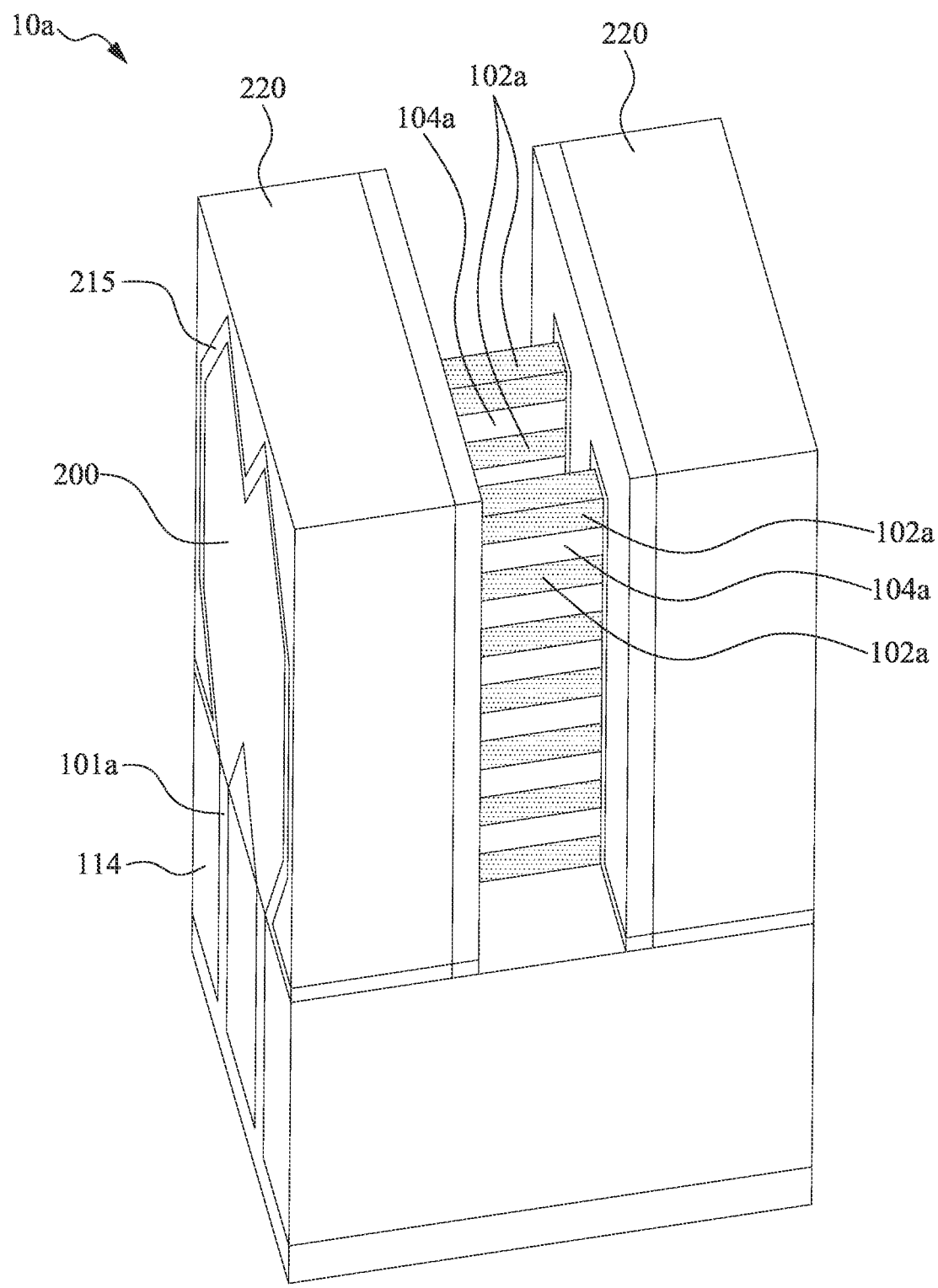
Figure 10B:
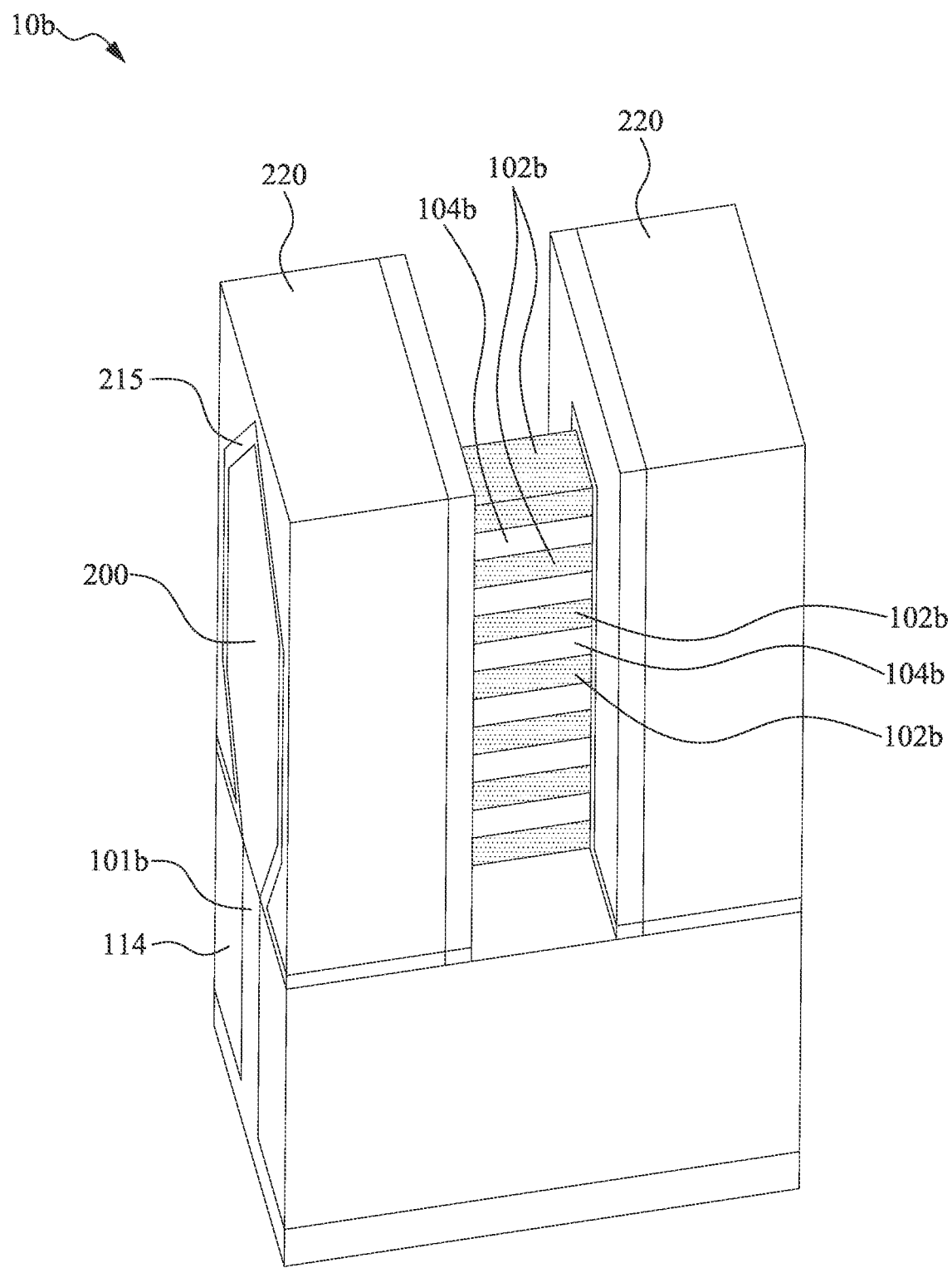

Reference is made to FIGS. 10A and 10B. An etching stop layer 215 and interlayer dielectric 220 is formed over the source/drain features 200. Then, a CMP process is performed to remove the excessive interlayer dielectric 220, and the mask layers 182 and 184 (referring to FIGS. 11A and 11B) until the dummy gates 180*a* and 180*b* are exposed.

In some embodiments, the interlayer dielectric 220 may include silicon nitride, silicon oxynitride, silicon oxycarbonitride, silicon carbide, silicon germanium, or combinations thereof. The interlayer dielectric 220 may be formed by a suitable technique, such as CVD, ALD and spin-on coating. In some embodiments, air gaps may be created in the interlayer dielectric 220.

Then, a replacement gate (RPG) process scheme is employed. The dummy gates 180*a* and 180*b* are replaced with metal gates. For example, the dummy gates 180*a* and 180*b* are removed to from a plurality of gate trenches and expose the multiple alternate nano epitaxy layers and sacrificial nano epitaxy layers. The dummy gate gates 180*a* and 180*b* are removed by a selective etch process, including a selective wet etch or a selective dry etch, and carries a substantially vertical profile of the gate spacers 190.

Figure 11A:
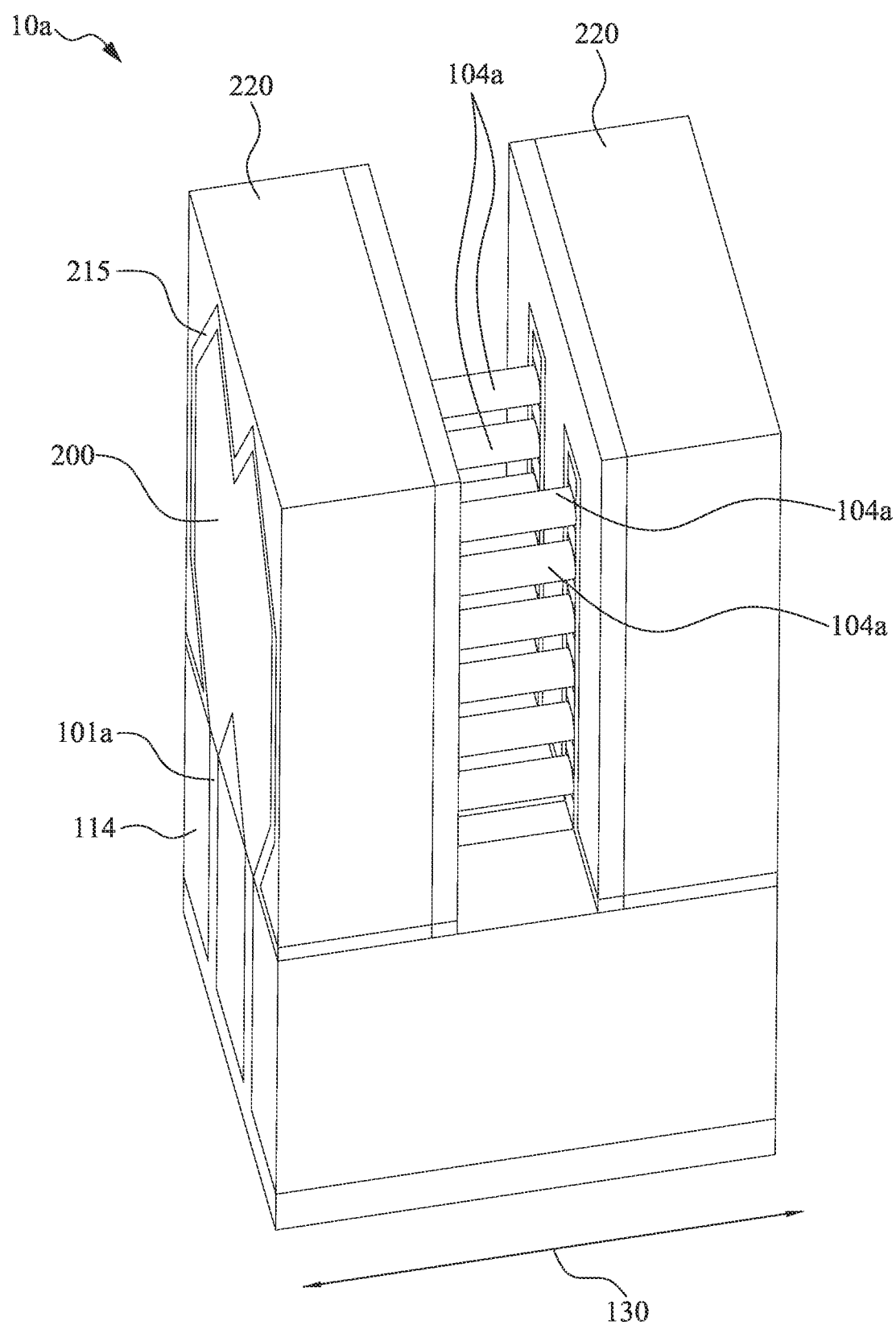
Figure 11B:
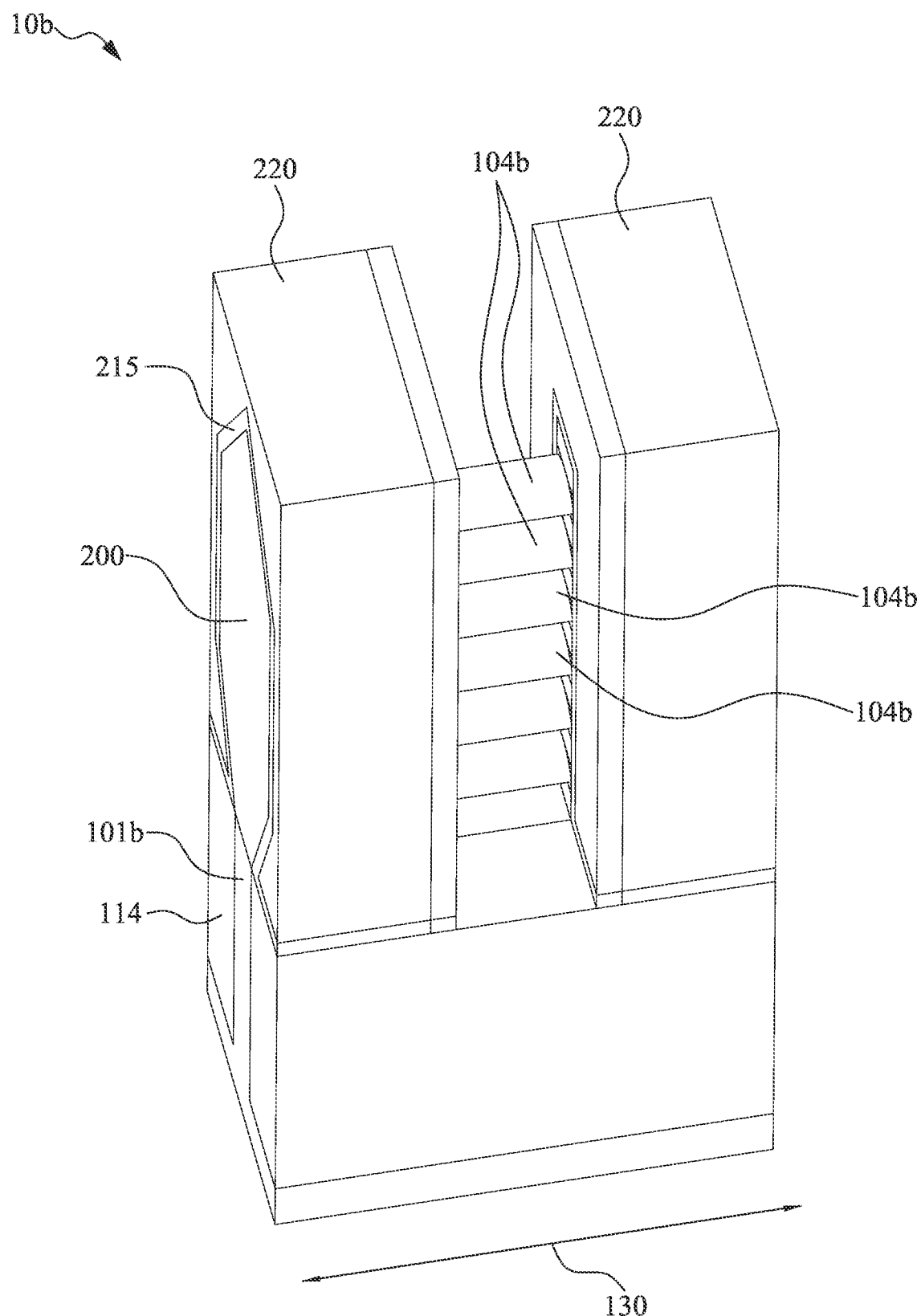

Reference is made to FIGS. 11A and 11B. The sacrificial nano epitaxy layers 102*a*/102*b* are removed by a selective etch process, including a selective wet etch or a selective dry etch, and the remained nano epitaxy layers 104*a*/104*b* forms nano sheet fins or nano wire fins that are spaced from each other. That is, the nano epitaxy layers 104*a*/104*b* may be referred as nano sheet or nano wire 104*a*/104*b*.

Reference is made to FIGS. 12A to 13B. FIG. 13A is a cross-sectional view taken along a cross-sectional line of FIG. 12A. FIG. 13B is a cross-sectional view taken along a cross-sectional line of FIG. 12B. The gate structures 230 are formed respectively in the gate trenches to surround or wrap around the nano sheet fins or nano wire 104*a*/104*b* simultaneously.

The gate structures 230 include an interfacial layer 236, gate dielectrics 232 formed over the interfacial layer 236, and gate metals 234 formed over the gate dielectrics 232. The gate dielectrics 232, as used and described herein, include dielectric materials having a high dielectric constant, for example, greater than that of thermal silicon oxide (~3.9). The gate metals 234 may include a metal, metal alloy, and/or metal silicide.

In some embodiments, the gate structures 230 extend in a direction 140 crossing the direction 130 in which the nano sheet fins or nano wire 104*a*/104*b* extend. The direction 140 may be perpendicular to the direction 130. The gate structures 230 fill into the gate trenches to surround or wrap the nano sheet fins or nano wire 104*a*/104*b* respectively.

Reference is made to FIGS. 13A to 13B. In some embodiments, a quantity of the nano wires 104*a* of each fin structure 105*a* is equal to that of the nano wires 104*b* of the fin structure 105*b*. Each fin structure 105*a* includes a base fin 101*a* and plural nano wires 104*a* located vertically aligned with the base fin 101*a*. The nano wires 104*a* are spaced from the base fin 101a and from each other. Each fin structure 105b includes a base fin 101b and plural nano wires 104b located vertically aligned with the base fin 101a. The nano wires 104b are spaced from the base fin 101b and from each other.

In some embodiments, the nano wires 104a of at least one fin structure 105a have a uniform thickness (T) that is substantially equal to a uniform thickness (T) of the nano wires 104b of at least one fin structure 105b. The thickness (T) of the nano wires 104a or 104b is measured in a direction 150 that is perpendicular to the direction 140.

In some embodiments, a uniform pitch (S) between adjacent nano wires 104a of at least one fin structure 105a is substantially equal to a uniform pitch (S) between adjacent nano wires 104b of at least one fin structure 105b. The uniform pitch (S) of the fin structures 105a/105b is measured in a direction 150 that is perpendicular to the direction 140.

In some embodiments, the nano wires 104a of at least one fin structure 105a have a uniform width (D1) that is smaller than a uniform width (D2) of the nano wires 104b of at least one fin structure 105b. The widths (D1 or D2) of the nano wires 104a or 104b are measured in the direction 140.

In some embodiments, the nano wires 104a of at least one fin structure 105a have a uniform width (D1) ranging from about 3 nm to about 7 nm. In some embodiments, the nano wires 104b of at least one fin structure 105b have a uniform width (D2) ranging from about 8 nm to about 16 nm. In some embodiments, the width (D2) of the nano wire 104b may be two times greater than the width (D1) of the nano wire 104a, but may not be greater than three times the width (D1) of the nano wire 104a because the gate structure may not have enough width to warp around the nano wire 104b with such width.

In some embodiments, the uniform pitch (S) between adjacent nano wires 104a or between adjacent nano wires 104b ranges from about 2 nm to about 10 nm. In some embodiments, the uniform thickness (T) of each nano wire 104a or each nano wire 104b ranges from about 3 nm to about 7 nm.

In some embodiments, a quantity of the nano wires 104a of each fin structure 105a is from 2 to 10 and a quantity of the nano wires 104b of each fin structure 105b is from 2 to 10.

In some embodiments, each nano wire 104a or 104a is wrapped by the interfacial layer 236, the gate dielectric 232 and the gate metal 234.

In some embodiments, the gate metals 234 included in the gate structures 230 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide. For example, the gate metals 234 may be an n-type or p-type work function layer. Exemplary p-type work function metals include TiN, TaN, Ru, Mo, Al, WN, ZrSi2, MoSi2, TaSi2, NiSi2, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electro-plating and/or other suitable process.

In some embodiments, the interfacial layer 236 may include a dielectric material such as silicon oxide (SiO2), HfSiO, and/or silicon oxynitride (SiON). The interfacial layer 236 may be formed by chemical oxidation, thermal oxidation, ALD, CVD, and/or other suitable method. The gate dielectrics 232 may include a high-K dielectric layer such as hafnium oxide (HfO2). Alternatively, the gate dielectric 212 may include other high-K dielectrics, such as TiO2, HfZrO, Ta2O3, HfSiO4, ZrO2, ZrSiO2, LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), combinations thereof, or other suitable material. The gate dielectrics 232 may be formed by ALD, PVD, CVD, oxidation, and/or other suitable methods.

According to aforementioned embodiments, a semiconductor device includes a first fin structure and a second fin structure located over a substrate. The first fin structure has a single stack of first nano wires or sheets with larger width or diameter and the second fin structure has multiple stacks of second nano wires or sheets with smaller width or diameter for design flexibility. Because the first and second fin structures are concurrently formed, the single stack of first nano wires or sheets and multiple stacks of second nano wires or sheets all have equal sheet numbers and substantially the same pitch and thickness. With such configuration, the single stack of first nano wires or sheets with larger width or diameter may obtain speed gain and the multiple stacks of second nano wires or sheets need smaller width or diameter to aggress fin pitch shrinkage for even scaled down process.

Embodiments for manufacturing semiconductor structures are provided. The method may include forming a first mask structure and a second mask structure over a semiconductor stack, and the second mask structure may have spacers formed on its sidewalls. The semiconductor stack may be patterned through the first mask structure, the second mask structure, and the spacers to form a first fin structure under the first mask structure and the second fin structure under the second mask structure and the spacers. That is, the fin structure with different widths may be formed concurrently and the design flexibility may be increased.

An embodiment of the present disclosure is a semiconductor device having a semiconductor substrate, a first fin structure and a second fin structure. The first fin structure includes a first fin and at least two first nano wires located above the first fin, and the first fin protrudes from the semiconductor substrate. The second fin structure includes a second fin and at least two second nano wires located above the second fin, and the second fin protrudes from the semiconductor substrate. Each first nano wire has a first width different from a second width of each second nano wire.

An embodiment of the present disclosure is that each first nano wire has a first thickness substantially equal to a second thickness of each second nano wire.

An embodiment of the present disclosure is that a quantity of the first nano wires is equal to that of the second nano wires.

An embodiment of the present disclosure is that a first pitch between immediately-adjacent two of the first nano wires is substantially equal to a second pitch between immediately-adjacent two of the second nano wires.

An embodiment of the present disclosure is that the first and second fins and the at least two first and second nano wires are arranged in a first direction, and the first and second widths are measured in a second direction that is perpendicular to the first direction.

An embodiment of the present disclosure is the semiconductor device further including a first gate structure extending in a third direction crossing the first direction and surrounding the at least two first nano wires.

An embodiment of the present disclosure is the semiconductor device further including a second gate structure extending in a third direction crossing the first direction and surrounding the at least two second nano wires.

An embodiment of the present disclosure is the semiconductor device further including a pair of first epitaxy structures, and the at least two first nano wires interconnect the pair of first epitaxy structures.

An embodiment of the present disclosure is the semiconductor device further including a pair of second epitaxy structures, and the at least two second nano wires interconnect the pair of second epitaxy structures.

An embodiment of the present disclosure is that the at least two first nano wires are spaced from the first fin, and the at least two second nano wires are spaced from the second fin.

An embodiment of the present disclosure is a semiconductor device having semiconductor substrate, a first fin structure, a plurality of second fin structures, a first gate structure and a second gate structure. The first fin structure includes a first fin and at least two first nano wires arranged in a first direction, and the first fin protrudes from the semiconductor substrate. Each second fin structure includes a second fin and at least two second nano wires arranged in the first direction, and the second fin protrudes from the semiconductor substrate. The first gate structure extends in a second direction crossing the first direction and surrounding the at least two first nano wires of the first fin structure. The second gate structure extends in the second direction crossing the first direction and surrounding the second nano wires of the second fin structures. Each first nano wire has a first width greater than a second width of each second nano wire.

An embodiment of the present disclosure is that the at least two first nano wires have a uniform first thickness.

An embodiment of the present disclosure is that the at least two second nano wires have a uniform second thickness that is substantially equal to the uniform first thickness.

An embodiment of the present disclosure is that the first and second widths are measured in the second direction.

An embodiment of the present disclosure is that a first pitch between any immediately-adjacent two of the first nano wires is uniform.

An embodiment of the present disclosure is that a second pitch between any immediately-adjacent two of the second nano wires is uniform and is substantially equal to the first pitch.

An embodiment of the present disclosure is that the at least two first nano wires are spaced from each other, and the at least two second nano wires are spaced from each other.

An embodiment of the present disclosure is a method for manufacturing a semiconductor device including epitaxially growing a sacrificial layer over a substrate; epitaxially growing a semiconductor layer over the sacrificial layer; depositing a mask layer over the semiconductor layer; patterning the mask layer to form a first mask structure and a second mask structure over the semiconductor layer; forming a spacer cap layer over the first mask structure and the second mask structure; etching the spacer cap layer over the first mask structure, wherein the etched spacer cap layer remains on a sidewall of the second mask structure; etching the semiconductor layer and the sacrificial layer exposed by the first mask structure, the second mask structure, and the etched spacer cap layer to form a first fin under the first mask structure and a second fin under the second mask structure and the etched spacer cap layer, wherein the second fin is wider than the first fin; etching the sacrificial layer in the first fin and the second fin; and forming a first gate structure wrapping around the semiconductor layer in the first fin and forming a second gate structure wrapping around the semiconductor layer in the second fin.

An embodiment of the present disclosure is the method further including patterning the mask layer is performed such that a third mask structure is formed over the semiconductor layer and adjacent the first mask structure, wherein the first and third mask structures have substantially the same width.

An embodiment of the present disclosure is the method further including forming the first gate structure and forming the second gate structure are performed simultaneously.

In some embodiments, methods for manufacturing a semiconductor structure are provided. The method includes alternately stacking first epitaxy layers and second epitaxy layers over a substrate to form a semiconductor stack and forming a first mask structure and a second mask structure over the semiconductor stack. The method further includes forming spacers on sidewalls of the second mask and patterning the semiconductor stack to form a first fin structure covered by the first mask structure and a second fin structure covered by the second mask structure and the spacers. The method further includes removing the first epitaxy layers of the first fin structure to form first nanostructures and removing the first epitaxy layers of the second fin structure to form second nanostructures. In addition, the second nanostructures are wider than the first nanostructures. The method further includes forming a first gate structure around the first nanostructures and forming a second gate structure around the second nanostructures.

In some embodiments, methods for manufacturing a semiconductor structure are provided. The method includes alternately stacking first epitaxy layers and second epitaxy layers over a substrate and forming a first mask structure over a first region of the substrate and a second mask structure over a second region of the substrate. The method further includes forming a spacer cap layer covering the first region and the second region of the substrate and removing the spacer cap layer over the first region to expose the first mask structure. The method further includes etching the spacer cap layer over the second region to form spacers on sidewalls of the second mask structure and etching the first epitaxy layers and second epitaxy layers not covered by the first mask, the second mask, and the spacers to form a first fin structure under the first mask and a second fin structure under the second mask and the spacers. The method further includes removing the first epitaxy layers in the first fin structure to form first gaps between the second epitaxy layers in the first fin structure and removing the first epitaxy layers in the second fin structure to form second gaps between the second epitaxy layers in the second fin structure. The method further includes forming a first gate structure in the first gaps to form a first transistor in the first region and forming a second gate structure in the second gaps to form a second transistor in the second region.

In some embodiments, methods for manufacturing a semiconductor structure are provided. The method includes alternately stacking first epitaxy layers and second epitaxy layers over a substrate to form a semiconductor stack and forming a first mask structure and a second mask structure over the semiconductor stack. The method further includes forming a first spacer on a first sidewall of the second mask structure and a second spacer on a second sidewall of the second mask structure and patterning the semiconductor stack through the first mask structure to form a first fin structure so that the first fin structure has a first width substantially equal to a width of the first mask structure. The method further includes patterning the semiconductor stack through the second mask structure, the first spacer, and the second spacer to form a second fin structure so that the second fin structure has a second width substantially equal to a sum of widths of the second mask structure, the first spacer, and the second spacer. The method further includes removing the first epitaxy layers of the first fin structure to form first nanostructures and removing the first epitaxy layers of the second fin structure to form second nanostructures and forming a first gate structure wrapping around the first nanostructures. The method further includes forming a second gate structure wrapping around the second nanostructures.

FIGS. 14A-1, 14B-1, 14C-1, 14D-1, 14E-1, 14F-1, 14G-1, 14H-1, 14I-1, 14J-1, 14K-1, and 14L-1 are perspective views of a method for manufacturing a first device region 20 in a semiconductor structure 300 at various stages in accordance with some embodiments of the present disclosure. FIGS. 14A-2, 14B-2, 14C-2, 14D-2, 14E-2, 14F-2, 14G-2, 14H-2, 14I-2, 14J-2, 14K-2, and 14L-2 are perspective views of a method for manufacturing a second device region 20' in the semiconductor structure 300 at various stages in accordance with some embodiments of the present disclosure. The process and materials used in forming the semiconductor structure 300 may be similar to, or the same as, those used in forming the structures shown in FIGS. 1 to 13B, which are described above and therefore not repeated herein. More specifically, similar elements in these figures are designated by the same numerals and can include the same or similar materials, and they can be formed by following the same or similar steps; therefore, such details are omitted in the interest of brevity.

Figures 1, 14A:
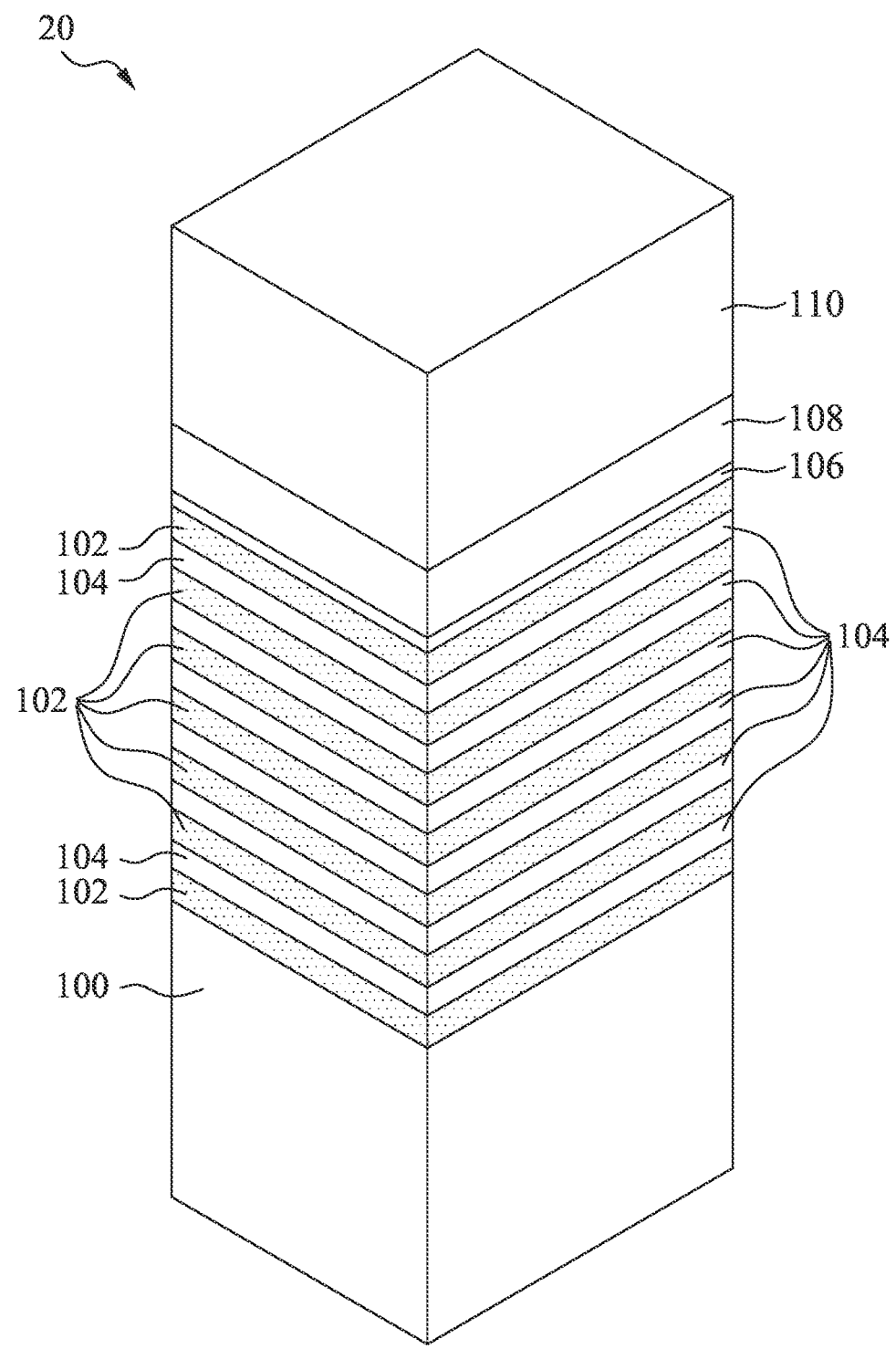
Figures 2, 14A:
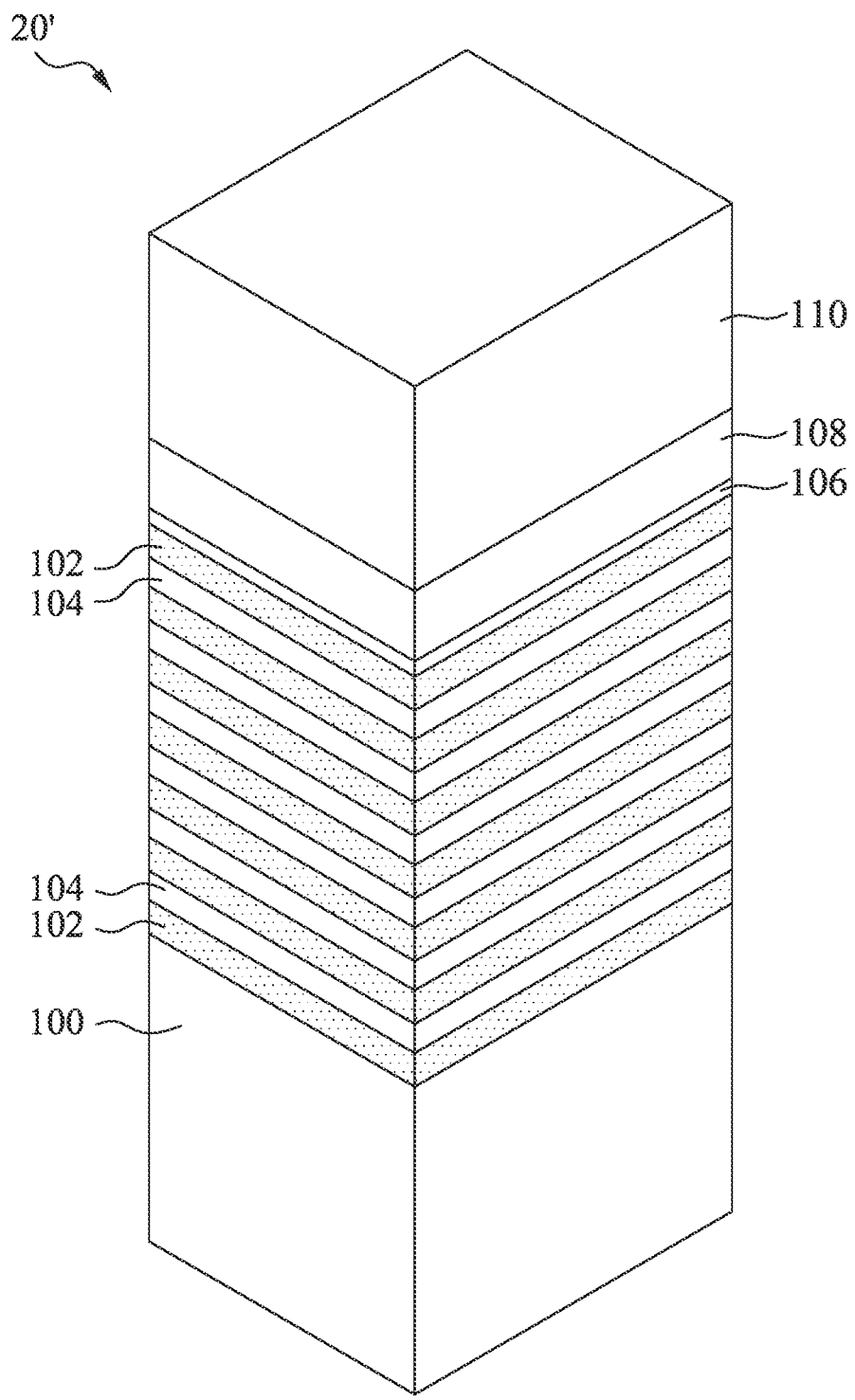

Similar to FIG. 1, a series of nano epitaxy layers 104 and sacrificial nano epitaxy layers 102 are alternately grown on the substrate 100 to form a semiconductor stack, and the pad oxide layer 106, the pad nitride layer 108, and the mask layer 110 are deposited over the semiconductor stack in both the first device region 20 and the second device region 20', as shown in FIGS. 14A-1 and 14A-2 in accordance with some embodiments.

In some embodiments, the number of sacrificial nano epitaxy layers 102 is the same as the number of nano epitaxy layers 104. In some embodiments, the number of nano epitaxy layers 104 is in a range from about 2 to about 10. In some embodiments, each of the sacrificial nano epitaxy layers 102 has the same thickness and each of the nano epitaxy layers 104 has the same thickness. In some embodiments, the sacrificial nano epitaxy layers 102 and the nano epitaxy layers 104 have different thicknesses. In some embodiments, each of the sacrificial nano epitaxy layers 102 has a thickness in a range from about 2 nm to about 10 nm. In some embodiments, each of the nano epitaxy layers 104 has a thickness in a range from about 3 nm to about 7 nm.

Figures 1, 14B:
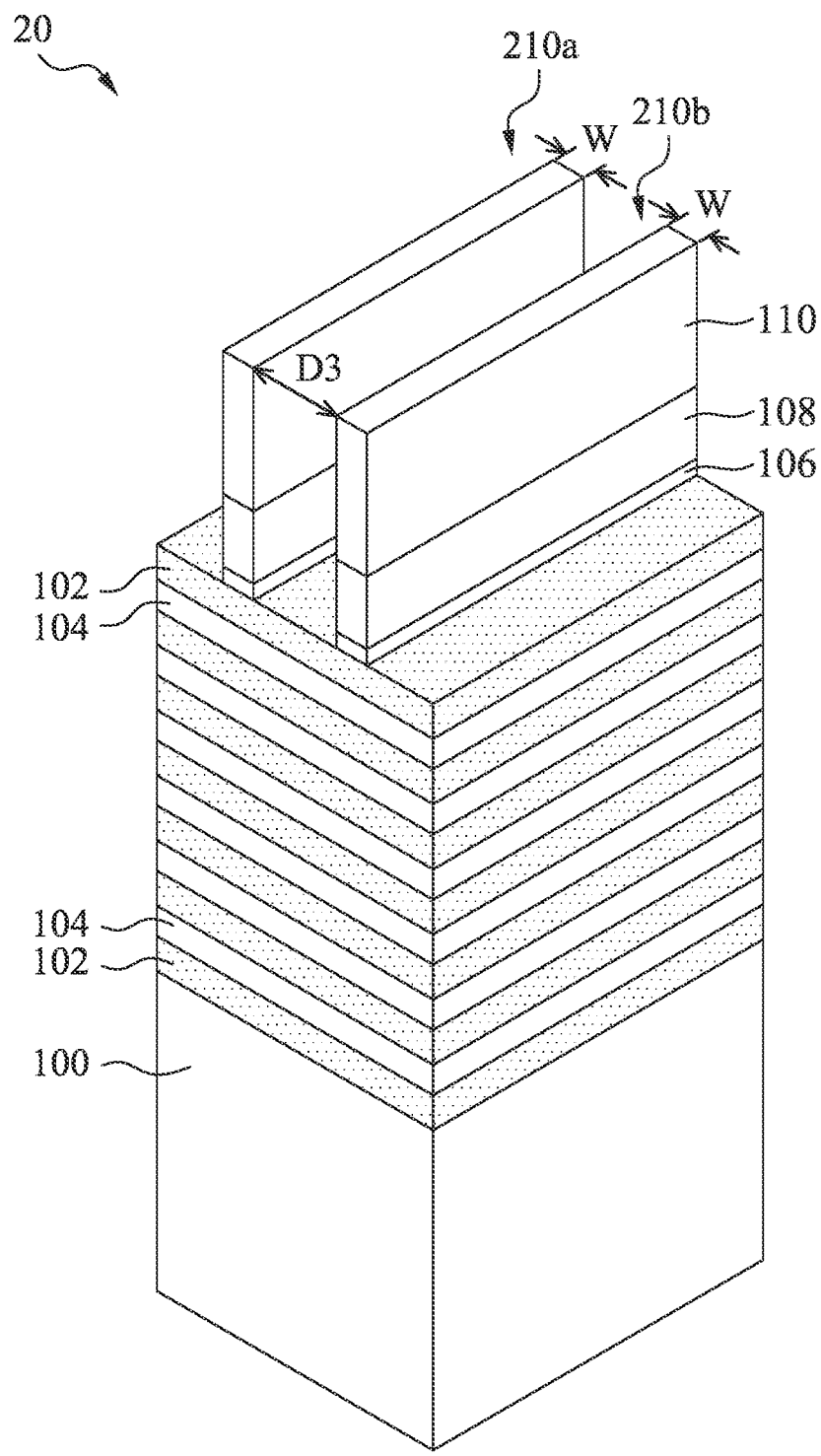
Figures 2, 14B:
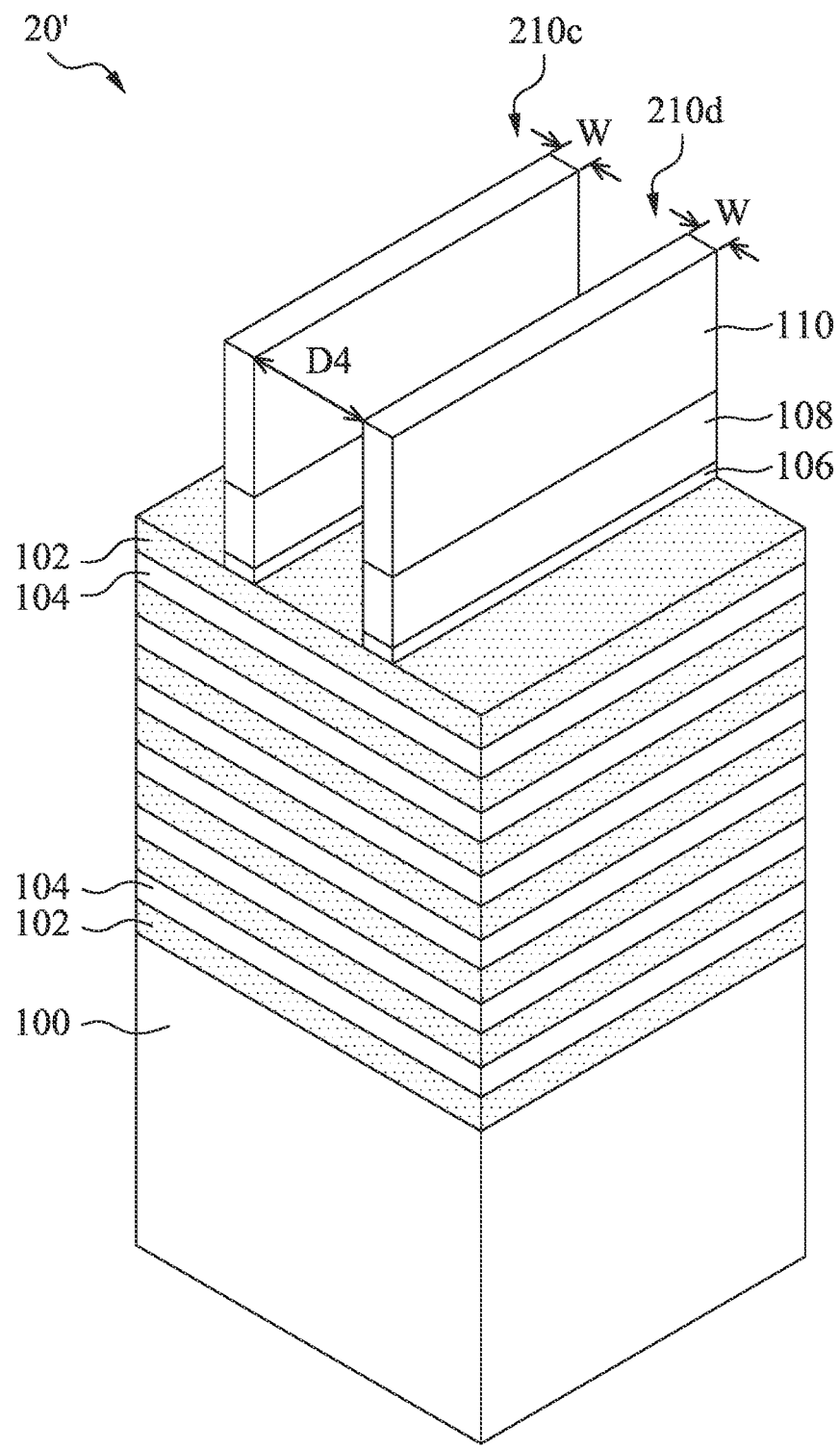

Next, the pad oxide layer 106, the pad nitride layer 108, and the mask layer 110 are patterned to form a first mask structure 210a and a second mask structure 210b in the first device region 20 and a third mask structure 210c and a fourth mask structure 210d in the second device region 20', as shown in FIGS. 14B-1 and 14B-2 in accordance with some embodiments. In some embodiments, the first mask structure 210a, the second mask structure 210b, the third mask structure 210c, and the fourth mask structure 210d have substantially the same width W. In some embodiments, the width W is in a range from about 3 nm to about 7 nm.

In some embodiments, the distance $D_3$ between the first mask structure 210a and the second mask structure 210b is shorter than the distance $D_4$ between the third mask structure 210c and the fourth mask structure 210d. The distance and the width of the mask structures may affect the performance of the resulting semiconductor structure 300 and the details will be described afterwards.

Figures 1, 14C:
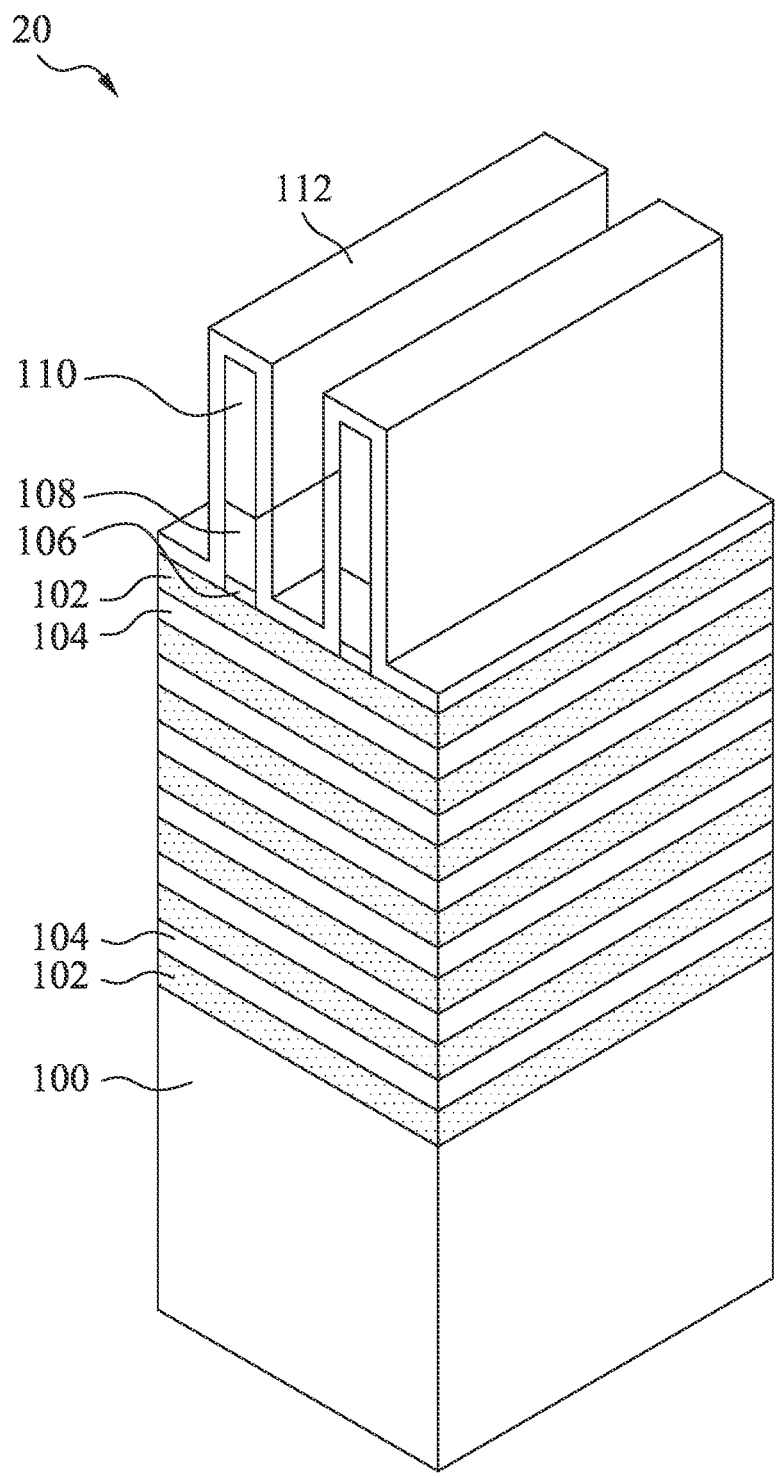
Figures 2, 14C:
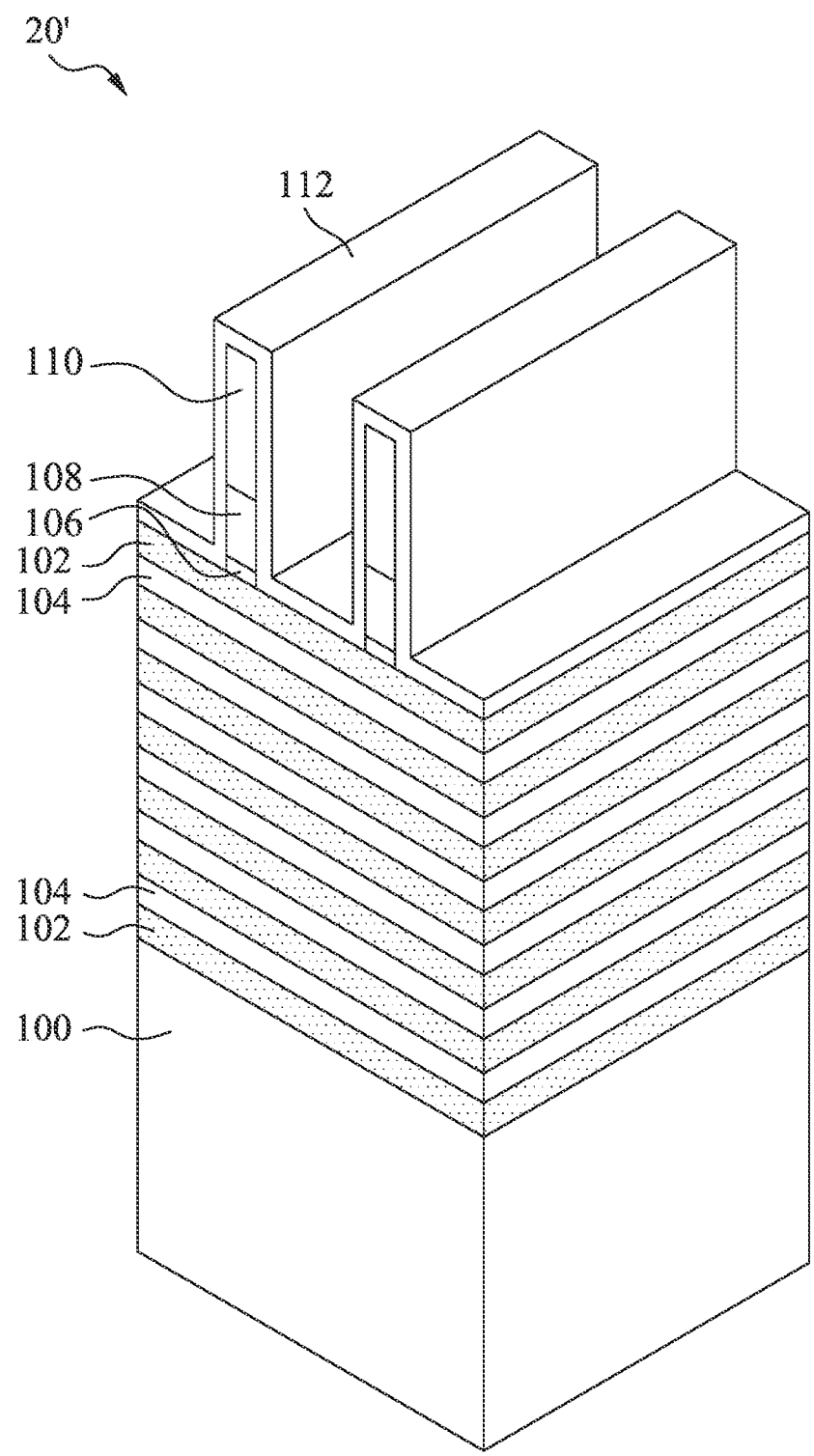

Next, the spacer cap layer 112 is conformally formed over the first mask structure 210a, the second mask structure 210b, the third mask structure 210c, and the fourth mask structure 210d and over the top surface of the semiconductor stack in both the first device region 20 and the second device region 20', as shown in FIGS. 14C-1 and 14C-2 in accordance with some embodiments.

Figures 1, 14D:
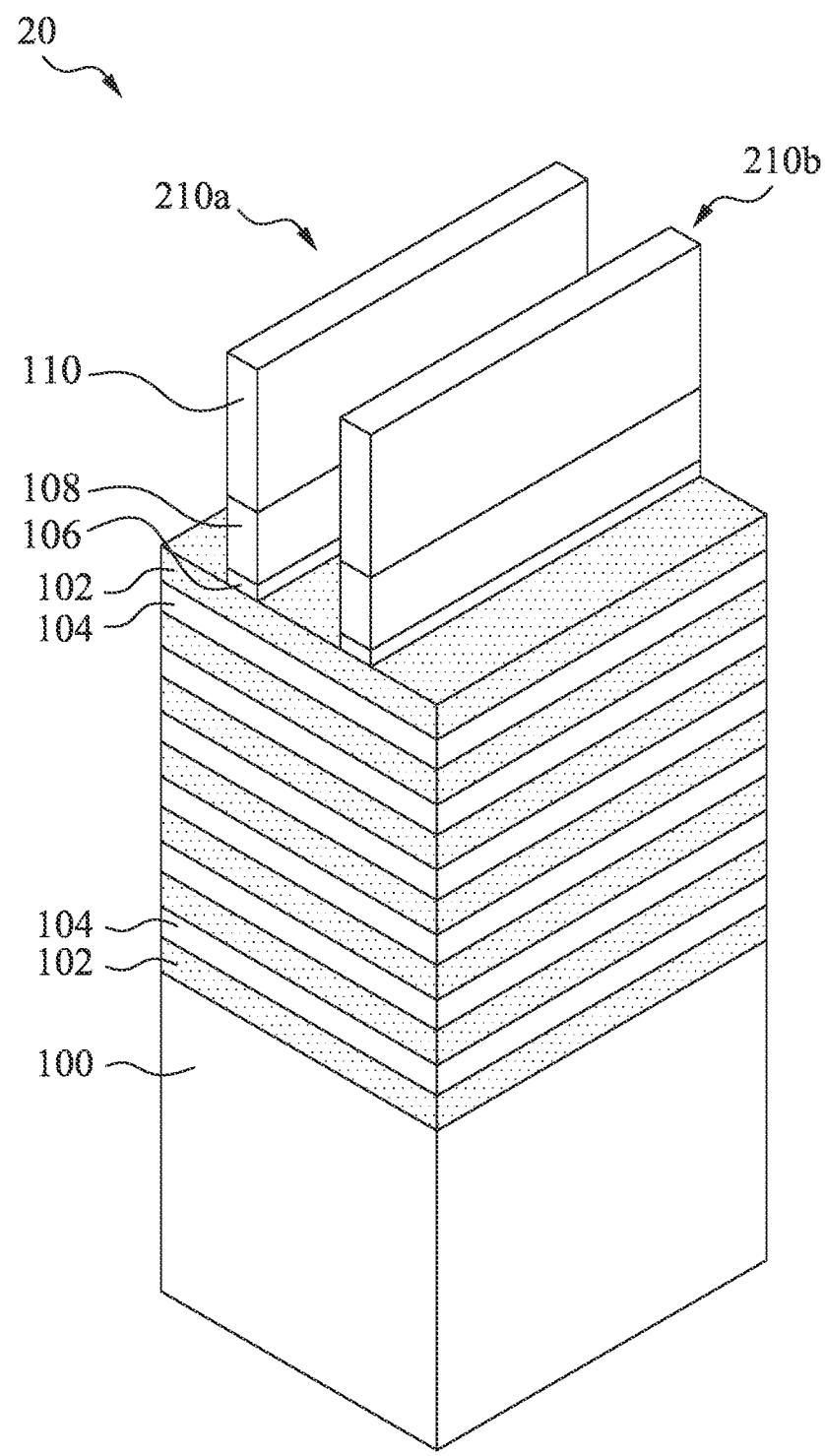
Figures 2, 14D:
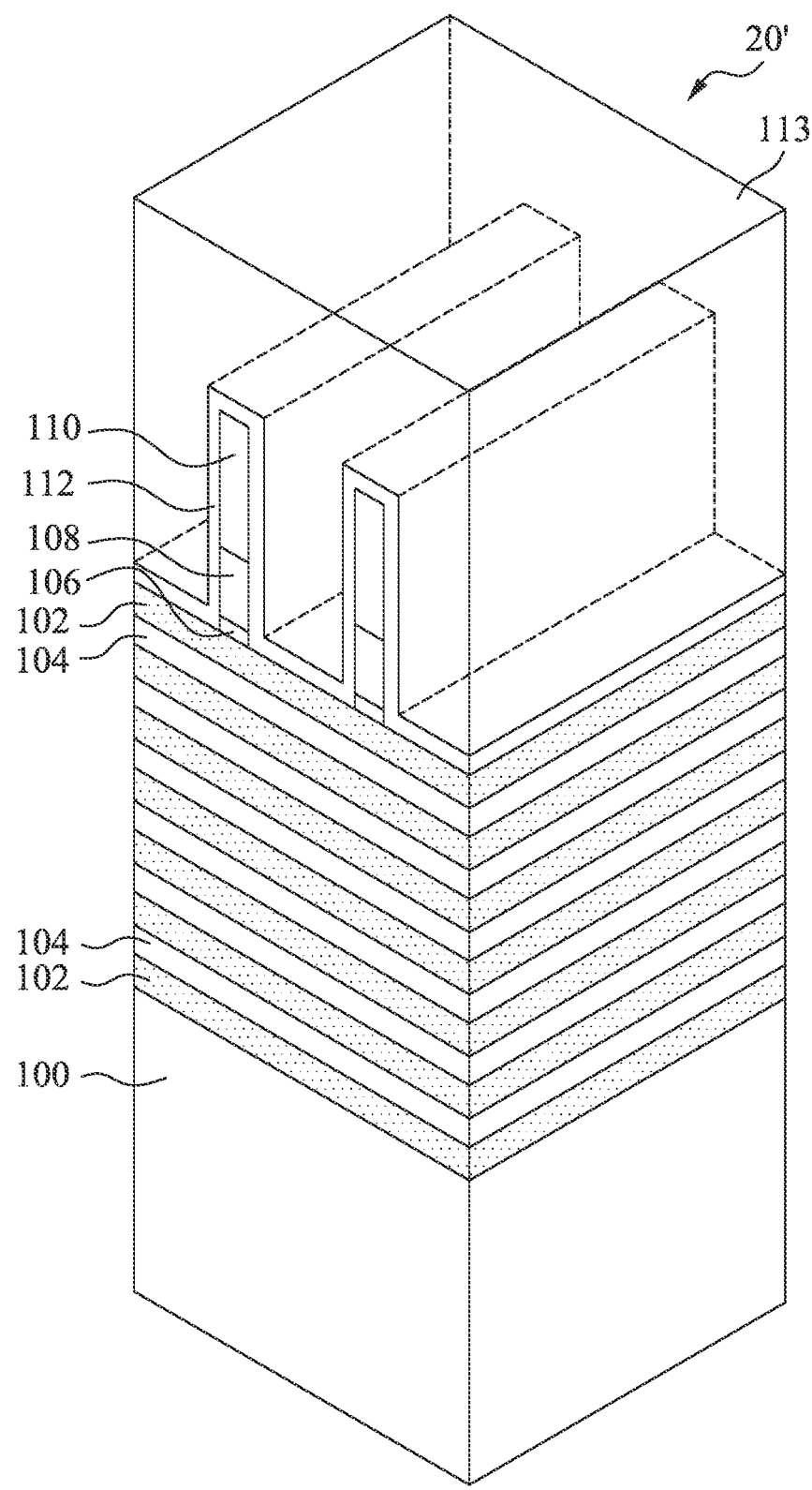

After the spacer cap layer 112 is formed, the photo resist layer 113 is formed over the second device region 20' as a mask structure, while exposing the first device region 20 in accordance with some embodiments. Next, the spacer cap layer 112 in the first device region 20 that is not covered by the photo resist layer 113 is removed to expose the first mask structure 210a and the second mask structure 210b, as shown in FIGS. 14D-1 and 14D-2 in accordance with some embodiments. In some embodiments, the spacer cap layer 112 in the first device region 20 is removed by performing an etching process.

Figures 1, 14E:
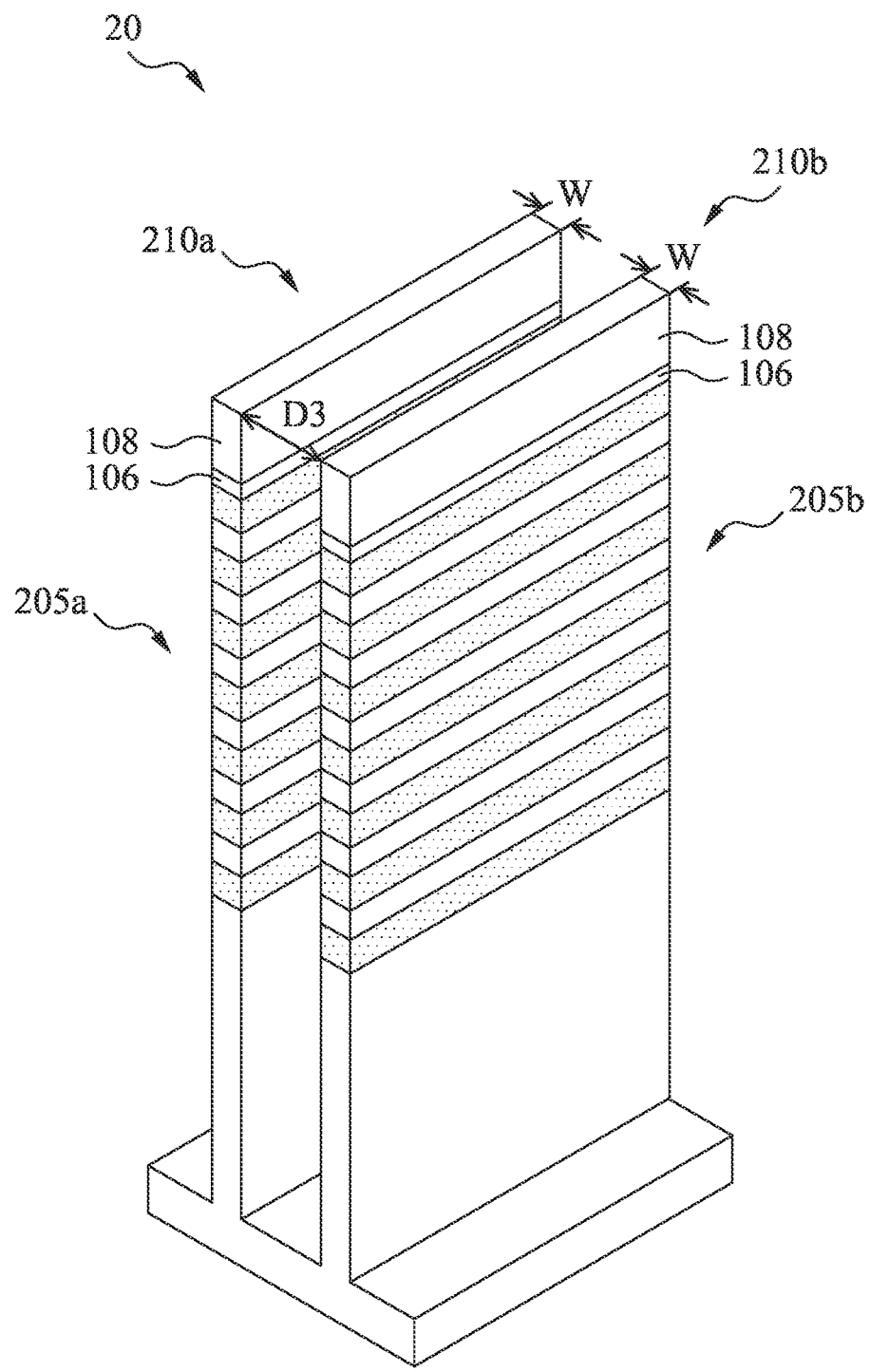
Figures 2, 14E:
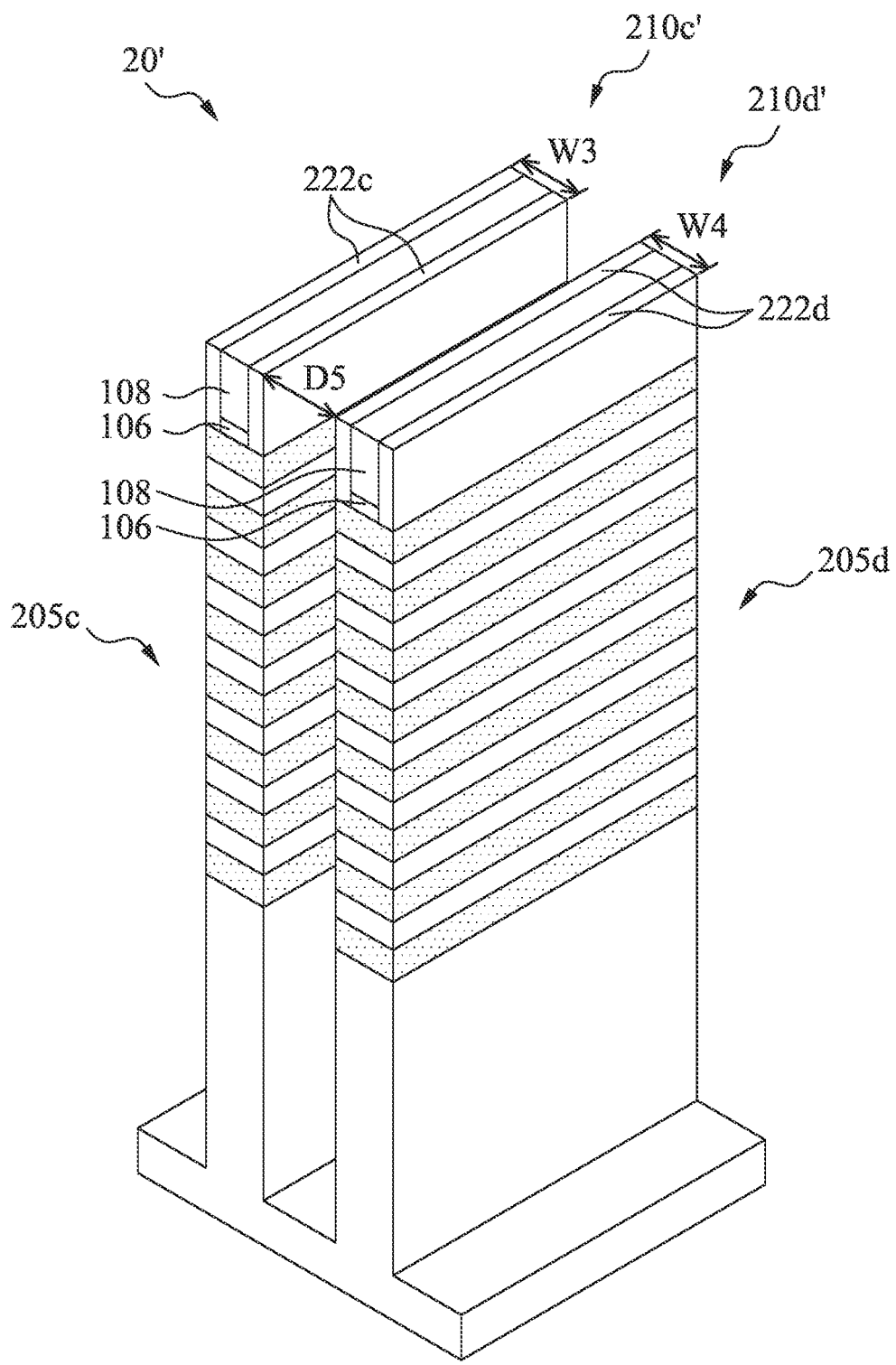

Afterwards, the photo resist layer 113 over the second device region 20' is removed and the remaining spacer cap layer 112 over the second device region 20' is etched, so that third spacers 222c are formed on the sidewalls of the third mask structure 210c to form a widened third mask structure 210c' and fourth spacers 222d are formed on the sidewalls of the fourth mask structure 210d to form a widened fourth mask structure 210d', as shown in FIGS. 14E-1 and 14E-2 in accordance with some embodiments. In some embodiments, the mask layers 110 are removed.

In some embodiments, the width $W_3$ of the widened third mask structure 210c' (i.e. the sum of the widths of the third mask structure 210c and the third spacers 222c) is substantially equal to the width $W_4$ of the widened fourth mask structure 210d' (i.e. the sum of the widths of the fourth mask structure 210d and the fourth spacers 222d). In some embodiments, the width $W_3$ of the widened third mask structure 210c' and the width $W_4$ of the widened fourth mask structure 210d' are in a range from about 8 nm to about 16 nm. In some embodiments, the ratio of the width $W_3$ of the widened third mask structure 210c' (or the width $W_4$ of the widened fourth mask structure 210d') to the width W of the first mask structure 210a (or the width W of the second mask structure 210b) is in a range from about 1.14 to about 5.3.

In some embodiments, the distance $D_3$ between the first mask structure 210a and the second mask structure 210b is shorter than the distance $D_5$ between the widened third mask structure 210c' and the widened fourth mask structure 210d'. In some embodiments, the ratio of the distance $D_5$ to the distance $D_3$ is in a range from about 1.15 to about 2. As described previously, the distance and the width of the mask structures may affect the performance of the resulting semiconductor structure 300 and the details will be described afterwards.

After the third spacers 222c and the fourth spacers 222d are formed, the semiconductor stack and the substrate 100 are patterned using the first mask structure 210a, the second mask structure 210b, the widened third mask structure 210c', and the widened fourth mask structure 210d' to form a first fin structure 205a, a second fin structure 205b, a third fin structure 205c, and a fourth fin structure 205d respectively, as shown in FIGS. 14E-1 and 14E-2 in accordance with some embodiments.

More specifically, the semiconductor stack and the substrate 100 not covered by the first mask structure 210a, the second mask structure 210b, the widened third mask structure 210c', and the widened fourth mask structure 210d' are etched to form recesses in accordance with some embodiments. As shown in FIG. 14E-1, the sidewalls of the first mask structure 210a are substantially aligned with the sidewalls of the first fin structures 205a, and the sidewalls of the second mask structure 210b are substantially aligned with the sidewalls of the second fin structures 205b in accordance with some embodiments. In some embodiments, the first fin structure 210a and the second fin structure 210b also have the width W, and the distance between the first fin structure 210a and the second fin structure 210b is substantially equal to the distance $D_3$.

Similarly, the sidewalls of the widened third mask structure 210c' are substantially aligned with the sidewalls of the third fin structures 205c, and the sidewalls of the widened fourth mask structure 210d' are substantially aligned with the sidewalls of the fourth fin structures 205d in accordance with some embodiments. In some embodiments, the third fin structure 210c and the fourth fin structure 210d also have the width $W_3$ and the width $W_4$ respectively, and the distance between the third fin structure 210c and the fourth fin structure 210d is substantially equal to the distance $D_4$.

Figures 1, 14F:
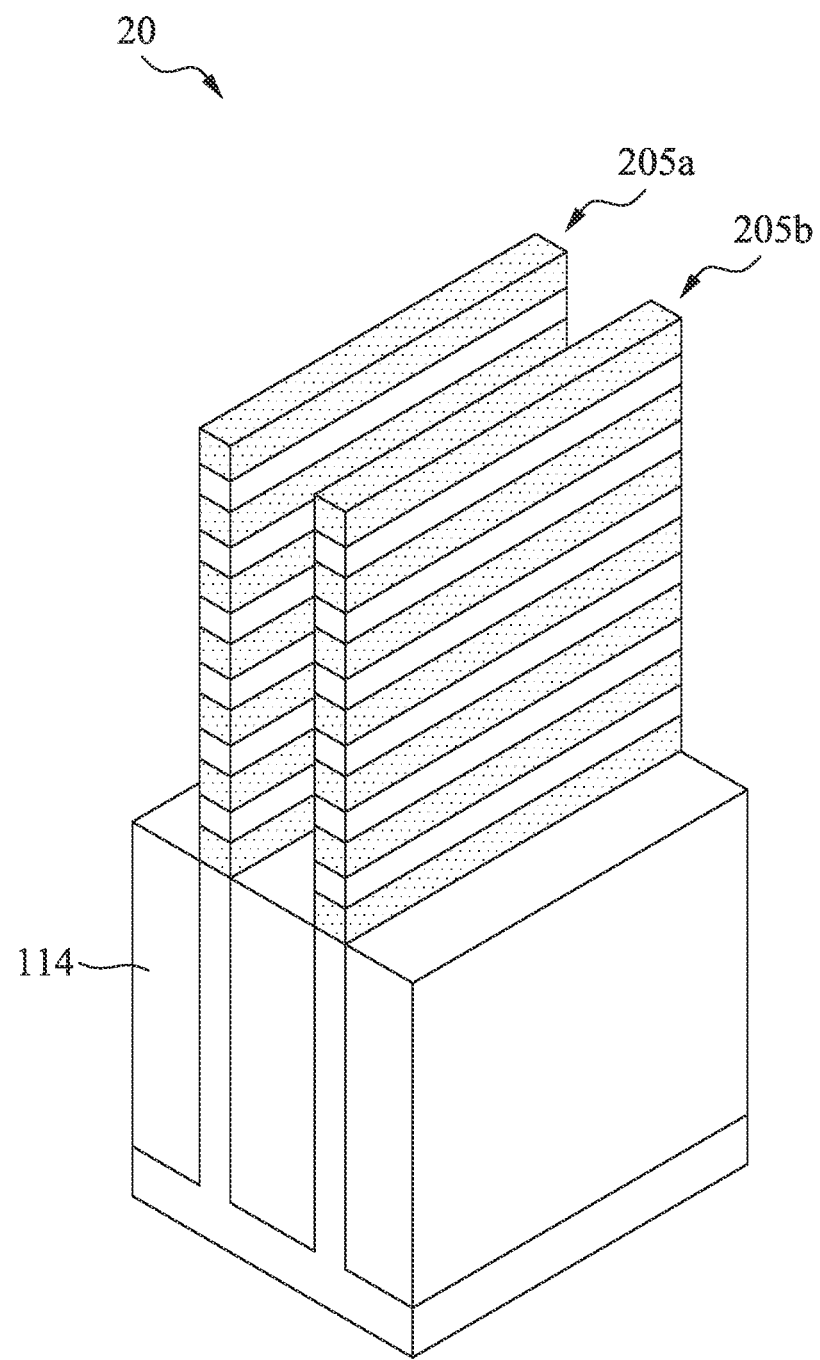
Figures 2, 14F:
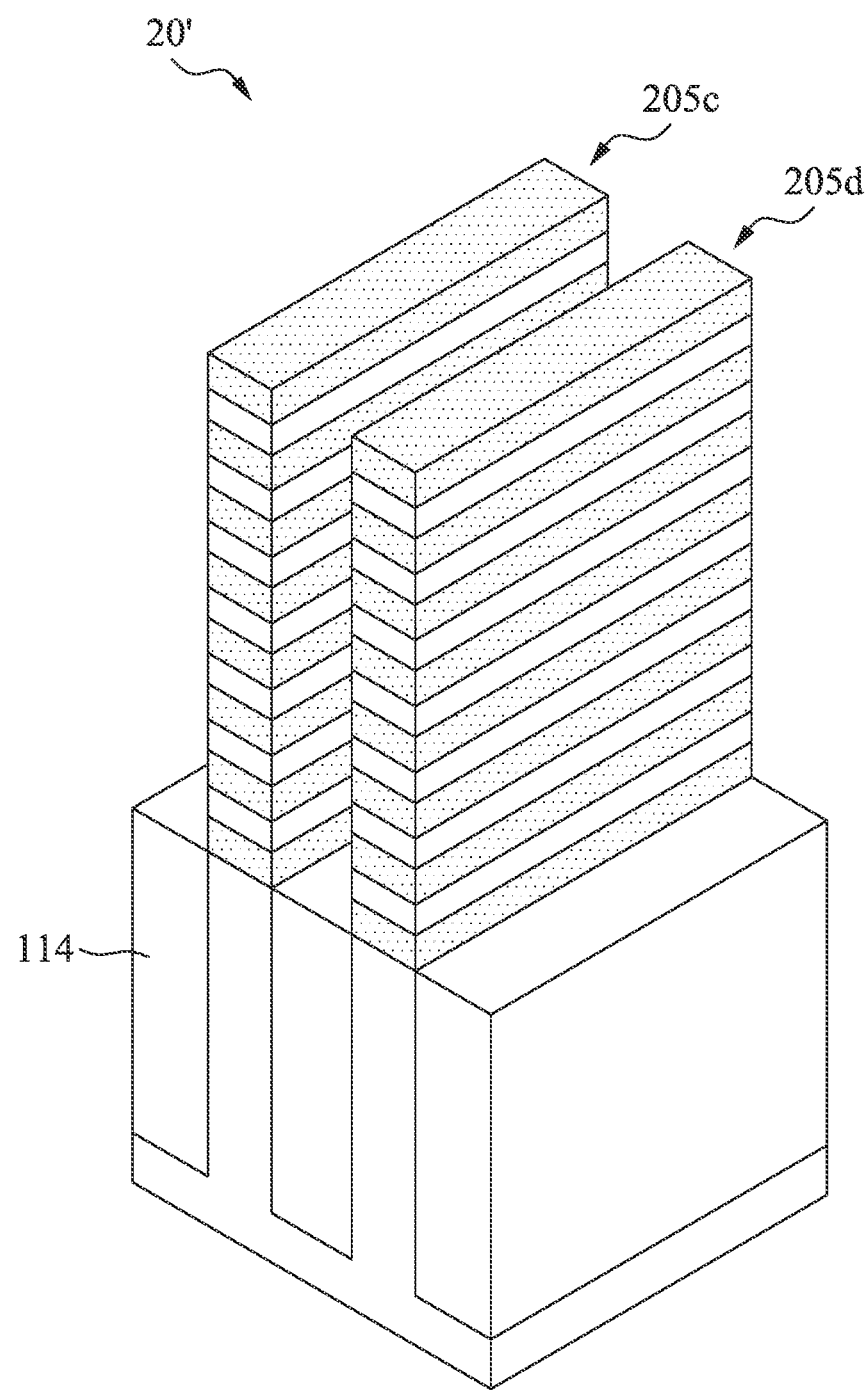

Next, the first mask structure 210a, the second mask structure 210b, the widened third mask structure 210c', and the widened fourth mask structure 210d' are removed, and the field oxide layer 114 is formed around the first fin structure 205a, the second fin structure 205b, the third fin structure 205c, and the fourth fin structure 205d to form a shallow trench isolation (STI), as shown in FIGS. 14F-1 and 14F-2 in accordance with some embodiments.

Figures 1, 14G:
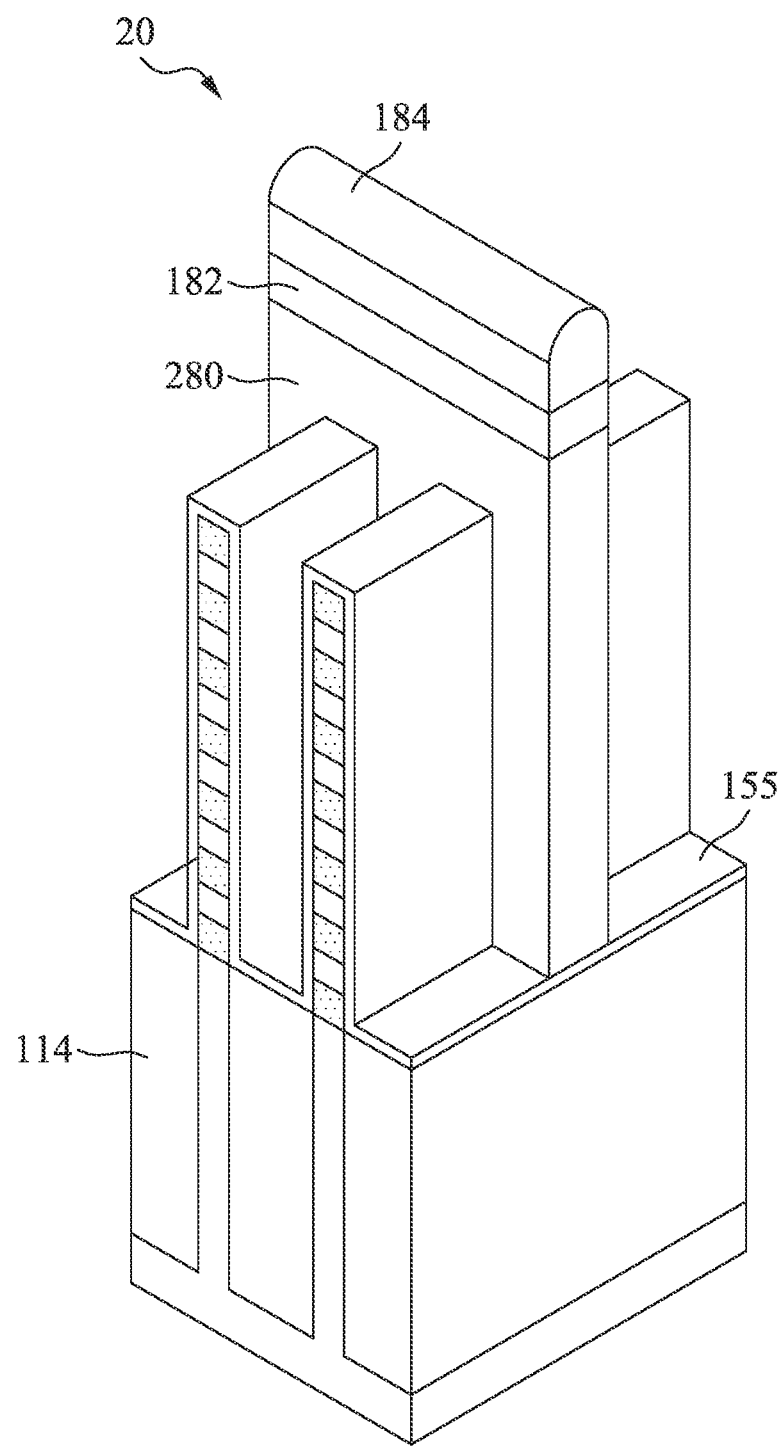
Figures 2, 14G:
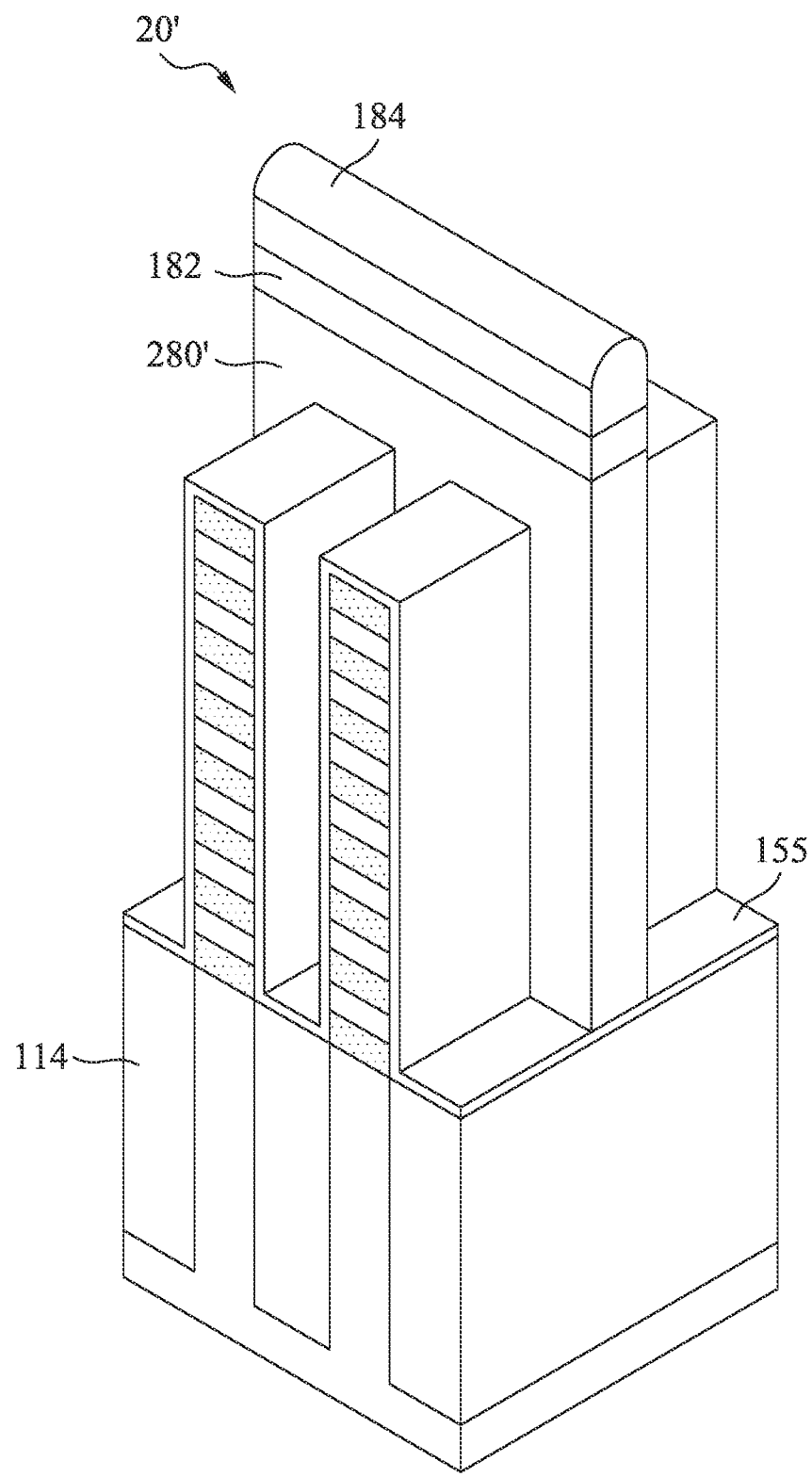

After the field oxide layer 114 is formed, the thin oxide layer 155 is formed over the field oxide layer 114 and over the first fin structure 205a, the second fin structure 205b, the third fin structure 205c, and the fourth fin structure 205d in accordance with some embodiments. Afterwards, a dummy gate 280 is formed across the first fin structure 205a and the second fin structure 205b and a dummy gate 280' is formed across the third fin structure 205c and the fourth fin structure 205d, as shown in FIGS. 14G-1 and 14G-2 in accordance with some embodiments. In some embodiments, the mask layers 182 and 184 are formed over the dummy gates 280 and 280'. Processes and materials for forming the dummy gates 280 and 280' may be similar to, or the same as, those for forming the dummy gates 180a and 180b described above and are not repeated herein.

Figures 1, 14H:
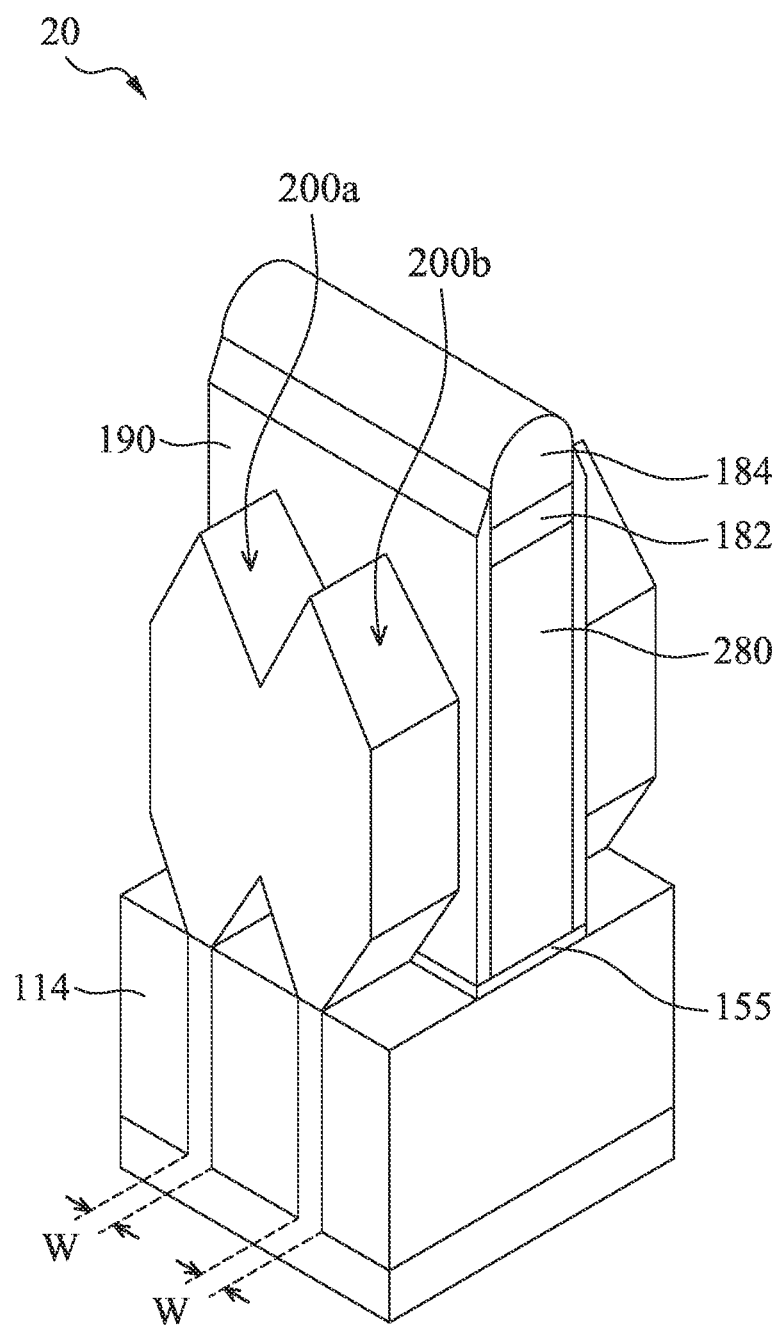
Figures 2, 14H:
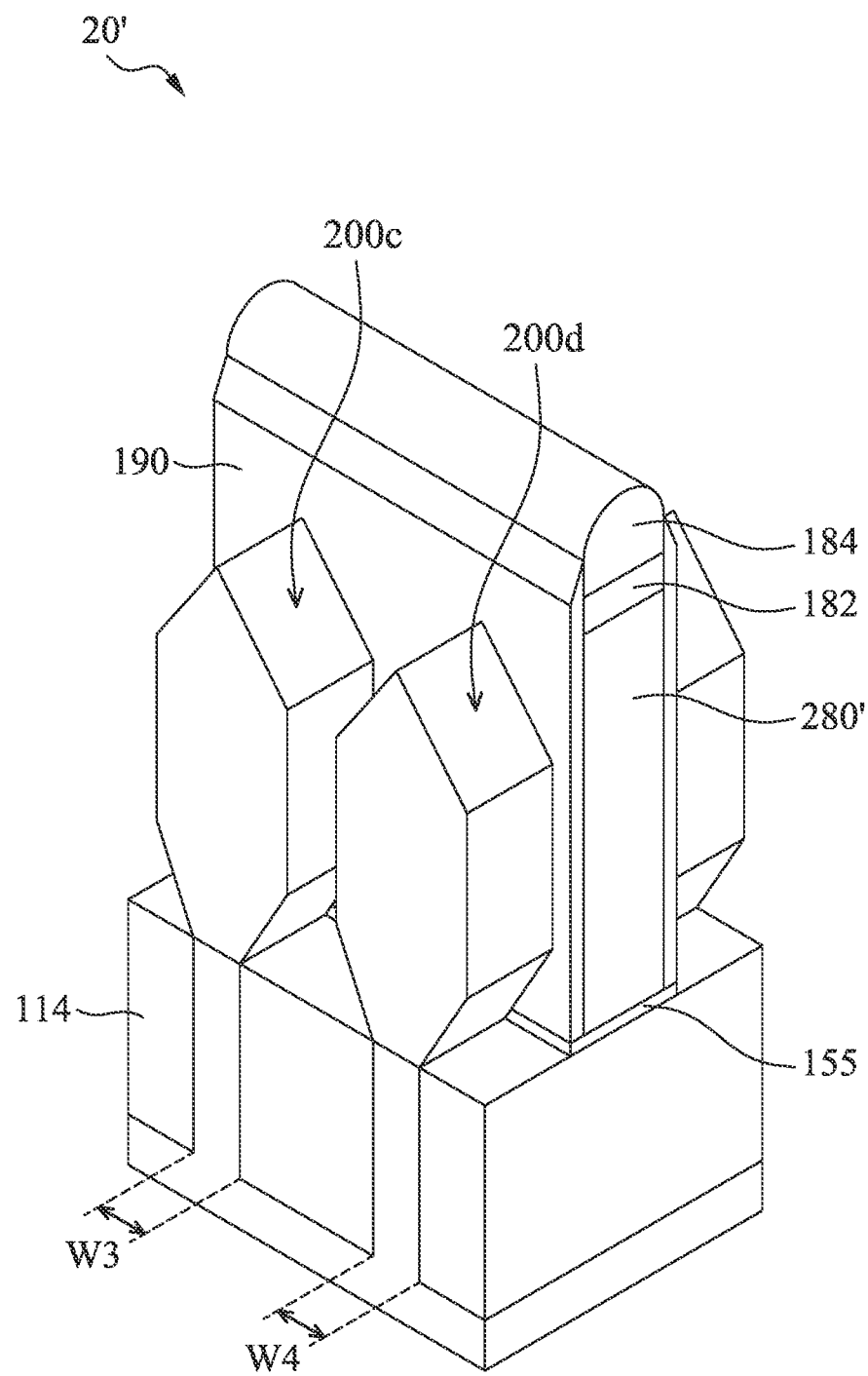

Next, the gate spacers 190 are formed on the sidewalls of the dummy gates 280 and 280', and the oxide layer 155 exposed from the dummy gates 280 and 280' and the gate spacers 190 are removed, as shown in FIGS. 14H-1 and 14H-2 in accordance with some embodiments. Afterwards, inner spacers and source/drain features are formed in the first fin structure 205a, the second fin structure 205b, the third fin structure 205c, and the fourth fin structure 205d, as shown in FIGS. 14H-1 and 14H-2 in accordance with some embodiments.

More specifically, the first fin structure 205a and the second fin structure 205b not covered by the dummy gates 280 and the spacers 190 are recessed to form first recesses in the first fin structure 205a and second recesses in the second fin structure 205b, and the inner spacers (not shown, similar to the inner spacers 192 shown in FIG. 9), first source/drain features 200a, and second source/drain features 200b are formed in the first recesses and the second recesses in accordance with some embodiments. In addition, the neighboring first source/drain feature 200a and the second source/drain feature 200b are merged into a large source/drain feature since the first fin structure 205a and the second fin structure 205b are relatively close to each other, as shown in FIG. 14H-1 in accordance with some embodiments.

Similarly, the third fin structure 205c and the fourth fin structure 205d not covered by the dummy gates 280' and the spacers 190 are recessed to form third recesses in the third fin structure 205c and fourth recesses in the fourth fin structure 205d, and the inner spacers (not shown, similar to the inner spacers 192 shown in FIG. 9), third source/drain features 200c, and fourth source/drain features 200d are formed in the third recesses and the fourth recesses in accordance with some embodiments. In addition, the neighboring third source/drain feature 200c is not in contact with the fourth source/drain feature 200d since the third fin structure 205c and the fourth fin structure 205d are relatively far from each other, as shown in FIG. 14H-2 in accordance with some embodiments. Processes and materials for forming the first, second, third, and fourth source/drain features 200a, 200b, 200c, and 200d may be similar to, or the same as, those for forming the source/drain features 200 described above and are not repeated herein.

Since the first source/drain feature 200a and the second source/drain feature 200b are merged to form a merged source/drain feature, the merged source/drain feature is wider than both the third source/drain feature 200c and the fourth source/drain feature 200d, although the third fin structure 205c and the fourth fin structure 205d are wider than the first fin structure 205a and the second fin structure 205b in accordance with some embodiments. In some embodiments, an air gap is formed between the merged source/drain feature and the isolation feature 114.

Figures 1, 14I:
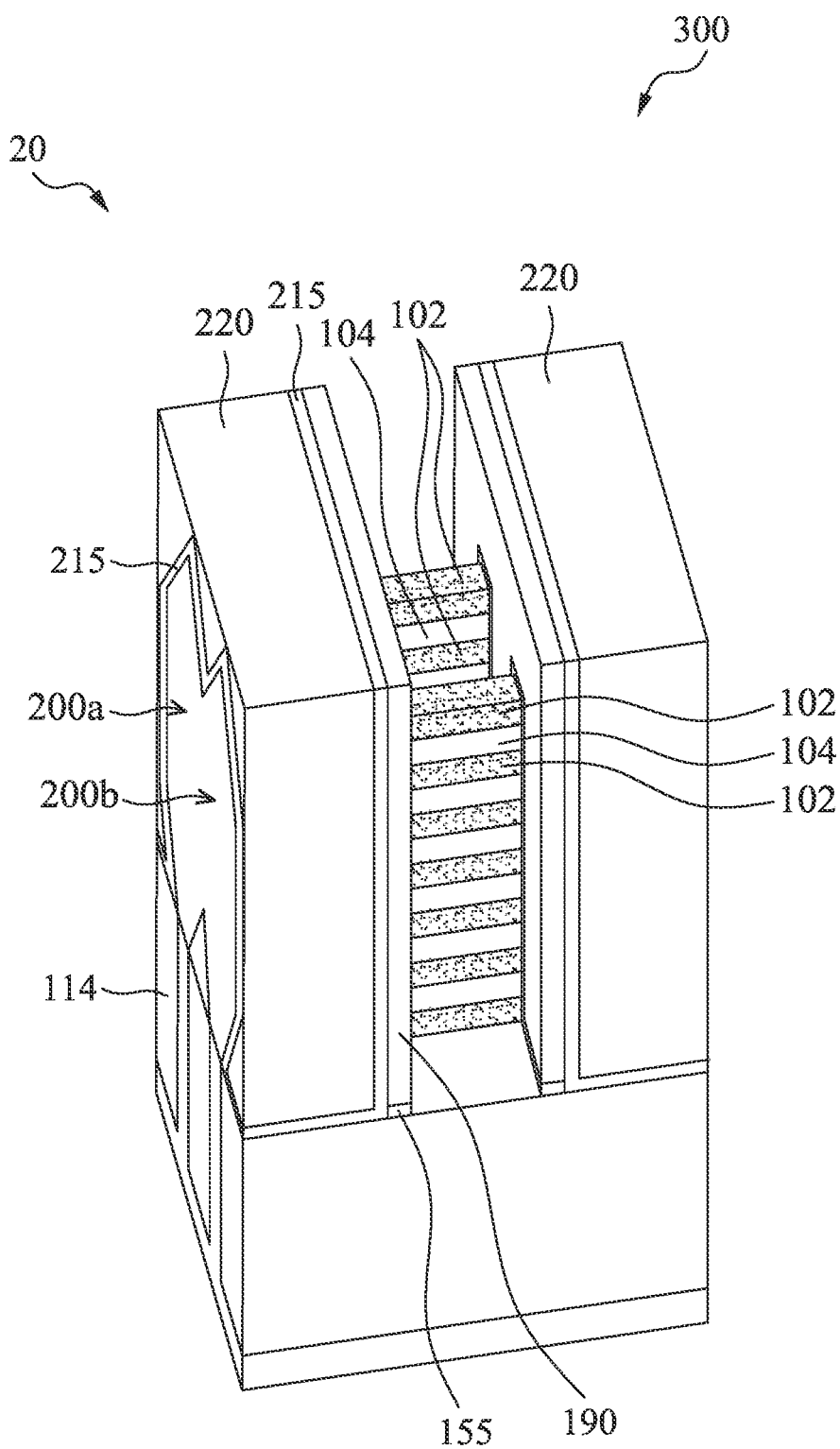
Figures 2, 14I:
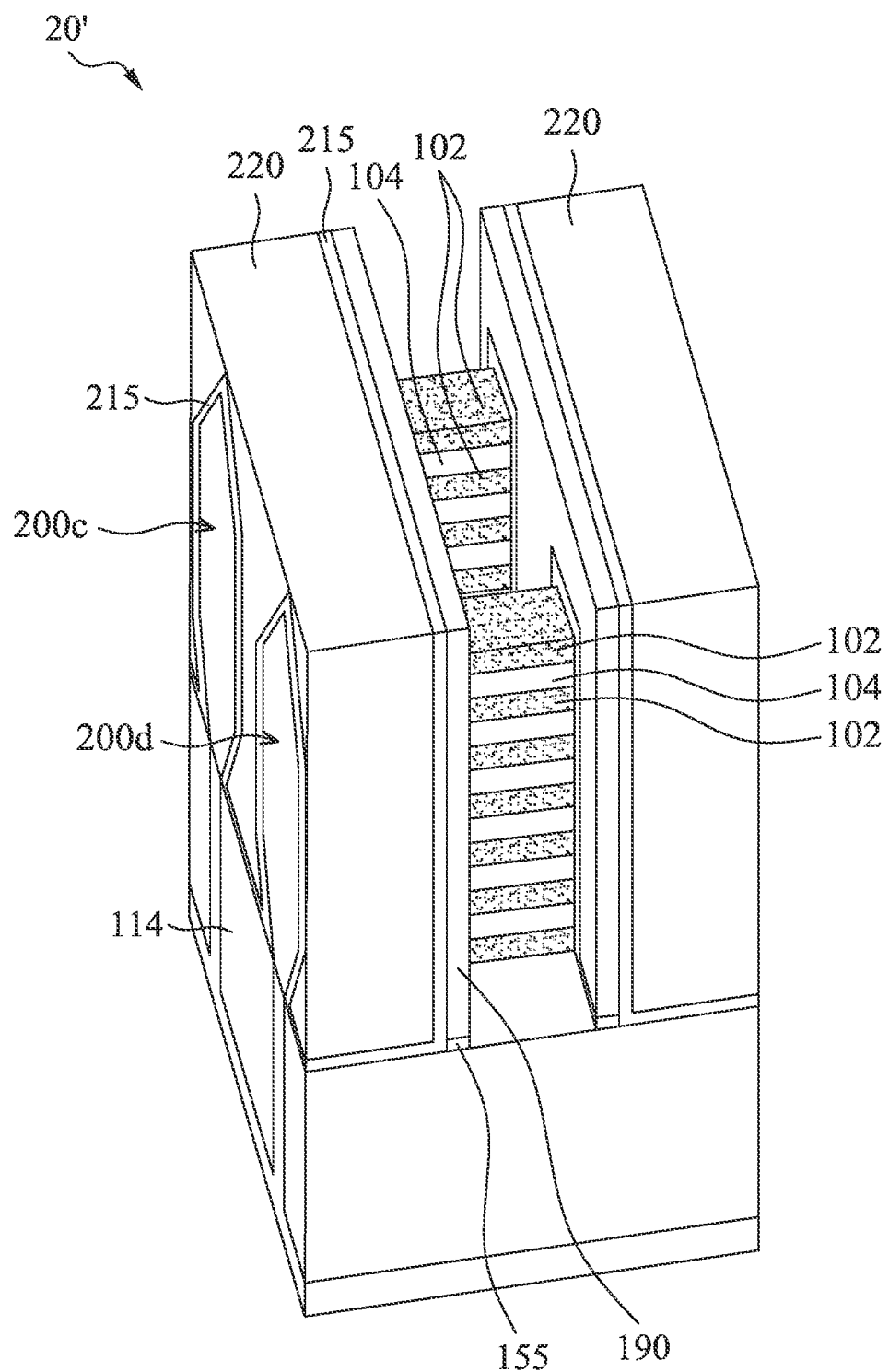

After the inner spacers and source/drain features are formed, the etching stop layer 215 and the interlayer dielectric 220 are formed over the first, second, third, and fourth source/drain features 200a, 200b, 200c, and 200d, as shown in FIGS. 14I-1 and 14I-2 in accordance with some embodiments. A CMP process may be performed to remove the excessive interlayer dielectric 220 and the mask layers 182 and 184.

Figures 1, 14J:
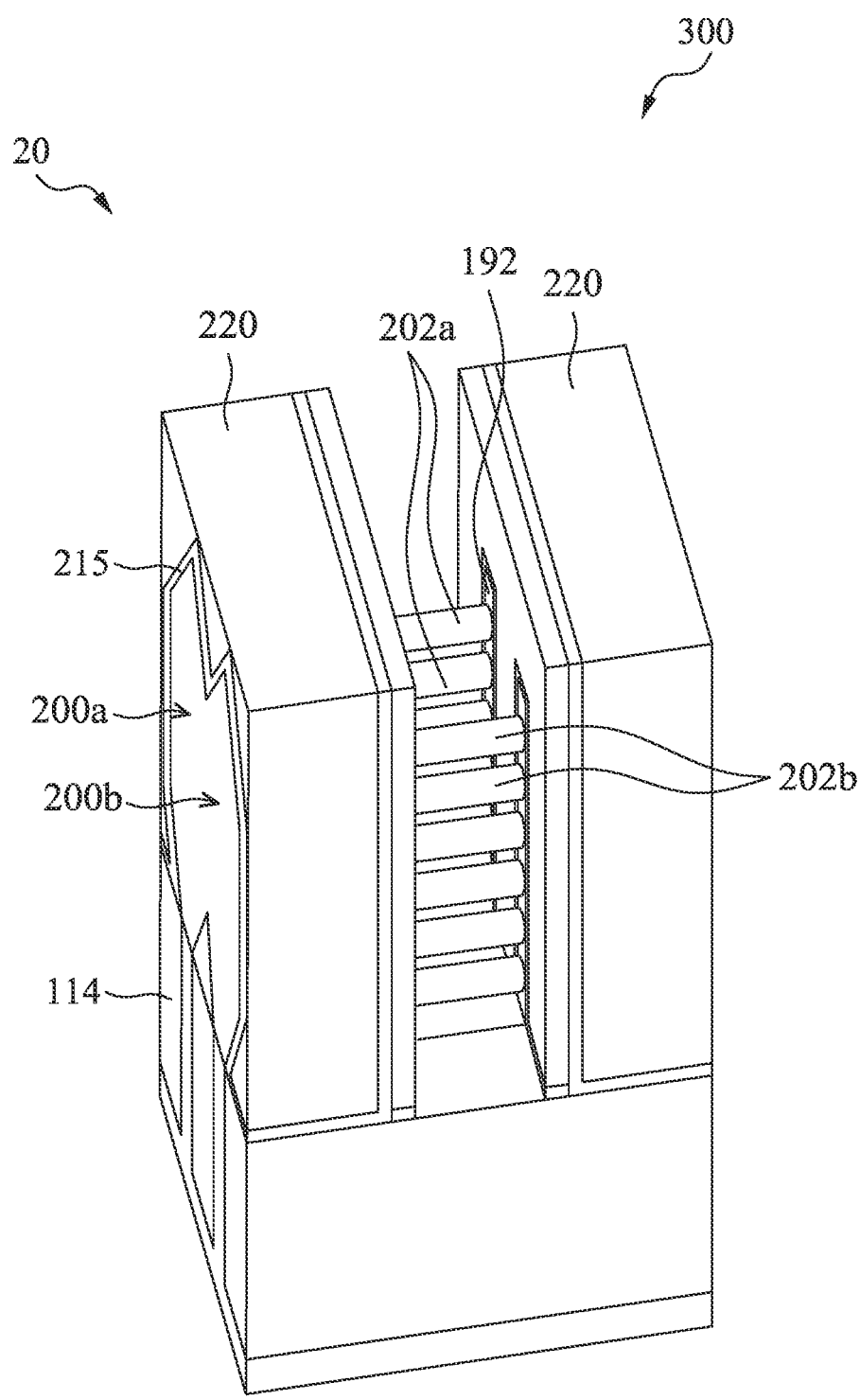
Figures 2, 14J:
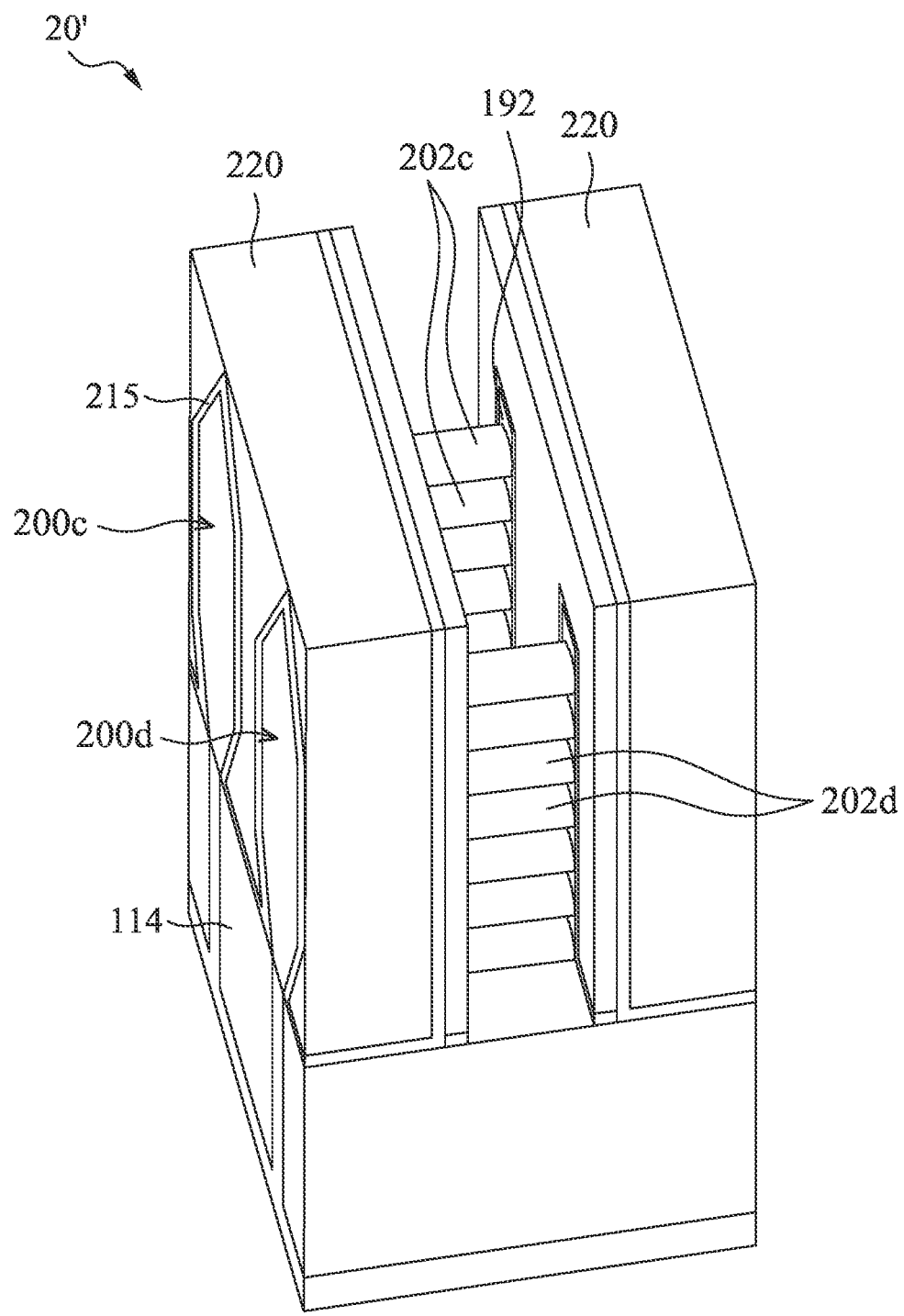

Next, the dummy gates 280 and 280' are removed to from gate trenches and the multiple alternatively stacked nano epitaxy layers 104 and sacrificial nano epitaxy layers 102 are exposed, as shown in FIGS. 14I-1 and 14I-2 in accordance with some embodiments. After the dummy gates 280 and 280' are removed, the sacrificial nano epitaxy layers 102 of the first fin structure 205a, the second fin structure 205b, the third fin structure 205c, and the fourth fin structure 205d exposed by the gate trenches are removed to form first nanostructures 204a, second nanostructures 204b, third nanostructures 204c, and fourth nanostructures 204d, as shown in FIGS. 14J-1 and 14J-2 in accordance with some embodiments.

Figures 1, 14K:
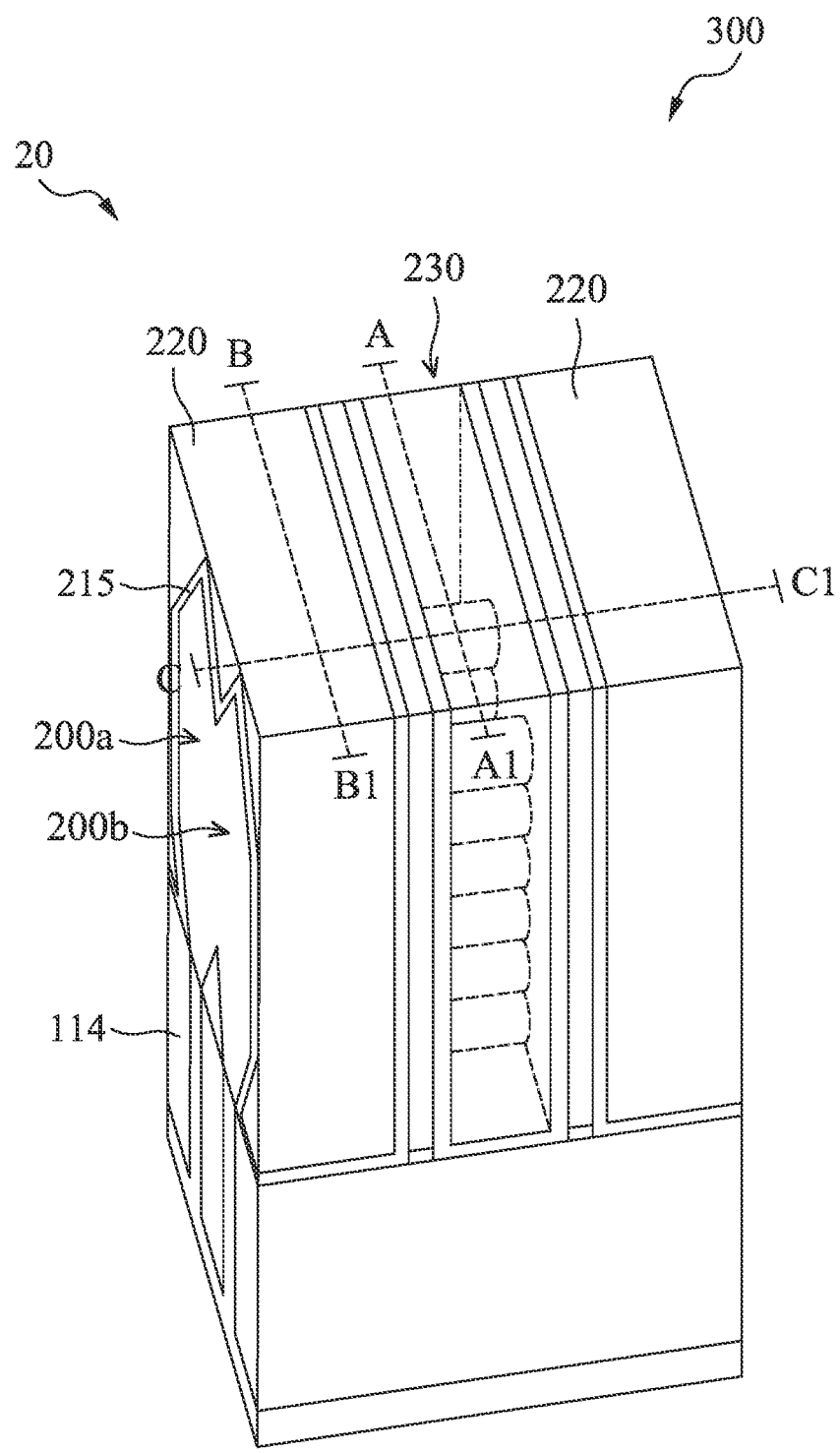
Figures 2, 14K:
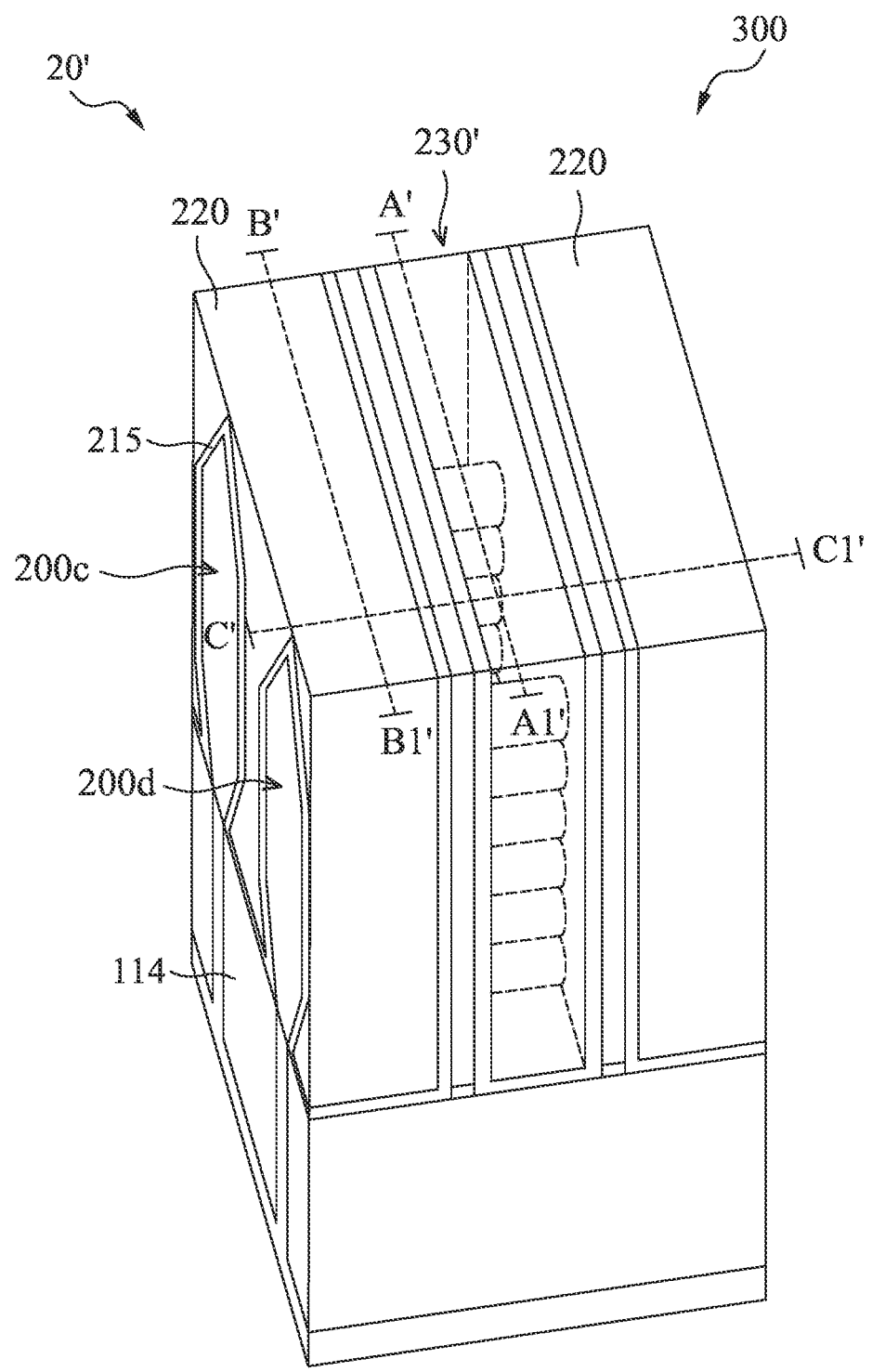

After the first nanostructures 204a, the second nanostructures 204b, the third nanostructures 204c, and the fourth nanostructures 204d are formed, the gate structure 230 is formed in the first device region 20 and a gate structure 230' is formed in the second device region 20', as shown in FIGS. 14K-1 and 14K-2 in accordance with some embodiments. More specifically, the gate structure 230 wraps around the first nanostructures 204a and the second nanostructures 204b, and the gate structure 230' wraps around the third nanostructures 204c and the fourth nanostructures 204d in accordance with some embodiments.

Figures 1, 15:
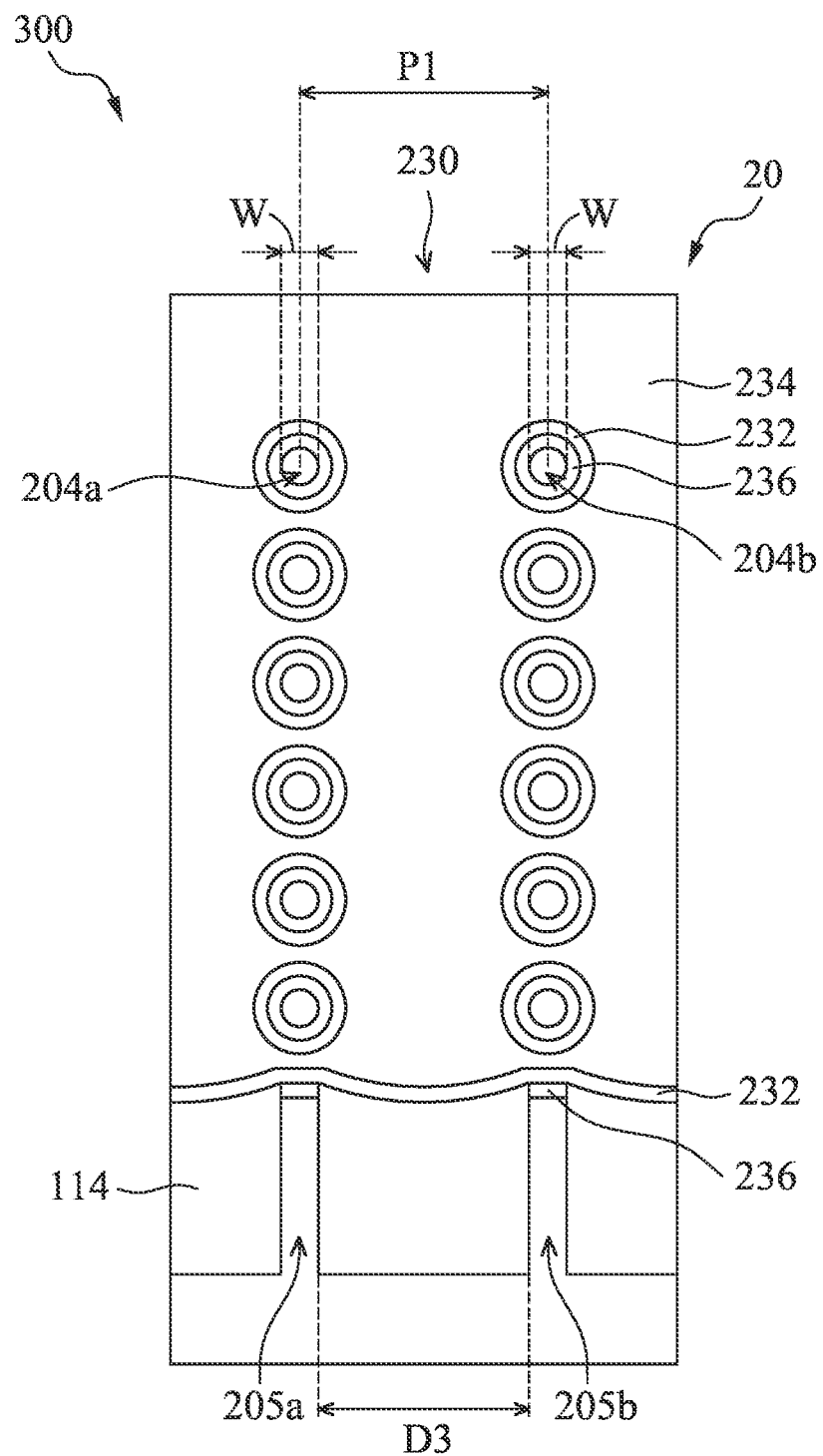
Figures 2, 15:
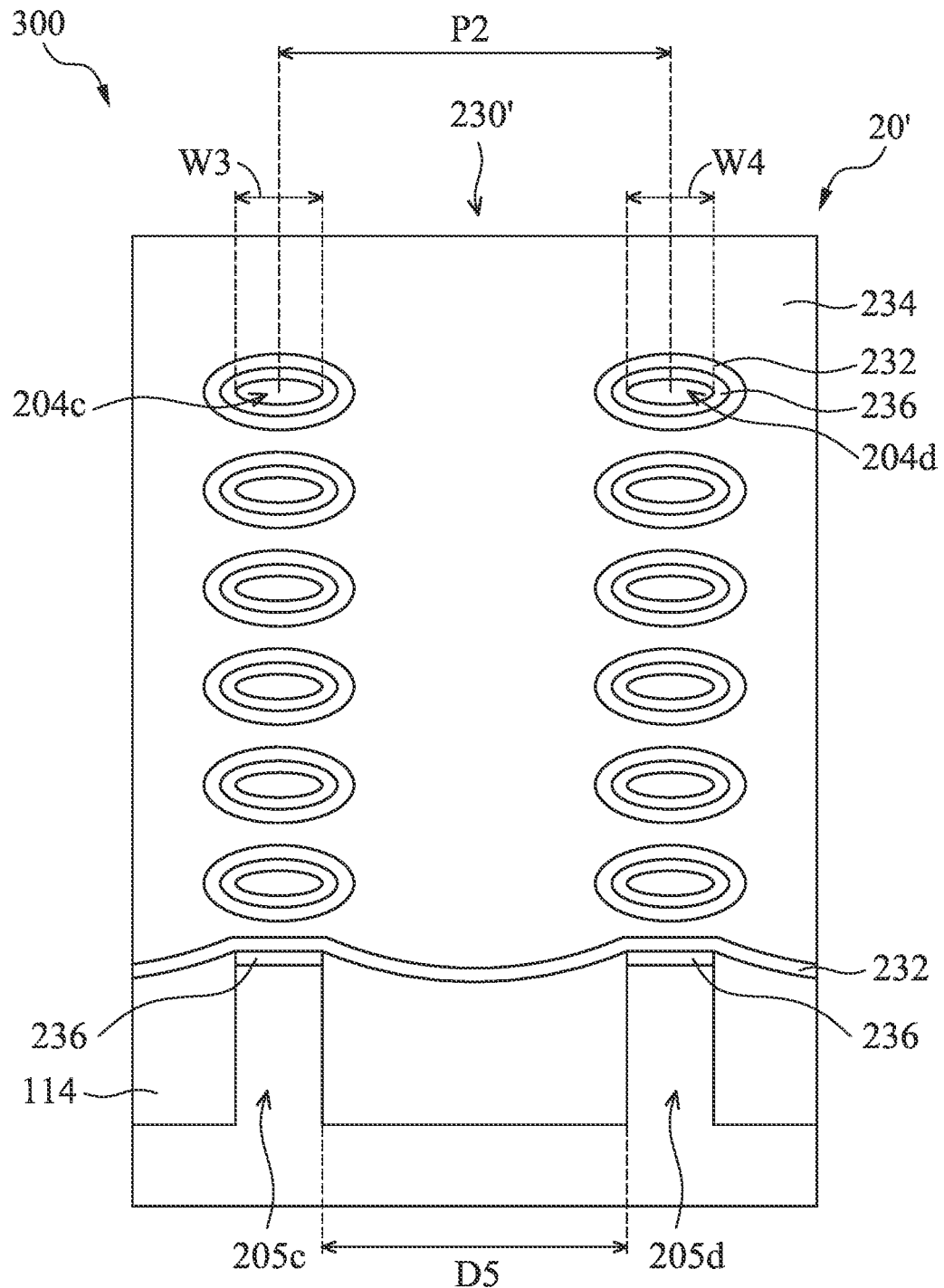
Figures 1, 16:
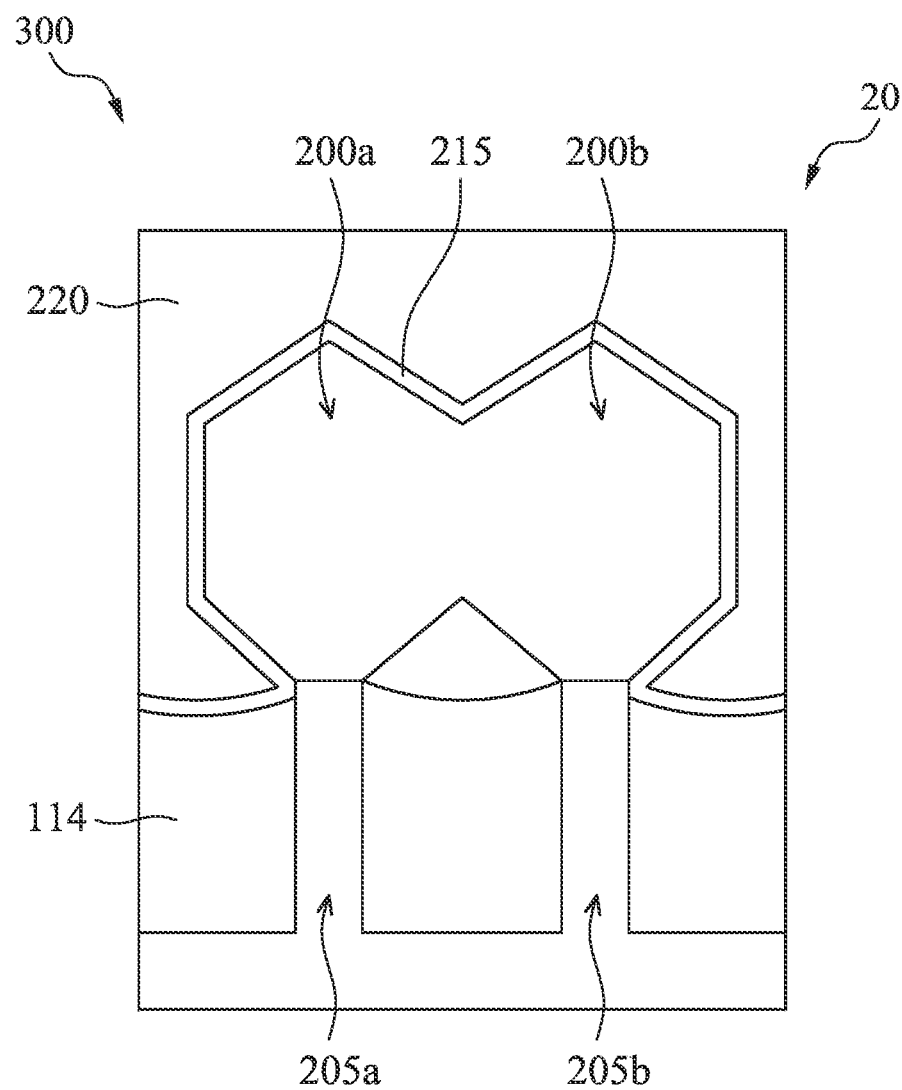
Figures 2, 16:
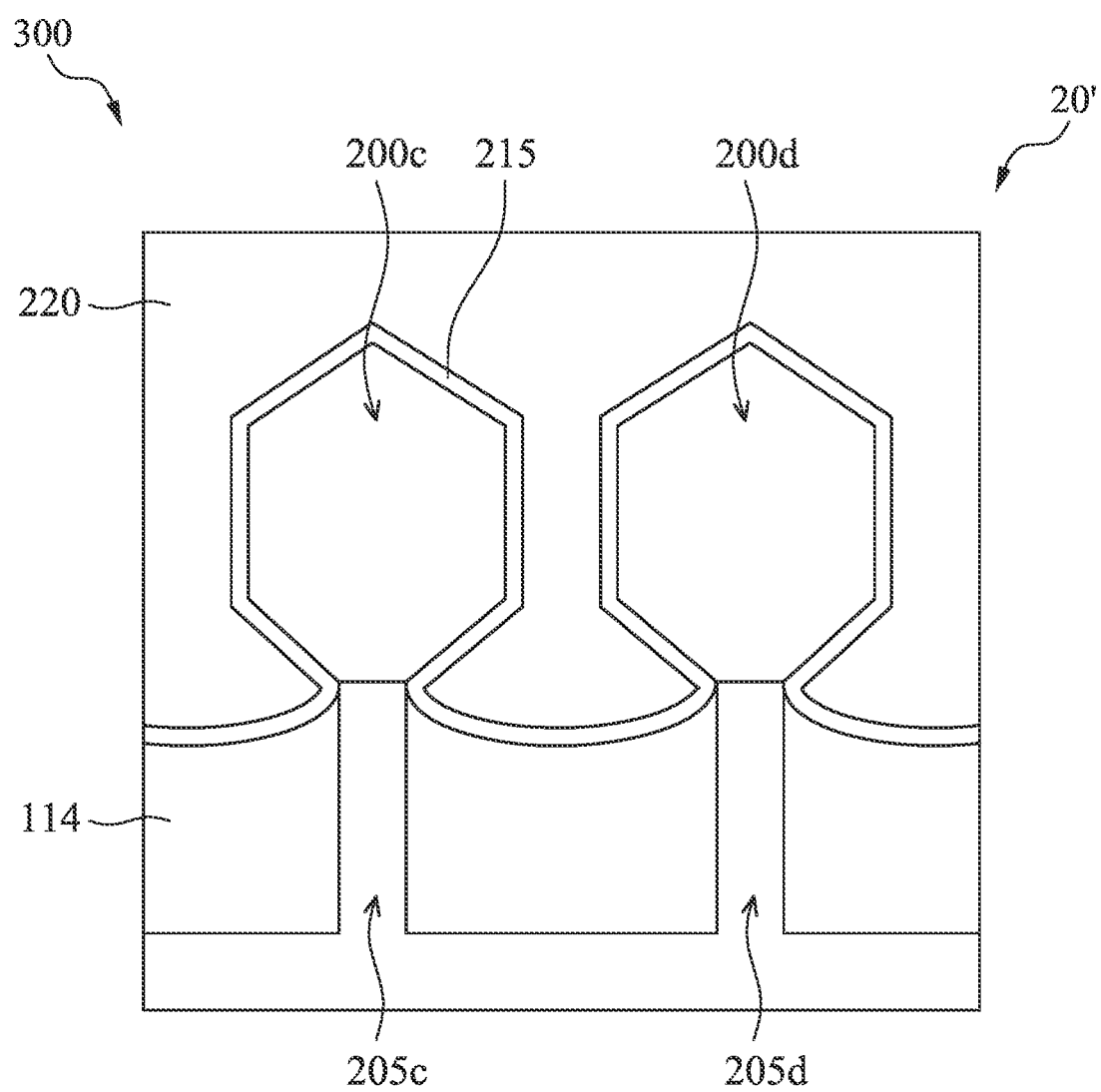
Figures 1, 17:
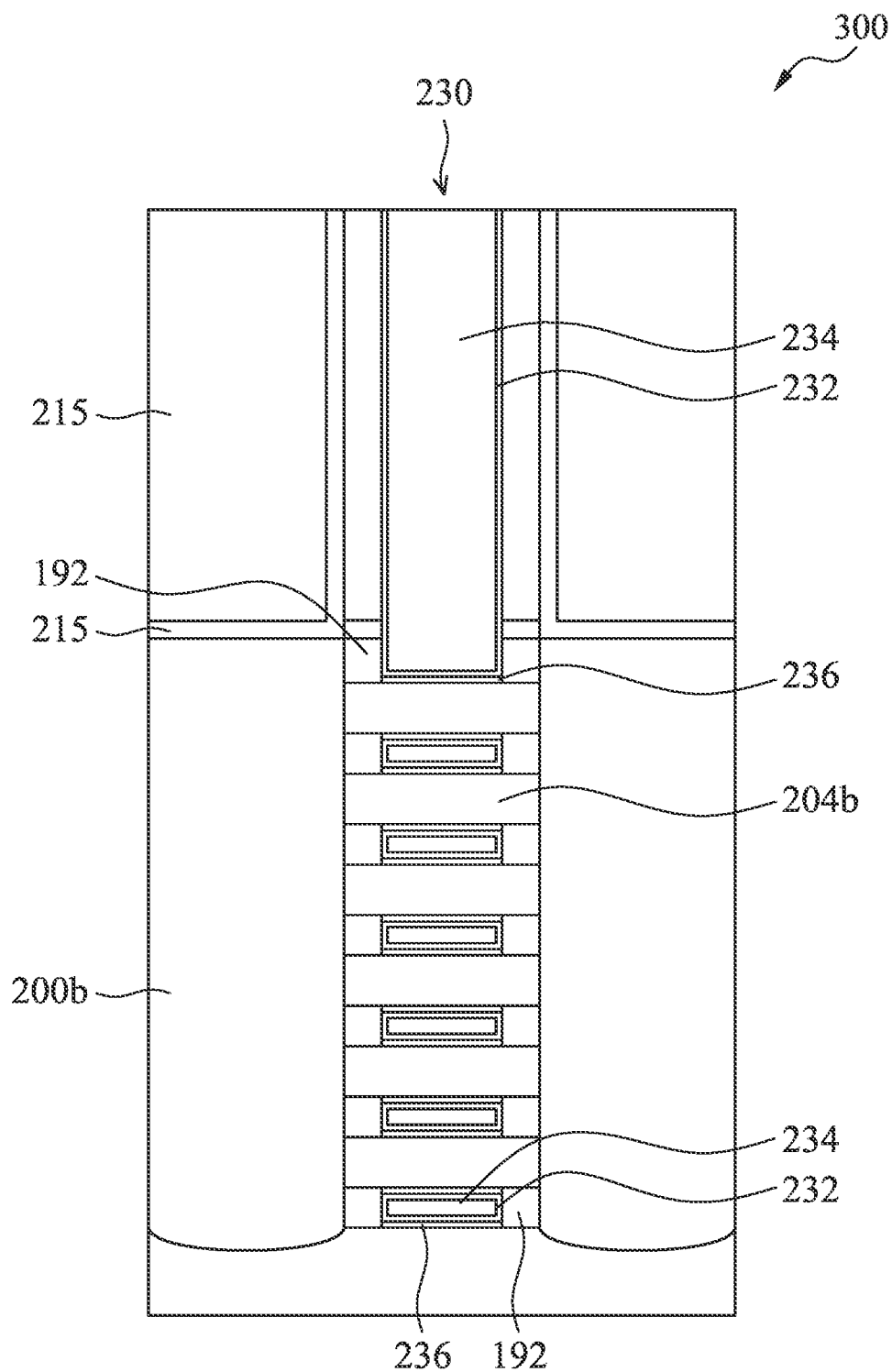
Figures 2, 17:
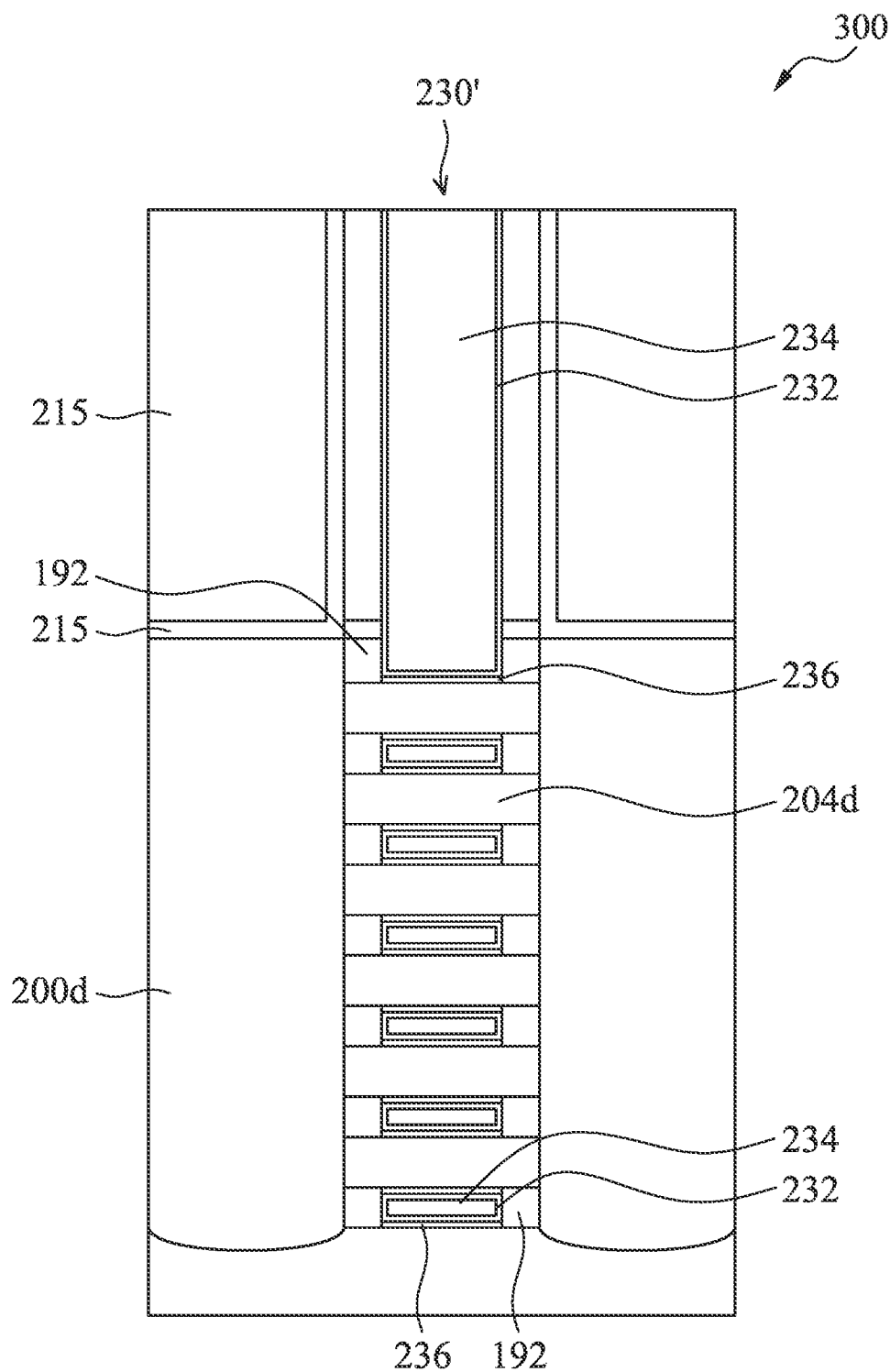

FIG. 15-1 illustrates a cross-sectional view of the semiconductor structure 300 taken along a cross-sectional line A-A$_1$ shown in FIG. 14K-1 in accordance with some embodiments. FIG. 15-2 illustrates a cross-sectional view of the semiconductor structure 300 taken along a cross-sectional line A'-A$_1$' shown in FIG. 14K-2 in accordance with some embodiments. FIG. 16-1 illustrates a cross-sectional view of the semiconductor structure 300 taken along a cross-sectional line B-B$_1$ shown in FIG. 14K-1 in accordance with some embodiments. FIG. 16-2 illustrates a cross-sectional view of the semiconductor structure 300 taken along a cross-sectional line B'-B$_1$' shown in FIG. 14K-2 in accordance with some embodiments. FIG. 17-1 illustrates a cross-sectional view of the semiconductor structure 300 taken along a cross-sectional line C-C$_1$ shown in FIG. 14K-1 in accordance with some embodiments. FIG. 17-2 illustrates a cross-sectional view of the semiconductor structure 300 taken along a cross-sectional line C'-C$_1$' shown in FIG. 14K-2 in accordance with some embodiments.

In some embodiments, both the gate structures 230 and 230' include an interfacial layer 236, gate dielectrics 232 formed over the interfacial layer 236, and gate metals 234 formed over the gate dielectrics 232.

As described above, since the first nanostructures 204a and the second nanostructures 204b are patterned through the first mask structure 210a and the second mask structure 210b while the third nanostructures 204c and the fourth nanostructures 204d are patterned through the widened third mask structure 210c' and the widened fourth mask structure 210d', the third nanostructures 204c and the fourth nanostructures 204d are wider than the first nanostructures 204a and the second nanostructures 204b. That is, the effective width of the third nanostructures 204c and the fourth nanostructures 204d are greater than that of the first nanostructures 204a and the second nanostructures 204b. Accordingly, the device in the second device region 20' may have a driven current than that in the first device region 20. In some embodiments, the speed of the device in the second device region 20' is greater (e.g. over 10% higher) than that in the first device region 20.

In some embodiments, the first nanostructures 204a and the second nanostructures 204b have the width W in a range from about 3 nm to about 7 nm. In some embodiments, the first nanostructures 204a and the second nanostructures 204b has a pitch P$_1$ in a range from about 20 nm to about 26 nm. The pitch P$_1$ may be defined as the lateral distance between the lateral center of the first nanostructures 204a and the lateral center of the second nanostructures 204b or the lateral distance between the left-most point of the first nanostructures 204a and the left-most point of the second nanostructures 204b.

In some embodiments, the third nanostructures 204c have the width W$_3$ and the fourth nanostructures 204d have the width W$_4$. In some embodiments, the width W$_3$ is substantially equal to the width W$_4$ and is in a range from about 8 nm to about 16 nm. In some embodiments, the ratio of the width W$_3$ to the width W is in a range from about 1.14 to about 2.3.

In some embodiments, the third nanostructures 204c and the fourth nanostructures 204d have a pitch P$_2$ in a range from about 30 nm to about 40 nm. The pitch P$_2$ may be defined as the lateral distance between the lateral center of the third nanostructures 204c and the lateral center of the fourth nanostructures 204d or the lateral distance between the left-most point of the third nanostructures 204c and the left-most point of the fourth nanostructures 204d.

Meanwhile, since the first nanostructures 204a, the second nanostructures 204b, the third nanostructures 204c, and the fourth nanostructures 204d are all patterned from the semiconductor stack of the epitaxy layers 102 and 104, each of the first nanostructures 204a, the second nanostructures 204b, the third nanostructures 204c, and the fourth nanostructures 204d are aligned with one another in accordance with some embodiments. In addition, all the first nanostructures 204a, the second nanostructures 204b, the third nanostructures 204c, and the fourth nanostructures 204d have substantially the same thickness in a range from about 3 nm to about 7 nm in accordance with some embodiments. In some embodiments, the first nanostructures 204a, the second nanostructures 204b, the third nanostructures 204c, and the fourth nanostructures 204d have substantially the same vertical spacing in a range from about 2 nm to about 10 nm The distance between the first nanostructures 204a and the second nanostructures 204b is substantially equal to the distance D3 between the first fin structure 205a and the second fin structure 205b, and the distance between the third nanostructures 204c and the fourth nanostructures 204d is substantially equal to the distance D5 between the third fin structure 205c and the fourth fin structure 205d in accordance with some embodiments. The distance described above may be defined as the lateral distance between two nanostructures at the same height or the closest distance between the two sets of nano structures. In some embodiments, the ratio of the distance D$_5$ to the distance D$_3$ is in a range from about 1.15 to about 2.

In some embodiments, the isolation feature 114 formed around the first fin structure 205a, the second fin structure 205b, the third fin structure 205c, and the fourth fin structure 205d has a curved top surface, as shown in FIGS. 15-1, 15-2, 16-1, 16-2 (the perspective views have been simplified and therefore the curved top surface is not shown in FIGS. 14A-1 to 14K-2). In some embodiments, the gate structure 230 has a first curved bottom surface between the first fin structure 205a and the second fin structure 205b, and the gate structure 230' has a second curved bottom surface between the third fin structure 205c and the fourth fin structure 205d. In addition, the lowest portion of the first curved bottom surface of the gate structure 230 is higher than the lowest portion of the second curved bottom surface of the gate structure 230' in accordance with some embodiments.

Although two fin structures and one gate structure are shown in each of the first device region 20 and the second device region 20', they are only examples and the numbers of the fin structures and the gate structures are not intended to be limiting. For example, a semiconductor wafer may include a number of device regions including fin structures having various widths arranged in different pitches.

Figures 1, 18:
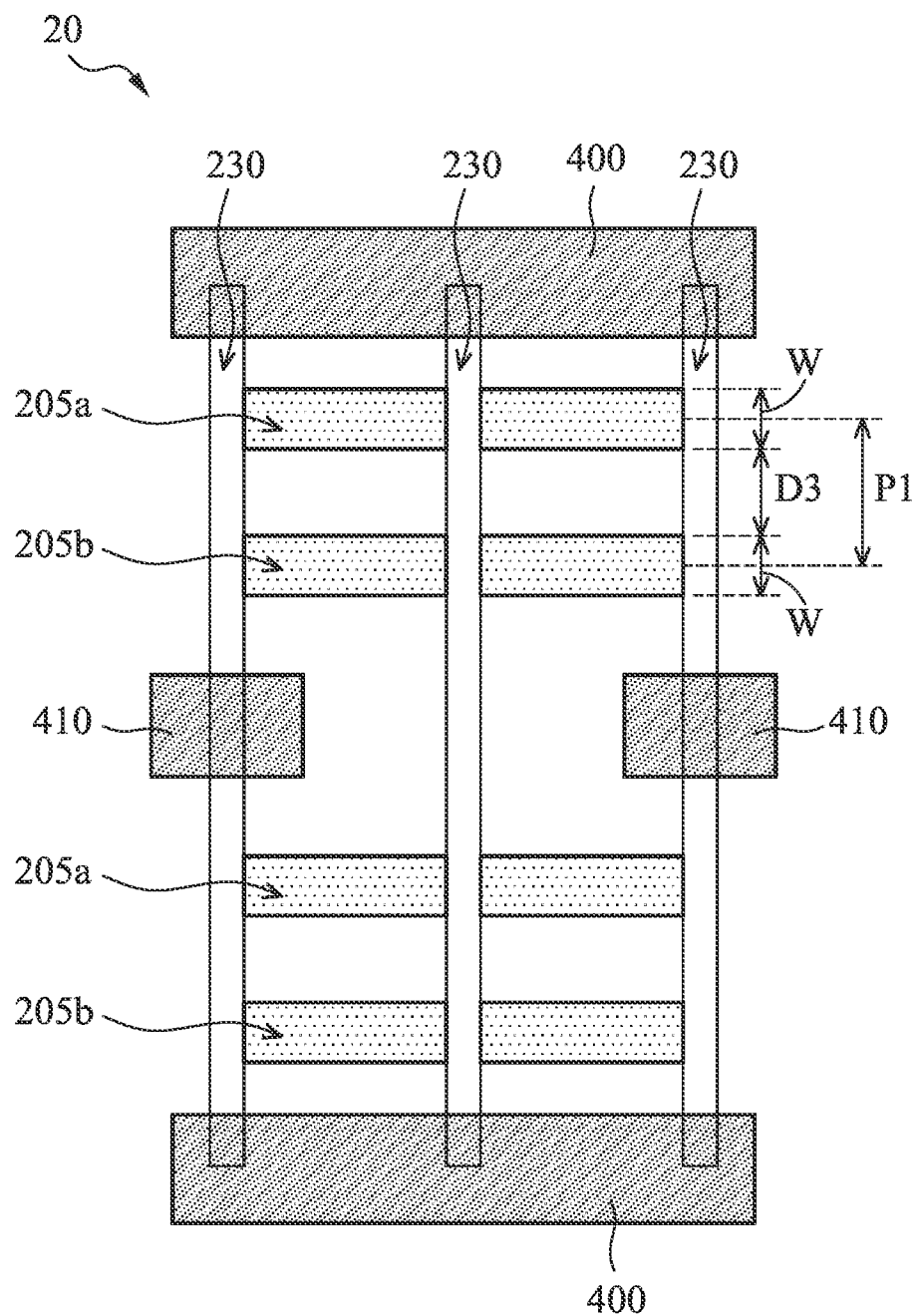
Figures 2, 18:
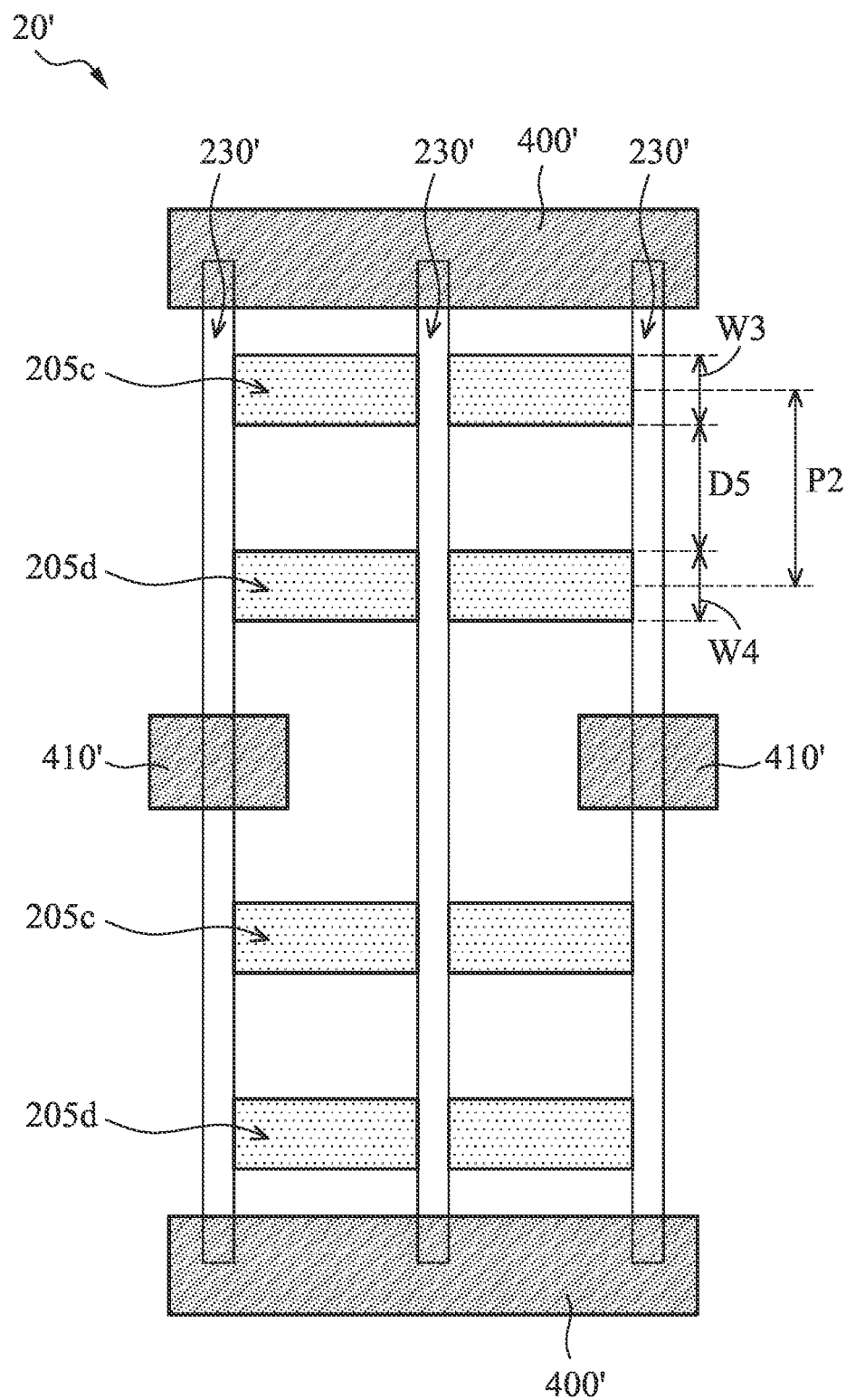

FIG. 18-1 illustrates a layout including the first device region 20 of the semiconductor structures 300 and FIG. 18-2 illustrates a layout including the second device region 20' of the semiconductor structures 300 in accordance with some embodiments.

As shown in FIG. 18-1, the gate structures 230 are formed across the first fin structure 205a and the second fin structure 205c and conductive structures 400 and 410 are formed over the gate structures 230 in accordance with some embodiments. Similarly, the gate structures 230' are formed across the third fin structure 205c and the fourth fin structure 205d and conductive structures 400' and 410' are formed over the gate structures 230', as shown in FIG. 18-2 in accordance with some embodiments.

In some embodiments, the conductive features 400, 410, 400', and 410' are made of conductive materials such as aluminum (Al), copper (Cu), tungsten (W), titanium (Ti), tantalum (Ta), titanium nitride (TiN), tantalum nitride (TaN), nickel silicide (NiS), cobalt silicide (CoSi), tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

In addition, the conductive features 400, 410, 400', and 410' may include a liner and/or a barrier layer. The liner may be made of silicon nitride, although any other applicable dielectric may be used as an alternative. The liner may be formed using a plasma enhanced chemical vapor deposition (PECVD) process, although other applicable processes, such as physical vapor deposition or a thermal process, may be used as an alternative. The barrier layer (not shown) may be formed over the liner (if present) and may cover the sidewalls and bottom of the opening. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

As described above, the width $W_3$ of the third fin structure 205c and the width $W_4$ of the fourth fin structure 205d may be greater than the width $W_1$ of the first fin structure 205a and the width $W_2$ of the second fin structure 205b. In addition, the pitch $P_1$ may be smaller than the pitch $P_2$. The device shown in FIG. 18-2 may provide higher driven current due to greater effective channel widths and therefore may be used in application requiring higher speed and/or performed such as High Performance Computing devices. On the other hand, the device shown in FIG. 18-1 may have better density and may be used in mobile devices. That is, devices with different characters may be manufactured over the same wafer without using complicated processes.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value. For example, two numerical values can be deemed to be "substantially" the same or equal if a difference between the values is less than or equal to ±10% of an average of the values.

Embodiments of a semiconductor structure and a method for forming the same may be provided. The semiconductor structure may include first nanostructures, second nanostructures, third nanostructures, and fourth nanostructures. In addition, a first gate structure may be formed surrounding the first nanostructures and the second nanostructures, and a second gate structure may be formed surrounding the third nanostructures and the fourth nanostructures. The first nanostructures and the second nanostructures may be narrower than the third nanostructures and the fourth nanostructures and the pitch between the first nanostructures and the second nanostructures may be smaller than the pitch between the third nanostructures and the fourth nanostructures. The device with wider nanostructures and wider widths may have improved performance and speed, while device with narrower nanostructures and narrower widths may have improved device density.

In some embodiments, a semiconductor structure is provided. The semiconductor structure includes first nanostructures and second nanostructures spaced apart from the first nanostructures in a first direction. A left-most point of the first nanostructures and a left-most point of the second nanostructures has a first distance in the first direction. The semiconductor structure further includes first source/drain features attached to opposite sides of the first nanostructures in a second direction being orthogonal to the first direction and third nanostructures and fourth nanostructures spaced apart from the third nanostructures in the first direction. A left-most point of the third nanostructures and a left-most point of the fourth nanostructures has a second distance in the first direction. In addition, the third nanostructures are wider than the first nanostructures in the first direction, and the first distance is smaller than the second distance.

In some embodiments, a semiconductor structure is provided. The semiconductor structure includes a first device region formed over a substrate. The first device region includes first nanostructures vertically stacked and spaced apart from each other, and each of the first nanostructures has a first width in a first direction. The first device region further includes a first gate structure wrapping around the first nanostructures and longitudinally oriented along the first direction, and the first gate structure has a first curved bottom surface. The semiconductor structure further includes a second device region formed over the substrate. The second device region includes second nanostructures vertically stacked and spaced apart from each other, and each of the second nanostructures has a second width in the first direction, and the second width is greater than the first width. The second device region further includes a second gate structure wrapping around the second nanostructures and longitudinally oriented along the first direction, and the second gate structure has a second curved bottom surface.

In some embodiments, a semiconductor structure is provided. The semiconductor structure includes a first gate structure and a second gate structure extending lengthwise in a first direction and first nanostructures and second nanostructures extending lengthwise through the first gate structure in a second direction. The semiconductor structure further includes third nanostructures and fourth nanostructures extending lengthwise through the second gate structure in the second direction, and the third nanostructures and the first nanostructures have different shapes in a cross-sectional view in the first direction. In addition, a first distance between the first nanostructures and the second nanostructures in the first direction is smaller than a second distance between the third nanostructures and the fourth nanostructures in the first direction.

In some embodiments, a semiconductor structure is provided. The semiconductor structure includes first silicon-containing layers, second silicon-containing layers, third silicon-containing layers, and fourth silicon-containing layers vertically suspended over a substrate and laterally spaced apart from each other. In addition, the first silicon-containing layers and the second silicon-containing layers are narrower than the third silicon-containing layers and the fourth silicon-containing layers. The semiconductor structure further includes first source/drain features, second source/drain features, third source/drain features, and fourth source/drain features attaching to opposite sides of the first silicon-containing layers, the second silicon-containing layers, the third silicon-containing layers, and the fourth silicon-containing layers, respectively. In addition, the first source/drain features are merged with the second source/drain features while the third source/drain features are spaced apart from the fourth source/drain features.

In some embodiments, a semiconductor structure is provided. The semiconductor structure includes a first device region formed over a substrate. In addition, the first device region includes first silicon-containing layers stacked and spaced apart from each other in a first direction and second silicon-containing layers stacked and spaced apart from each other in the first direction and spaced apart from the first silicon-containing layers in a second direction different from the first direction. the first device region further includes a first gate structure wrapping around the first silicon-containing layers and the second silicon-containing layers, and the first gate structure has a first curved bottom surface between the first silicon-containing layers and the second silicon-containing layers. The semiconductor structure includes a second device region formed over the substrate. In addition, the second device region includes third silicon-containing layers stacked and spaced apart from each other in the first direction and fourth silicon-containing layers stacked and spaced apart from each other in the first direction and spaced apart from the third silicon-containing layers in the second direction. The second device region further includes a second gate structure wrapping around the third silicon-containing layers and the fourth silicon-containing layers, and the second gate structure has a second curved bottom surface between the third silicon-containing layers and the fourth silicon-containing layers. In addition, a lowest portion of the first curved bottom surface of the first gate structure is higher than a lowest portion of the second curved bottom surface of the second gate structure.

In some embodiments, a semiconductor structure is provided. The semiconductor structure includes first silicon-containing layers and second silicon-containing layers extending lengthwise in a first direction over a substrate and a first gate structure extending lengthwise in a second direction different from the first direction and wrapping around the first silicon-containing layers and the second silicon-containing layers. The semiconductor structure further includes third silicon-containing layers and fourth silicon-containing layers extending lengthwise in the first direction over the substrate, and the first silicon-containing layers are narrower than the third silicon-containing layers in the second direction. The semiconductor structure further includes a second gate structure extending lengthwise in the second direction and wrapping around the third silicon-containing layers and the fourth silicon-containing layers. In addition, a first distance between the first silicon-containing layers and the second silicon-containing layers in the second direction is smaller than a second distance between the third silicon-containing layers and the fourth silicon-containing layers in the second direction.

In some embodiments, a semiconductor structure is provided. The semiconductor structure includes a first fin structure, a second fin structure, a third fin structure, and a fourth fin structure formed over a substrate. The semiconductor structure further includes first nanostructures formed over the first fin structure, second nanostructures formed over the second fin structure, third nanostructures formed over the third fin structure, and fourth nanostructures formed over the fourth fin structure. The semiconductor structure further includes a first gate structure wrapping around the first nanostructures and the second nanostructures, and a second gate structure wrapping around the third nanostructures and the fourth nanostructures. In addition, a first lateral distance between the first fin structure and the second fin structure is smaller than a second lateral distance between the third fin structure and the fourth fin structure, and the first fin structure and the second fin structure are narrower than the third fin structure and the fourth fin structure.

In some embodiments, a semiconductor structure is provided. The semiconductor structure includes a first device region formed over a substrate. The first device region includes first nanostructures and second nanostructures formed over the substrate and a first gate structure wrapping around the first nanostructures and the second nanostructures. The semiconductor structure further includes a second device region formed over the substrate. The second device region includes third nanostructures and fourth nanostructures formed over the substrate. In addition, the third nanostructures are wider than the first nanostructures, and the fourth nanostructures are wider than the second nanostructures. The second device region further includes a second gate structure wrapping around the third nanostructures and the fourth nanostructures. In addition, a closest distance between one of the first nanostructures and one of the second nanostructures is smaller than a closest distance between one of the third nanostructures and one of the fourth nanostructures.

A method for manufacturing a semiconductor structure is provided. The method for manufacturing a semiconductor structure includes alternately stacking first epitaxy layers and second epitaxy layers to form a semiconductor stack over a substrate and forming a first mask structure, a second mask structure, a third mask structure, and a fourth mask structure over the semiconductor stack. The method for manufacturing a semiconductor structure further includes forming third spacers on sidewalls of the third mask structure to form a widened third mask structure and fourth spacers on sidewalls of the fourth mask structure to form a widened fourth mask structure and patterning the semiconductor stack through the first mask structure, the second mask structure, the widened third mask structure, and the widened fourth mask structure to form a first fin structure, a second fin structure, a third fin structure, and a fourth fin structure respectively. The method for manufacturing a semiconductor structure further includes removing the first epitaxy layers of the first fin structure, the second fin structure, the third fin structure, and the fourth fin structure to form first nanostructures, second nanostructures, third nanostructure, and fourth nanostructure respectively. In addition, a distance between the first mask structure and the second mask structure is smaller than a distance between the third mask structure and the fourth mask structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   first nanostructures and second nanostructures spaced apart from the first nanostructures in a first direction, wherein a left-most point of the first nanostructures and a left-most point of the second nanostructures are separated by a first distance in the first direction;
   first source/drain features attached to opposite sides of the first nanostructures in a second direction being orthogonal to the first direction;
   a first fin structure overlapping the first nanostructures in a third direction being orthogonal to both the first direction and the second direction;
   a second fin structure overlapping the second nanostructures in the third direction; and
   a first isolation feature between the first nanostructures and the second nanostructures, wherein the first isolation feature has a curved top surface in a cross-sectional view along the first direction; and
   third nanostructures and fourth nanostructures spaced apart from the third nanostructures in the first direction, wherein a left-most point of the third nanostructures and a left-most point of the fourth nanostructures are separated by a second distance in the first direction,
   wherein each of the third nanostructures and the fourth nanostructures are wider than each of the first nanostructures and the second nanostructures in the first direction, and the first distance is smaller than the second distance.

2. The semiconductor structure as claimed in claim 1, further comprising:
   third source/drain features attached to opposite sides of the third nanostructures in the second direction,
   wherein the first source/drain features are wider than the third source/drain features in the first direction.

3. The semiconductor structure as claimed in claim 2, further comprising:
   fourth source/drain features attached to opposite sides of the fourth nanostructures in the second direction,
   wherein the fourth source/drain features are spaced apart from the third source/drain features in the first direction.

4. The semiconductor structure as claimed in claim 1, wherein the first source/drain features further extend in the first direction, so that the first source/drain features are also attached to the second nanostructures in the second direction.

5. The semiconductor structure as claimed in claim 1, further comprising:
   a third fin structure overlapping the third nanostructures in the third direction;
   a fourth fin structure overlapping the fourth nanostructures in the third direction;
   a first gate structure wrapping around the first nanostructures and the second nanostructures and longitudinally oriented along the second direction; and
   a second gate structure wrapping around the third nanostructures and the fourth nanostructures and longitudinally oriented along the second direction,
   wherein a first portion of the first gate structure has a first curved bottom surface and a second portion of the second gate structure has a second curved bottom surface.

6. The semiconductor structure as claimed in claim 5, wherein a lowest point of the first curved bottom surface is not level with a lowest point of the second curved bottom surface.

7. The semiconductor structure as claimed in claim 6, wherein the lowest point of the first curved bottom surface is higher than the lowest point of the second curved bottom surface.

8. A semiconductor structure, comprising:
   a first device region formed over a substrate, wherein the first device region comprises:
   first nanostructures vertically stacked and spaced apart from each other, wherein each of the first nanostructures has a first width in a first direction;
   a first gate structure wrapping around the first nanostructures and longitudinally oriented along the first direction, wherein the first gate structure has a first curved bottom surface; and
   a second device region formed over the substrate, wherein the second device region comprises:
   second nanostructures vertically stacked and spaced apart from each other, wherein each of the second nanostructures has a second width in the first direction, and the second width is greater than the first width; and
   a second gate structure wrapping around the second nanostructures and longitudinally oriented along the first direction, wherein the second gate structure has a second curved bottom surface,
   wherein a lowest portion of the first curved bottom surface of the first gate structure is not level with a lowest portion of the second curved bottom surface of the second gate structure.

9. The semiconductor structure as claimed in claim 8, further comprising:
   a first source/drain features attached to the first nanostructures in a second direction different from the first direction; and
   a second source/drain features attached to the second nanostructures in the second direction,
   wherein the first source/drain features are wider than the second source/drain features in the first direction.

10. The semiconductor structure as claimed in claim 9, further comprising:
    third nanostructures vertically stacked and spaced apart from each other, wherein the third nanostructures are spaced apart from the first nanostructure in the first direction and are wrapped by the first gate structure,
    wherein each of the third nanostructures has a third width in the first direction substantially equal to the first width.

11. The semiconductor structure as claimed in claim 10, wherein the first source/drain features attached to the third nanostructures in the second direction.

12. The semiconductor structure as claimed in claim 10, further comprising:
    fourth nanostructures vertically stacked and spaced apart from each other, wherein the fourth nanostructures are spaced apart from the second nanostructure in the first direction and are wrapped by the second gate structure,
    wherein each of the fourth nanostructures has a fourth width in the first direction substantially equal to the second width.

13. The semiconductor structure as claimed in claim 12, further comprising:
    fourth source/drain features attached to the fourth nanostructures in the second direction,
    wherein the fourth source/drain features are spaced apart from the second source/drain features in the first direction.

14. A semiconductor structure, comprising:
- a first gate structure and a second gate structure extending lengthwise in a first direction;
- an isolation feature under the first gate structure, wherein the isolation feature has a curved top surface in contact with the first gate structure;
- first nanostructures and second nanostructures extending lengthwise through the first gate structure in a second direction; and
- third nanostructures and fourth nanostructures extending lengthwise through the second gate structure in the second direction, wherein the third nanostructures and the first nanostructures have different shapes in a cross-sectional view in the first direction,
- wherein a first distance between the first nanostructures and the second nanostructures in the first direction is smaller than a second distance between the third nanostructures and the fourth nanostructures in the first direction.

15. The semiconductor structure as claimed in claim 14, wherein each of the first nanostructures has substantially a same thickness in a third direction with each of the third nanostructures.

16. The semiconductor structure as claimed in claim 14, wherein the first nanostructures and the second nanostructures have substantially a same first shape in the cross-sectional view in the first direction.

17. The semiconductor structure as claimed in claim 16, wherein the third nanostructures and the fourth nanostructures have substantially a same second shape in the cross-sectional view in the first direction.

18. The semiconductor structure as claimed in claim 1, wherein each of the first nanostructures and the second nanostructure has a first width and each of the third nanostructures and the fourth nanostructure has a second width that is different from the first width.

19. The semiconductor structure as claimed in claim 8, wherein the lowest portion of the first curved bottom surface of the first gate structure is higher than the lowest portion of the second curved bottom surface of the second gate structure.

20. The semiconductor structure as claimed in claim 1, wherein a portion of the curved top surface is lower than a top surface of the first fin structure.

* * * * *